(12) United States Patent
Hu et al.

(10) Patent No.: US 10,522,508 B2
(45) Date of Patent: Dec. 31, 2019

(54) SEMICONDUCTOR DEVICE PACKAGE AND A METHOD OF MANUFACTURING THE SAME

(71) Applicant: Advanced Semiconductor Engineering, Inc., Kaohsiung (TW)

(72) Inventors: Ian Hu, Kaohsiung (TW); Ming-Han Wang, Kaohsiung (TW); Tsun-Lung Hsieh, Kaohsiung (TW); Chih-Yi Huang, Kaohsiung (TW); Chih-Pin Hung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/968,562

(22) Filed: May 1, 2018

(65) Prior Publication Data

US 2019/0341368 A1 Nov. 7, 2019

(51) Int. Cl.
| | |
|---|---|
| *H01L 23/31* | (2006.01) |
| *H01L 25/065* | (2006.01) |
| *H01L 23/498* | (2006.01) |
| *H01L 23/00* | (2006.01) |
| *H01L 25/00* | (2006.01) |

(52) U.S. Cl.
CPC ...... *H01L 25/0655* (2013.01); *H01L 23/3128* (2013.01); *H01L 23/49811* (2013.01); *H01L 23/49827* (2013.01); *H01L 23/562* (2013.01); *H01L 24/08* (2013.01); *H01L 25/50* (2013.01); *H01L 2224/0401* (2013.01); *H01L 2224/06515* (2013.01)

(58) Field of Classification Search
CPC ......... H01L 23/49811; H01L 23/49827; H01L 23/562
See application file for complete search history.

(56) References Cited

U.S. PATENT DOCUMENTS

| | | | |
|---|---|---|---|
| 9,607,973 B1 | 3/2017 | Fasano et al. | |
| 2014/0264769 A1* | 9/2014 | Chen | H01L 21/4853 257/620 |

* cited by examiner

*Primary Examiner* — Elias Ullah
(74) *Attorney, Agent, or Firm* — Foley & Lardner LLP; Cliff Z. Liu

(57) ABSTRACT

At least some embodiments of the present disclosure relate to a semiconductor device package. The semiconductor device package includes a substrate, an interposer disposed on the substrate, a conductive pillar disposed on the substrate, a first semiconductor device disposed on the interposer and electrically connected to the conductive pillar, a second semiconductor device disposed on the interposer, and an encapsulant surrounding the conductive pillar. The first semiconductor device includes a first conductive pad electrically connected to the interposer. The second semiconductor device includes a second conductive pad electrically connected to the interposer.

20 Claims, 59 Drawing Sheets

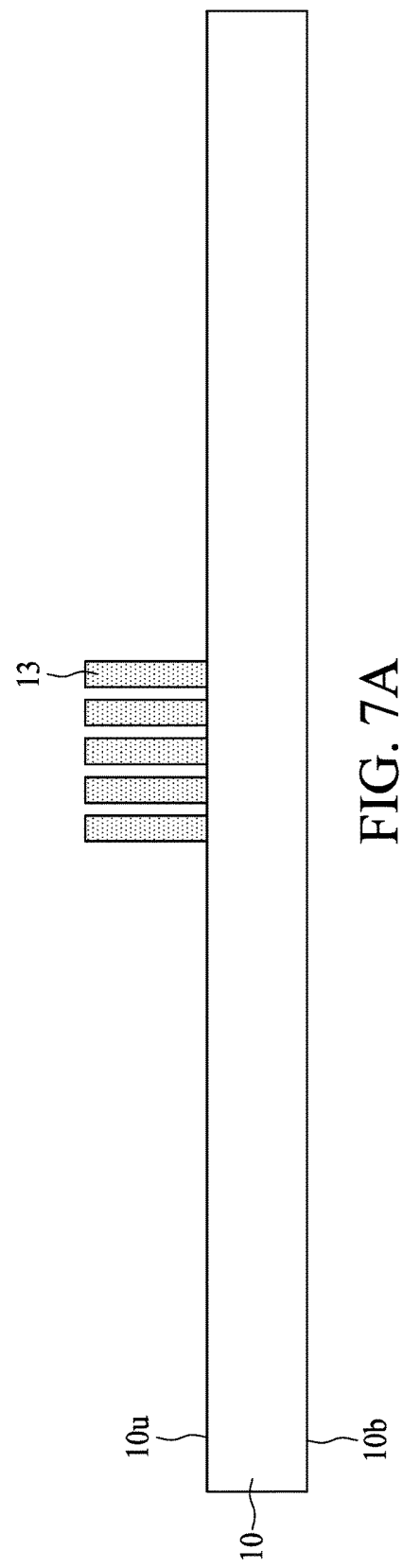

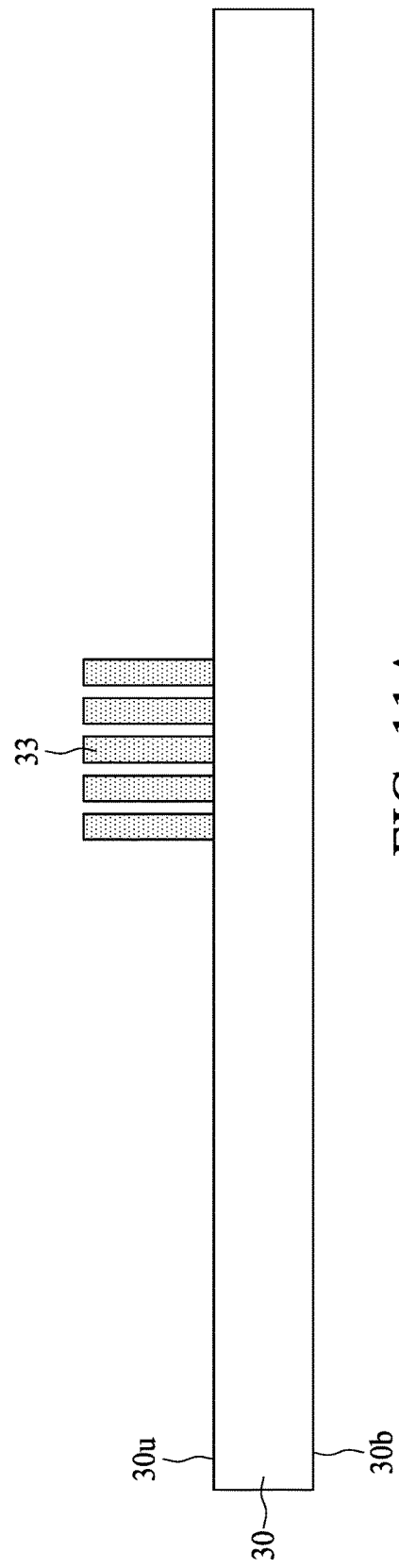

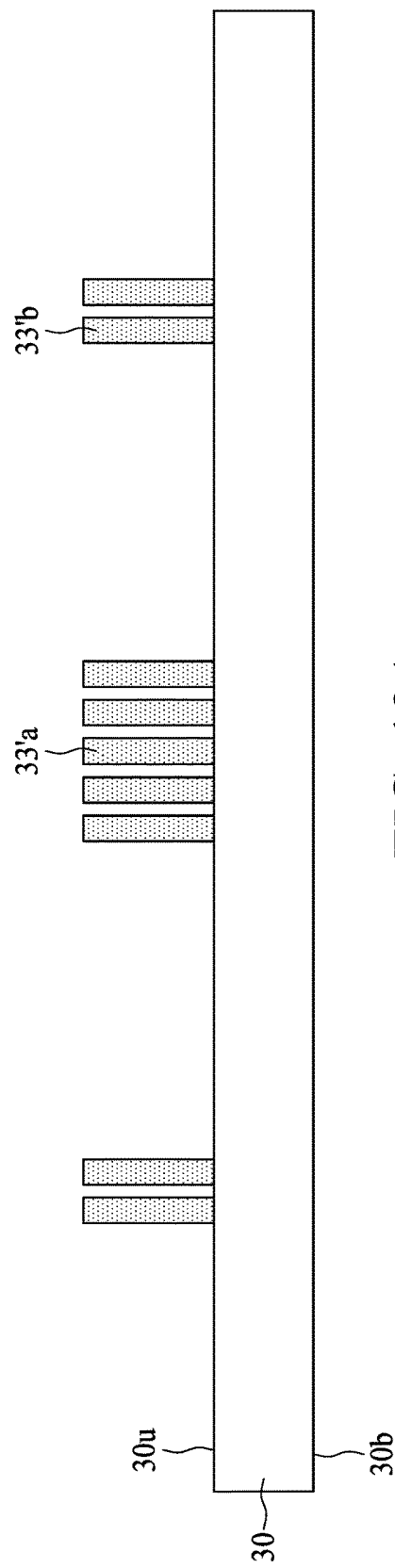

SEMICONDUCTOR DEVICE PACKAGE AND A METHOD OF MANUFACTURING THE SAME

BACKGROUND

1. Technical Field

The present disclosure relates to a semiconductor device package.

2. Description of the Related Art

In comparable three-dimensional semiconductor packages, an interposer (e.g., a through silicon via (TSV) interposer) provides electrical interconnection. However, a fine pitch (e.g., smaller than 1 micrometer (μm)) interconnections may occupy a small portion of the interposer. In other words, interconnections with relatively great pitch (e.g., greater than 1 μm) may occupy other region of the interposer. In the case that diameters of TSVs increase, an area of the interposer correspondingly increases. Under such kind of situation, an area of the semiconductor packages increases. In the case that the diameters of the TSVs decrease, a misalignment between a semiconductor device and the interposer may occur. Additionally, the fabricating operations of TSVs are complicatedly and the cost of the interposer significantly increases accordingly.

Furthermore, some semiconductor devices may have grounding pads or power pads for large current. Therefore, the TSVs with small diameters may encounter a short issue.

SUMMARY

In some embodiments, according to one aspect, a semiconductor device package includes a substrate, an interposer disposed on the substrate, a conductive pillar disposed on the substrate, a first semiconductor device disposed on the interposer and electrically connected to the conductive pillar, a second semiconductor device disposed on the interposer, and an encapsulant surrounding the conductive pillar. The first semiconductor device includes a conductive pad electrically connected to the interposer. The second semiconductor device includes a conductive pad electrically connected to the interposer.

In some embodiments, according to another aspect, a method is disclosed for manufacturing a semiconductor device package. The method includes: providing a substrate, a first semiconductor device, and a second semiconductor device; providing an interposer for electrically connecting the first semiconductor device and the second semiconductor device to the substrate; providing a first conductive pillar electrically connected to the substrate and the first semiconductor device; and providing an encapsulant to surround the first conductive pillar and the interposer.

BRIEF DESCRIPTION OF THE DRAWINGS

FIG. 7A illustrates a method of manufacturing a semiconductor device package according to some embodiments of the present disclosure.

FIG. 11A illustrates a method of manufacturing a semiconductor device package according to some embodiments of the present disclosure.

FIG. 12A illustrates a method of manufacturing a semiconductor device package according to some embodiments of the present disclosure.

DETAILED DESCRIPTION

Figure 1A:
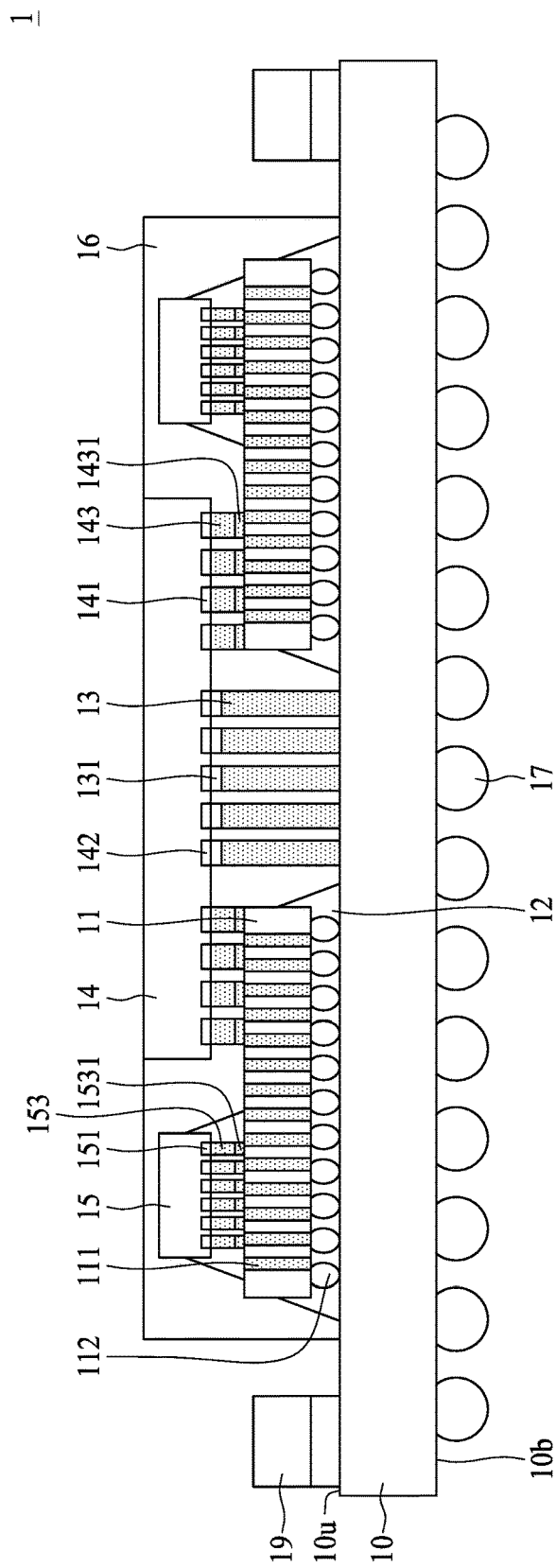
FIG. 1A illustrates a cross-sectional view of a semiconductor device package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1A is a cross-sectional view of a semiconductor device package 1 in accordance with some embodiments of the present disclosure. The semiconductor device package 1 includes a substrate 10, an interposer 11, an underfill 12, a conductive pillar 13, a semiconductor device 14, a semiconductor device 15, an encapsulant 16, a solder ball 17, and a ring structure 19.

The substrate 10 has an upper surface 10u and a lower surface 10b opposite to the upper surface 10u. The interposer 11 is disposed on the upper surface 10u of the substrate 10. The ring structure 19 is disposed on the upper surface 10u of the substrate 10. The ring structure 19 is disposed adjacent to a periphery the substrate 10. The ring structure 19 surrounds the encapsulant 16 and the interposer 11. The solder ball 17 is disposed on the lower surface 10b of the substrate 10. The ring structure 19 provides a function to prevent from a warpage issue. In some embodiments, the ring structure 19 may be omitted.

The interposer 11 (e.g., a through silicon via (TSV) interposer) includes a conductive via 111 and an electrical terminal 112. The interposer 11 is electrically connected to the substrate 10 via the electrical terminal 112. The underfill 12 is disposed between the substrate 10 and the interposer 11. The electrical terminal 112 is surrounded by the underfill 12. A size (e.g. a height, a width, or a diameter) of the conductive via 111 of the interposer 11 is less than a size of the conductive pillar 13.

The conductive pillar 13 is disposed on the upper surface 10u of the substrate 10. The conductive pillar 13 is disposed between the interposers 11. The conductive pillar 13 is surrounded by the interposers 11. The conductive pillar 13 may be used as a grounding path or a power path. A width of the conductive pillar 13 is different from a width of the conductive via 111. The width of the conductive pillar 13 is greater than the width of the conductive via 111. A height of the conductive pillar 13 is greater than a height of the conductive via 111. The width of the conductive pillar 13 is sufficiently large to prevent from a short issue resulting from a large current. An aspect ratio of the conductive pillar 13 is greater than 7. The size of the conductive pillar 13 may be adjusted based on a desired design. The conductive pillar 13 may include a solder joint 131.

The semiconductor device 14 is disposed on the interposer 11. The semiconductor device 14 is disposed on the conductive pillar 13. The semiconductor device 14 includes a conductive pad 141 and a conductive pad 142. The conductive pad 141 is electrically connected to the conductive via 111 of the interposer 11 via a conductive structure 143. The conductive structure 143 may include a solder joint 1431 which contacts the conductive via 111 of the interposer 11. The conductive pad 142 is electrically connected to the solder joint 131 of the conductive pillar 13. The semiconductor device 14 is electrically connected to the substrate 10 via the interposer 11. The semiconductor device 14 is electrically connected to the substrate 10 via the conductive pillar 13. The conductive pad 142 may be a grounding pad. In some embodiments, the semiconductor device 14 may include an application-specific integrated circuit (ASIC), a controller, a processor or other electronic component or semiconductor device. In some embodiments, the conductive structure 143 may be a solder bump or copper pillar bump.

The semiconductor device 15 is disposed on the interposer 11. The semiconductor device 15 is disposed on the conductive pillar 13. The semiconductor device 15 includes a conductive pad 151. The underfill 12 is disposed between the interposer 11 and the semiconductor device 15. The semiconductor device 15 is electrically connected to the interposer 11 via the conductive pad 151. The conductive pad 151 is electrically connected to a conductive structure 153. The conductive structure 153 may include a solder joint 1531 which contacts the conductive via 111 of the interposer 11. The semiconductor device 15 is electrically connected to the substrate 10 via the interposer 11. The semiconductor device 14 and the semiconductor device 15 may be communicated with each other via the interposer 11. In some embodiments, the semiconductor device 15 may be a high bandwidth memory (HBM). In some embodiments, the conductive structure 153 may be a solder bump or copper pillar bump.

The encapsulant 16 is disposed on the upper surface 10u of the substrate 10. The encapsulant 16 surrounds the interposer 11. The encapsulant 16 surrounds the conductive pillar 13. The encapsulant 16 encapsulates the interposer 11, the conductive pillar 13, the semiconductor device 14, and the semiconductor device 15. An upper surface of the semiconductor device 14 is exposed by the encapsulant 16. The encapsulant 16 has a resin material. The encapsulant 16 has a filler.

In some embodiments, there are some voids in the encapsulant 16. The voids are positioned between the interposer 11 and the semiconductor device 14. The voids are positioned between the interposer 11, the conductive pillar 13, and the semiconductor device 14.

Figure 1B:
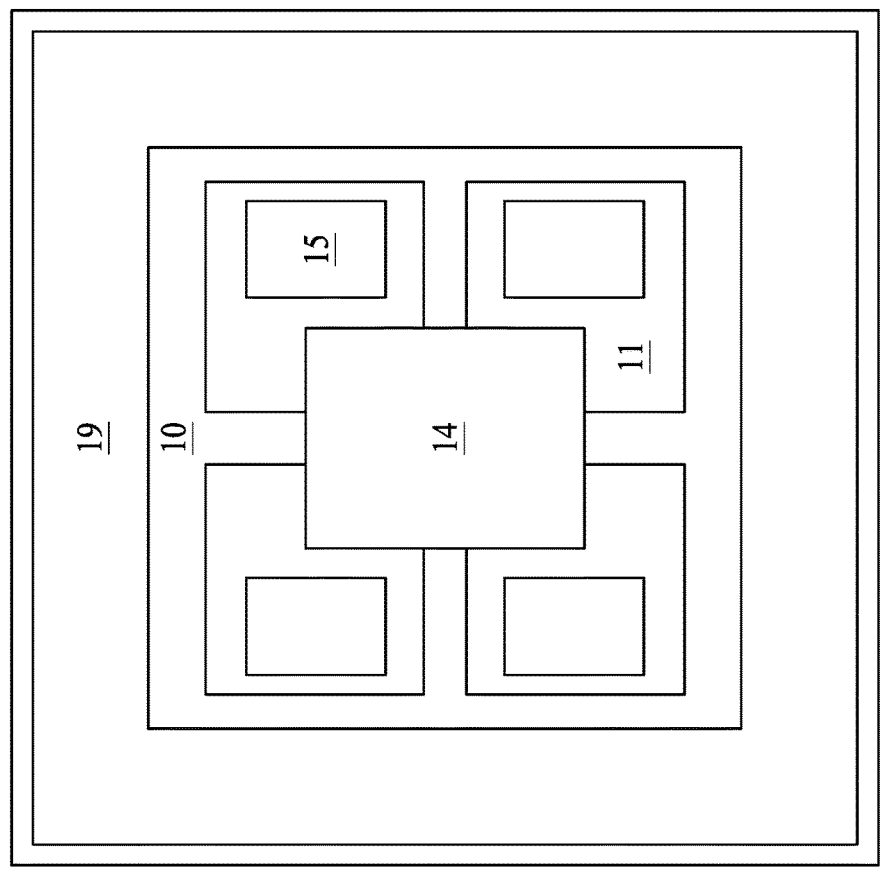
FIG. 1B illustrates a top view of a semiconductor device package according to some embodiments of the present disclosure.

FIG. 1B is a top view of the semiconductor device package 1 in accordance with some embodiments of the present disclosure. The interposer 11, the semiconductor device 14, the semiconductor device 15, and the ring structure 19 are disposed on the substrate 10. The ring structure 19 surrounds the interposers 11. The four interposers 11 surround the conductive pillar 13 (not shown in FIG. 1B). The semiconductor device 14 is disposed on the interposer 11. The semiconductor device 15 is disposed on the interposer 11. Since the size (e.g. a width or a diameter) of the conductive via 111 of the interposer 11 could be sufficiently small, an area of the interposer 11 could be decreased. Accordingly, the cost of the semiconductor device package 1 could be decreased.

The semiconductor device 14 may be disposed on four interposers 11. In some embodiments, the semiconductor device 14 may be disposed on two interposers 11. The semiconductor device 14 may be disposed on six interposers 11. The semiconductor device 14 may be disposed on eight interposers 11.

Figure 2A:
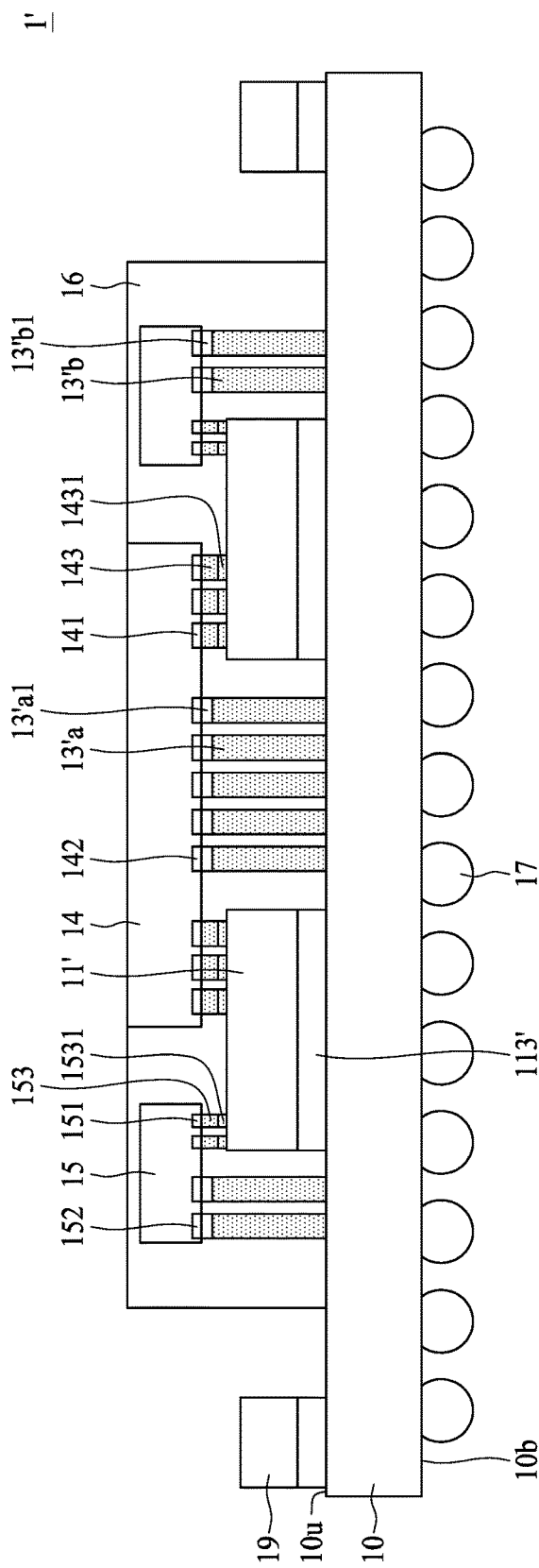
FIG. 2A illustrates a cross-sectional view of a semiconductor device package according to some embodiments of the present disclosure.

FIG. 2A is a cross-sectional view of a semiconductor device package 1' in accordance with some embodiments of the present disclosure. The semiconductor device package 1' includes a substrate 10, an interposer 11', a conductive pillar 13'a, a conductive pillar 13'b, a semiconductor device 14, a semiconductor device 15, an encapsulant 16, a solder ball 17, and a ring structure 19.

The substrate 10 has an upper surface 10u and a lower surface 10b opposite to the upper surface 10u. The interposer 11' may have no conductive via. The interposer 11' is disposed on the upper surface 10u of the substrate 10 via an adhesive 113'. The adhesive 113' is disposed between the substrate 10 and the interposer 11'. The ring structure 19 is disposed on the upper surface 10u of the substrate 10. The ring structure 19 is disposed adjacent to a periphery the substrate 10. The ring structure 19 surrounds the encapsulant 16 and the interposer 11'. The solder ball 17 is disposed on the lower surface 10b of the substrate 10. The ring structure 19 provides a function to prevent from a warpage issue. In some embodiments, the ring structure 19 may be omitted.

The conductive pillar 13'a is disposed on the upper surface 10u of the substrate 10. The conductive pillar 13'b is disposed on the upper surface 10u of the substrate 10. The conductive pillar 13'a is disposed between the interposers 11'. The conductive pillar 13'a is surrounded by the interposers 11'. The conductive pillar 13'b is disposed adjacent to a periphery of the encapsulant 16. The conductive pillar 13'a or 13'b may be used as a grounding path or a power path. A size (e.g. a width, a diameter, or a height) of the conductive pillar 13'a may be different from a size of the conductive pillar 13'b. The size of the conductive pillar 13'a may be the same as the size of the conductive pillar 13'b. The width of the conductive pillar 13'a or 13'b is sufficiently large to prevent from a short issue resulting from a large current. An aspect ratio of the conductive pillar 13'a or 13'b is greater than 7. The size of the conductive pillar 13'a or 13'b may be adjusted based on a desired design. In some embodiments, the conductive pillar 13'b may be replaced with the conductive pillar 13'a. The conductive pillar 13'a may include a solder joint 13'a1. The conductive pillar 13'b may include a solder joint 13'b1.

The semiconductor device 14 is disposed on the interposer 11'. The semiconductor device 14 is disposed on the conductive pillar 13'a. The semiconductor device 14 includes a conductive pad 141 and a conductive pad 142. The conductive pad 141 is electrically connected to the interposer 11' via a conductive structure 143. The conductive structure 143 may include a solder joint 1431 which contacts the interposer 11'. The conductive pad 142 is electrically connected to the conductive pillar 13'a. The conductive pad 142 may contact the solder joint 13'a1 of the conductive pillar 13'a. The semiconductor device 14 is electrically connected to the substrate 10 via the conductive pillar 13'a. The conductive pad 142 may be a grounding pad. In some embodiments, the semiconductor device 14 may include an application-specific integrated circuit (ASIC), a controller, a processor or other electronic component or semiconductor device.

The semiconductor device 15 is disposed on the interposer 11'. The semiconductor device 15 is disposed on the conductive pillar 13'b. The semiconductor device 15 includes a conductive pad 151 and a conductive pad 152. The semiconductor device 15 is electrically connected to the interposer 11' via the conductive pad 151. The conductive pad 151 is electrically connected to a conductive structure 153. The conductive structure 153 may include a solder joint 1531 which contacts the interposer 11'. The semiconductor device 15 is electrically connected to the conductive pillar 13'b via the conductive pad 152. The conductive pad 152 may contact the solder joint 13'b1 of the conductive pillar 13'b. The semiconductor device 15 is electrically connected to the substrate 10 via the conductive pillar 13'b. The conductive pad 152 may be a grounding pad. The semiconductor device 14 and the semiconductor device 15 may be communicated with each other via the interposer 11'. In some embodiments, the semiconductor device 15 may be a high bandwidth memory (HBM). In some embodiments, the conductive structure 153 may be a solder bump or copper pillar bump.

The encapsulant 16 is disposed on the upper surface 10u of the substrate 10. The encapsulant 16 surrounds the interposer 11'. The encapsulant 16 surrounds the conductive pillar 13'a. The encapsulant 16 surrounds the conductive pillar 13'b. The encapsulant 16 encapsulates the interposer 11', the conductive pillar 13'a, the conductive pillar 13'b, the semiconductor device 14, and the semiconductor device 15. An upper surface of the semiconductor device 14 is exposed by the encapsulant 16. The encapsulant 16 has a resin material. The encapsulant 16 has a filler.

In some embodiments, there are some voids in the encapsulant 16. The voids are positioned between the interposer 11 and the semiconductor device 14. The voids are positioned between the interposer 11, the conductive pillar 13'a, and the semiconductor device 14.

Figure 2B:
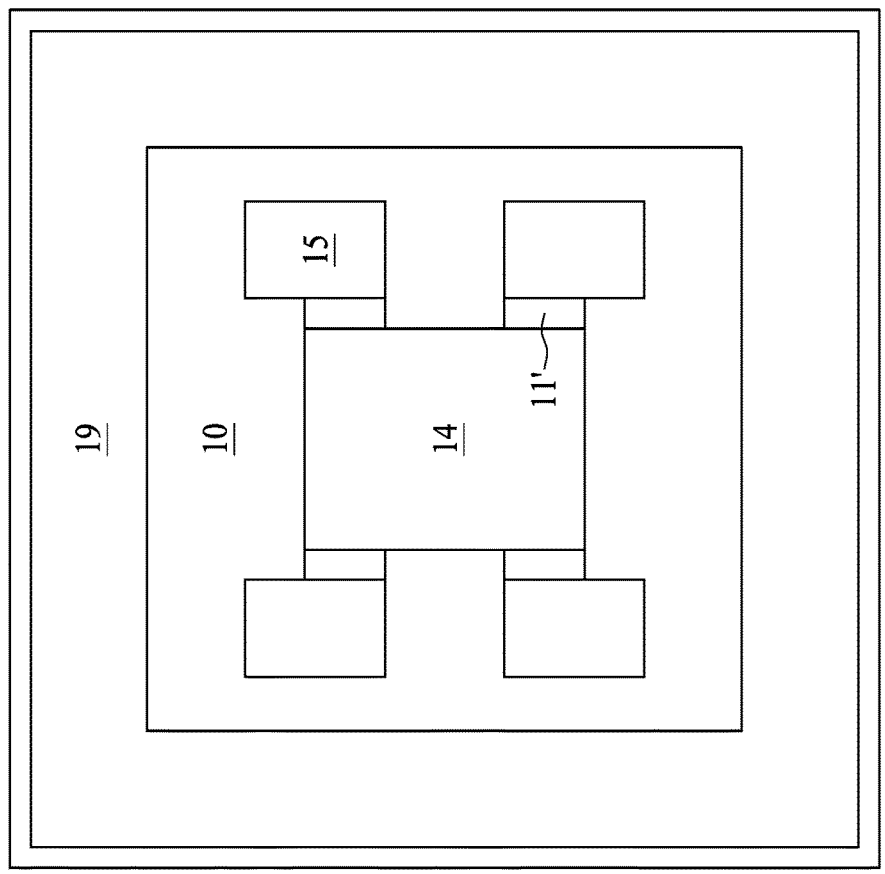
FIG. 2B illustrates a top view of a semiconductor device package according to some embodiments of the present disclosure.

FIG. 2B is a top view of the semiconductor device package 1' in accordance with some embodiments of the present disclosure. The interposer 11', the semiconductor device 14, the semiconductor device 15, and the ring structure 19 are disposed on the substrate 10. The four interposers 11' surround the conductive pillar 13'a (not shown in FIG. 1B). The ring structure 19 surrounds the interposers 11'. The semiconductor device 14 is disposed on the interposer 11'. The semiconductor device 15 is disposed on the interposer 11'. Since the interposer 11' may have no conductive via, an area of the interposer 11' could be decreased as small as it can. Accordingly, the cost of the semiconductor device package 1' could be decreased.

The semiconductor device 14 may be disposed on four interposers 11'. In some embodiments, the semiconductor device 14 may be disposed on two interposers 11'. The semiconductor device 14 may be disposed on six interposers 11'. The semiconductor device 14 may be disposed on eight interposers 11'.

Figure 3A:
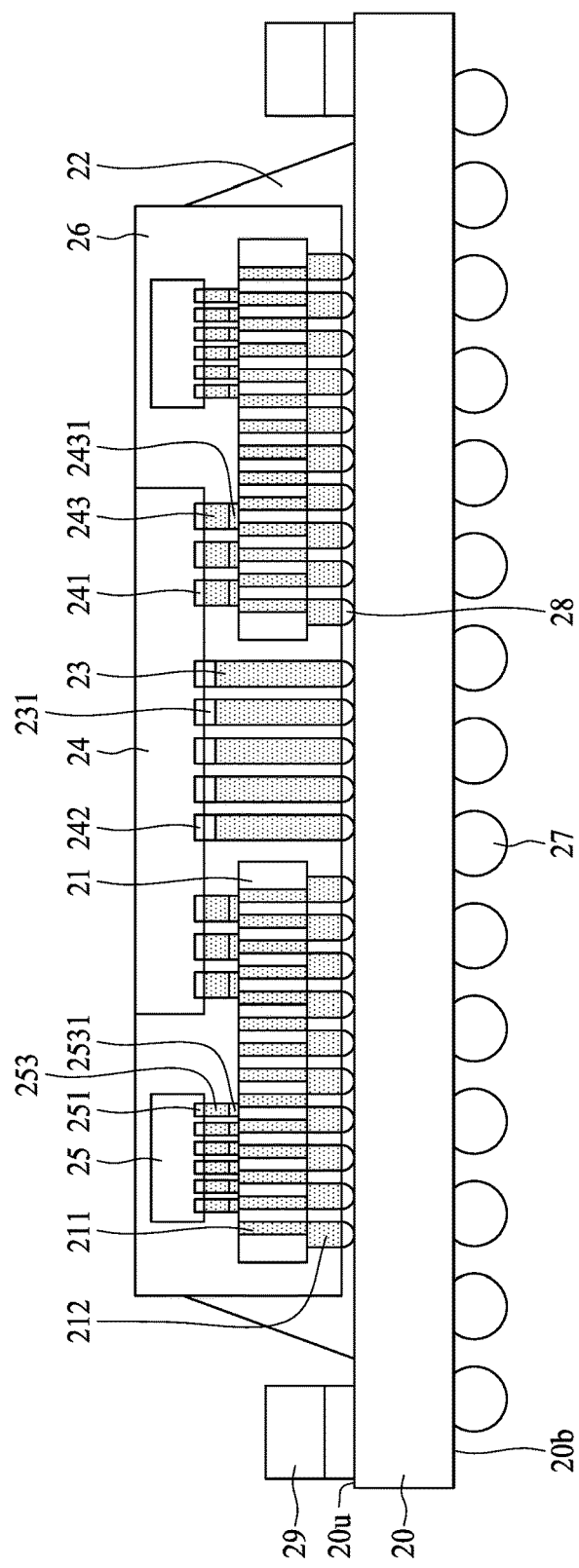
FIG. 3A illustrates a cross-sectional view of a semiconductor device package according to some embodiments of the present disclosure.

FIG. 3A is a cross-sectional view of a semiconductor device package 2 in accordance with some embodiments of the present disclosure. The semiconductor device package 2 includes a substrate 20, an interposer 21, an underfill 22, a conductive pillar 23, a semiconductor device 24, a semiconductor device 25, an encapsulant 26, a solder ball 27, an electrical connection 28, and a ring structure 29.

The substrate 20 has an upper surface 20u and a lower surface 20b opposite to the upper surface 20u. The interposer 21 is disposed on the upper surface 20u of the substrate 20. The electrical connection 28 is disposed on the upper surface 20u of the substrate 20. The electrical connection 28 electrically connects the interposer 21 to the substrate 20. The electrical connection 28 may be a bump. The ring structure 29 is disposed on the upper surface 20u of the substrate 20. The ring structure 29 is disposed adjacent to a periphery the substrate 20. The ring structure 29 surrounds the encapsulant 26 and the interposer 21. The solder ball 27 is disposed on the lower surface 20b of the substrate 20. The ring structure 29 provides a function to prevent from a warpage issue. In some embodiments, the ring structure 29 may be omitted.

The interposer 21 (e.g., a through silicon via (TSV) interposer) includes a conductive via 211 and an electrical terminal 212. The interposer 21 is electrically connected to the substrate 20 via the electrical terminal 212. A size (e.g. a height, a width, or a diameter) of the conductive via 211 of the interposer 21 is less than a size of the conductive pillar 23.

The conductive pillar 23 is disposed on the upper surface 20u of the substrate 20. The conductive pillar 23 is disposed between the interposers 21. The conductive pillar 23 is surrounded by the interposers 21. The conductive pillar 23 may be used as a grounding path or a power path. A width of the conductive pillar 23 is different from a width of the conductive via 211. The width of the conductive pillar 23 is greater than the width of the conductive via 211. A height of the conductive pillar 23 is greater than a height of the conductive via 211. The width of the conductive pillar 23 is sufficiently large to prevent from a short issue resulting from a large current. An aspect ratio of the conductive pillar 23 is greater than 7. The size of the conductive pillar 23 may be adjusted based on a desired design. The conductive pillar 23 may include a solder joint 231.

The semiconductor device 24 is disposed on the interposer 21. The semiconductor device 24 is disposed on the conductive pillar 23. The semiconductor device 24 includes a conductive pad 241 and a conductive pad 242. The conductive pad 241 is electrically connected to the conductive via 211 of the interposer 21 via a conductive structure 243. The conductive structure 243 may include a solder joint 2431 which contacts the conductive via 211 of the interposer 21. The conductive pad 242 is electrically connected to the conductive pillar 23. The conductive pad 242 may contact the solder joint 231 of the conductive pillar 231. The semiconductor device 24 is electrically connected to the substrate 20 via the interposer 21. The semiconductor device 24 is electrically connected to the substrate 20 via the conductive pillar 23. The conductive pad 242 may be a grounding pad. In some embodiments, the semiconductor device 24 may include an application-specific integrated circuit (ASIC), a controller, a processor or other electronic component or semiconductor device. In some embodiments, the conductive structure 243 may be a solder bump or copper pillar bump.

The semiconductor device 25 is disposed on the interposer 21. The semiconductor device 25 is disposed on the conductive pillar 23. The semiconductor device 25 includes a conductive pad 251. The semiconductor device 25 is electrically connected to the interposer 21 via the conductive pad 251. The conductive pad 251 is electrically connected to a conductive structure 253. The conductive structure 253 may include a solder joint 2531 which contacts the conductive via 211 of the interposer 21. The semiconductor device 25 is electrically connected to the substrate 20 via the interposer 21. The semiconductor device 24 and the semiconductor device 25 may be communicated with each other via the interposer 21. In some embodiments, the semiconductor device 25 may be a high bandwidth memory (HBM). In some embodiments, the conductive structure 253 may be a solder bump or copper pillar bump.

The encapsulant 26 is disposed on the upper surface 20u of the substrate 20. The encapsulant 26 is disposed above the upper surface 20u of the substrate 20. The encapsulant 26 is spaced from the substrate 20 by the electrical connection 28. The encapsulant 26 surrounds the interposer 21. The encapsulant 26 surrounds the conductive pillar 23. The encapsulant 26 encapsulates the interposer 21, the conductive pillar 23, the semiconductor device 24, and the semiconductor device 25. An upper surface of the semiconductor device 24 is exposed by the encapsulant 26. The encapsulant 26 has a resin material. The encapsulant 26 has a filler. There is no void in the encapsulant 26.

The underfill 22 is disposed between the substrate 20 and the encapsulant 26. The electrical connection 28 is surrounded by the underfill 22. The underfill 22 surrounds the encapsulant 26.

Figure 3B:
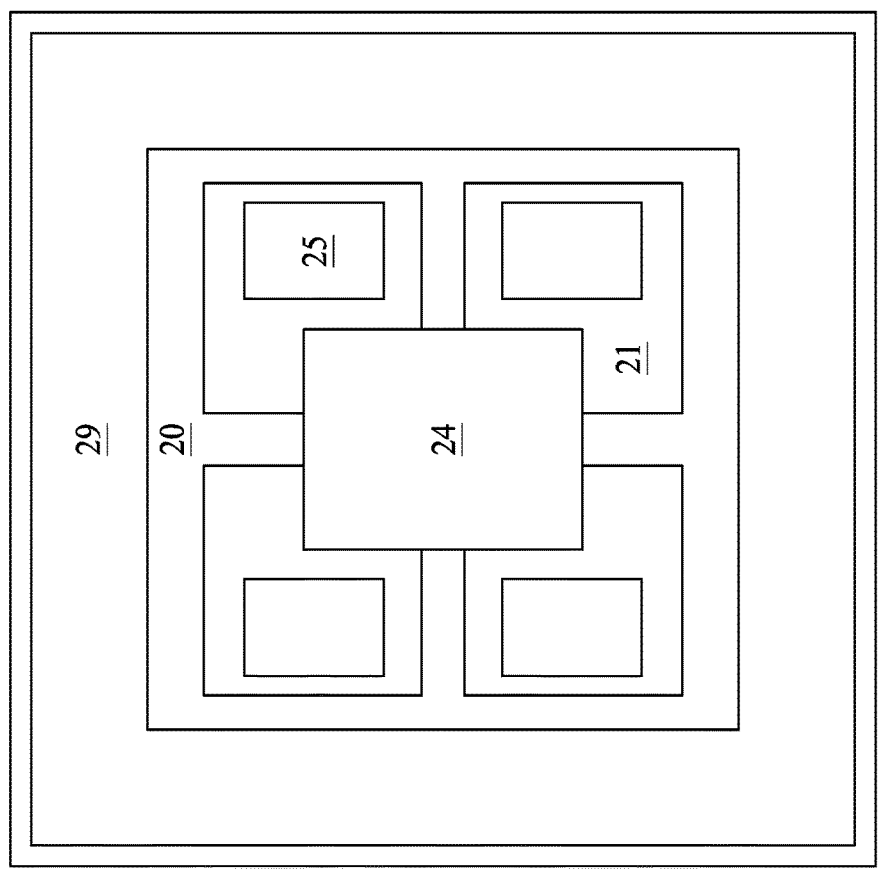
FIG. 3B illustrates a top view of a semiconductor device package according to some embodiments of the present disclosure.

FIG. 3B is a top view of the semiconductor device package 2 in accordance with some embodiments of the present disclosure. The interposer 21, the semiconductor device 24, the semiconductor device 25, and the ring structure 29 are disposed on the substrate 20. The four interposers 21 surround the conductive pillar 23 (not shown in FIG. 3B). The ring structure 29 surrounds the interposers 21. The semiconductor device 24 is disposed on the interposer 21. The semiconductor device 25 is disposed on the interposer 21. Since the size (e.g. a width or a diameter) of the conductive via 211 of the interposer 21 could be sufficiently small, an area of the interposer 21 could be decreased. Accordingly, the cost of the semiconductor device package 2 could be decreased.

The semiconductor device 24 may be disposed on four interposers 21. In some embodiments, the semiconductor device 24 may be disposed on two interposers 21. The semiconductor device 24 may be disposed on six interposers 21. The semiconductor device 24 may be disposed on eight interposers 21.

Figure 4A:
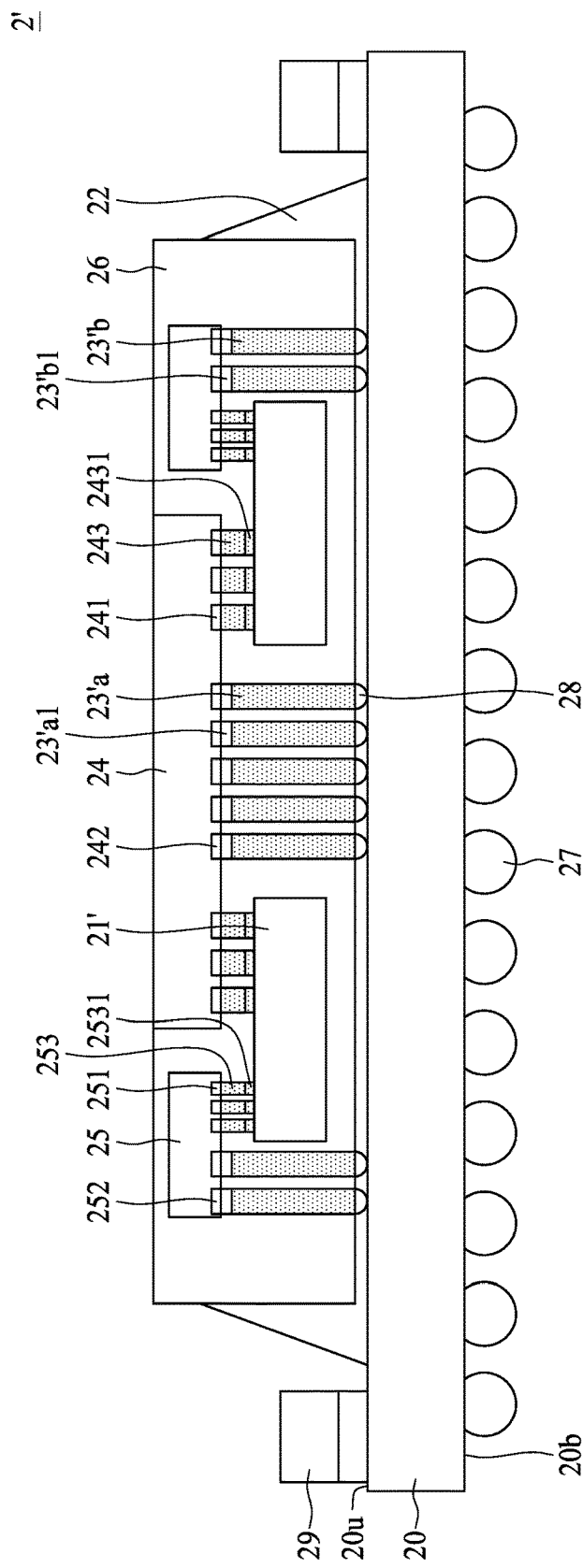
FIG. 4A illustrates a cross-sectional view of a semiconductor device package according to some embodiments of the present disclosure.

FIG. 4A is a cross-sectional view of a semiconductor device package 2' in accordance with some embodiments of the present disclosure. The semiconductor device package 2' includes a substrate 20, an interposer 21', an underfill 22, a conductive pillar 23'a, a conductive pillar 23'b, a semiconductor device 24, a semiconductor device 25, an encapsulant 26, a solder ball 27, and a ring structure 29.

The substrate 20 has an upper surface 20u and a lower surface 20b opposite to the upper surface 20u. The interposer 21' may have no conductive via. The interposer 21' is disposed on the upper surface 20u of the substrate 20. The electrical connection 28 is disposed on the upper surface 20u of the substrate 20. The electrical connection 28 electrically connects the conductive pillar 23'a or 23'b to the substrate 20. The electrical connection 28 may be a bump. The ring structure 29 is disposed on the upper surface 20u of the substrate 20. The ring structure 29 is disposed adjacent to a periphery the substrate 20. The ring structure 29 surrounds the encapsulant 26 and the interposer 21'. The solder ball 27 is disposed on the lower surface 20b of the substrate 20. The ring structure 29 provides a function to prevent from a warpage issue. In some embodiments, the ring structure 29 may be omitted.

The conductive pillar 23'a is disposed on the upper surface 20u of the substrate 20. The conductive pillar 23'b is disposed on the upper surface 20u of the substrate 20. The conductive pillar 23'a is disposed between the interposers 21'. The conductive pillar 23'a is surrounded by the interposers 21'. The conductive pillar 23'b is disposed adjacent to a periphery of the encapsulant 26. The conductive pillar 23'a or 23'b may be used as a grounding path or a power path. A size (e.g. a width, a diameter, or a height) of the conductive pillar 23'a may be different from a size of the conductive pillar 23'b. The size of the conductive pillar 23'a may be the same as the size of the conductive pillar 23'b. The width of the conductive pillar 23'a or 23'b is sufficiently large to prevent from a short issue resulting from a large current. An aspect ratio of the conductive pillar 23'a or 23'b is greater than 7. The size of the conductive pillar 23'a or 23'b may be adjusted based on a desired design. In some embodiments, the conductive pillar 23'b may be replaced with the conductive pillar 23'a. The conductive pillar 23'a may include a solder joint 23'a1. The conductive pillar 23'b may include a solder joint 23'b1.

The semiconductor device 24 is disposed on the interposer 21'. The semiconductor device 24 is disposed on the conductive pillar 23'a. The semiconductor device 24 includes a conductive pad 241 and a conductive pad 242. The conductive pad 241 is electrically connected to the interposer 21' via a conductive structure 243. The conductive structure 243 may include a solder joint 2431 which contacts the interposer 21'. The conductive pad 242 is electrically connected to the conductive pillar 23'a. The conductive pad 242 may contact the solder joint 23'a1 of the conductive pillar 23'a. The semiconductor device 24 is electrically connected to the substrate 20 via the conductive pillar 23'a. The conductive pad 242 may be a grounding pad. In some embodiments, the semiconductor device 24 may include an application-specific integrated circuit (ASIC), a controller, a processor or other electronic component or semiconductor device.

The semiconductor device 25 is disposed on the interposer 21'. The semiconductor device 25 is disposed on the conductive pillar 23'b. The semiconductor device 25 includes a conductive pad 251 and a conductive pad 252. The semiconductor device 25 is electrically connected to the interposer 21' via the conductive pad 251. The conductive pad 251 is electrically connected to a conductive structure 253. The conductive structure 253 may include a solder joint 2531 which contacts the interposer 21'. The semiconductor device 25 is electrically connected to the conductive pillar 23'b via the conductive pad 252. The conductive pad 252 may contact the solder joint 23'b1 of the conductive pillar 23'b. The semiconductor device 25 is electrically connected to the substrate 20 via the conductive pillar 23'b. The conductive pad 252 may be a grounding pad. The semiconductor device 24 and the semiconductor device 25 may be communicated with each other via the interposer 21'. In some embodiments, the semiconductor device 25 may be a high bandwidth memory (HBM). In some embodiments, the conductive structure 253 may be a solder bump or copper pillar bump.

The encapsulant 26 is disposed on the upper surface 20u of the substrate 20. The encapsulant 26 surrounds the interposer 21'. The encapsulant 26 surrounds the conductive pillar 23'a. The encapsulant 26 surrounds the conductive pillar 23'b. The encapsulant 26 encapsulates the interposer 21', the conductive pillar 23'a, the conductive pillar 23'b, the semiconductor device 24, and the semiconductor device 25. The interposer 21' is embedded in the encapsulant 26. An upper surface of the semiconductor device 24 is exposed by the encapsulant 26. The encapsulant 26 has a resin material. The encapsulant 26 has a filler. There is no void in the encapsulant 26.

Figure 4B:
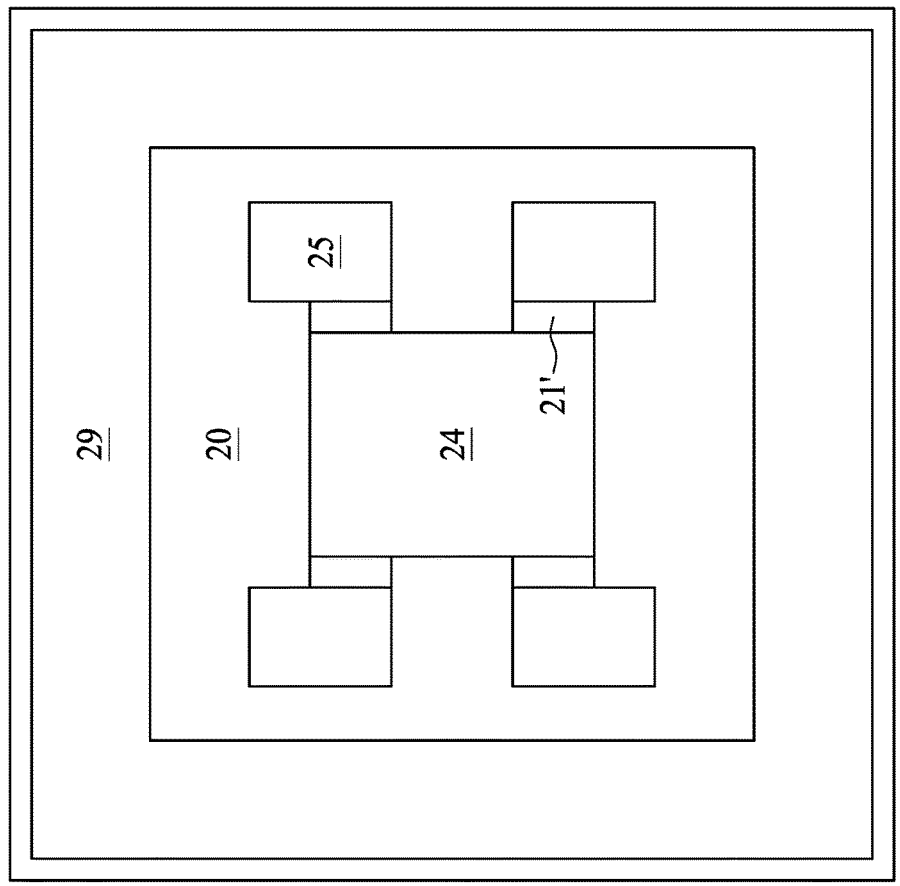
FIG. 4B illustrates a top view of a semiconductor device package according to some embodiments of the present disclosure.

FIG. 4B is a top view of the semiconductor device package 2' in accordance with some embodiments of the present disclosure. The interposer 21', the semiconductor device 24, the semiconductor device 25, and the ring structure 29 are disposed on the substrate 20. The four interposers 21' surround the conductive pillar 23 (not shown in FIG. 4B). The ring structure 29 surrounds the interposers 21'. The semiconductor device 24 is disposed on the interposer 21'. The semiconductor device 25 is disposed on the interposer 21'. Since the interposer 21' may have no conductive via, an area of the interposer 21' could be decreased as small as it can. Accordingly, the cost of the semiconductor device package 2' could be decreased.

The semiconductor device 24 may be disposed on four interposers 21'. In some embodiments, the semiconductor device 24 may be disposed on two interposers 21'. The semiconductor device 24 may be disposed on six interposers 21'. The semiconductor device 24 may be disposed on eight interposers 21'.

Figure 5A:
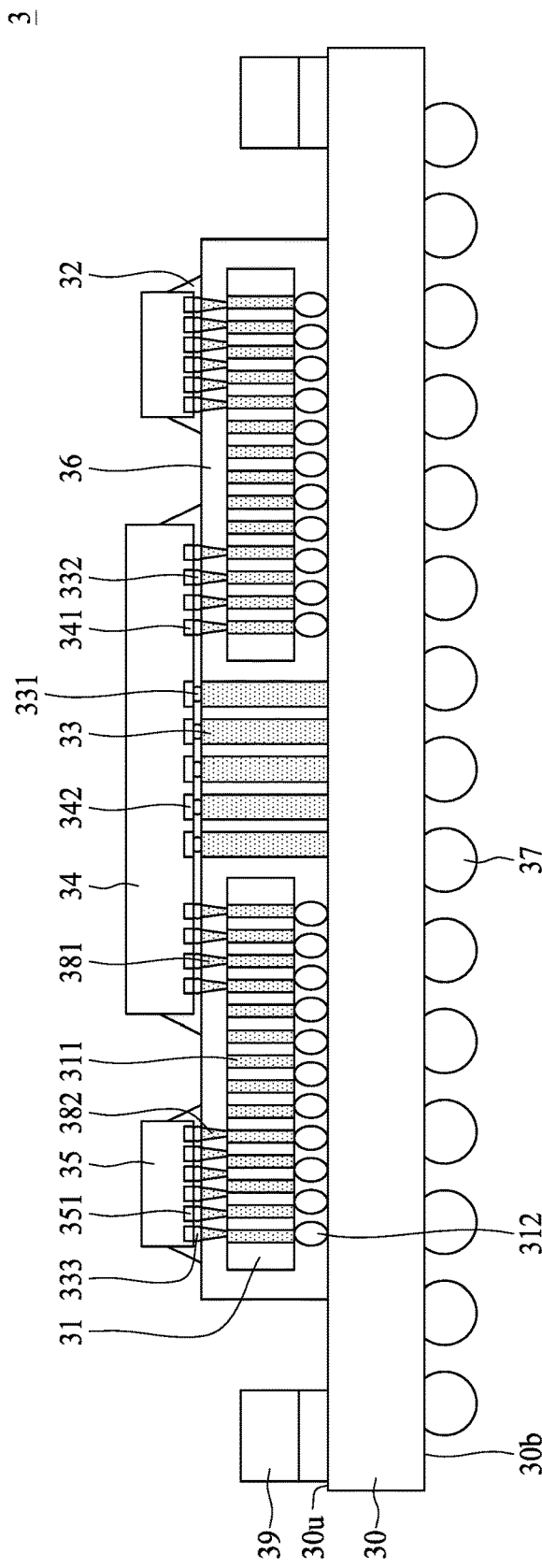
FIG. 5A illustrates a cross-sectional view of a semiconductor device package according to some embodiments of the present disclosure.

FIG. 5A is a cross-sectional view of a semiconductor device package 3 in accordance with some embodiments of the present disclosure. The semiconductor device package 3 includes a substrate 30, an interposer 31, an underfill 32, a conductive pillar 33, a semiconductor device 34, a semiconductor device 35, an encapsulant 36, a solder ball 37, an interconnection 381, an interconnection 382, and a ring structure 39.

The substrate 30 has an upper surface 30u and a lower surface 30b opposite to the upper surface 30u. The interposer 31 is disposed on the upper surface 30u of the substrate 30. The ring structure 39 is disposed on the upper surface 30u of the substrate 30. The ring structure 39 is disposed adjacent to a periphery the substrate 30. The ring structure 39 surrounds the encapsulant 36 and the interposer 31. The solder ball 37 is disposed on the lower surface 30b of the substrate 30. The ring structure 39 provides a function to prevent from a warpage issue. In some embodiments, the ring structure 39 may be omitted.

The interposer 31 (e.g., a through silicon via (TSV) interposer) includes a conductive via 311 and an electrical terminal 312. The interposer 31 is electrically connected to the substrate 30 via the electrical terminal 312. A size (e.g. a height, a width, or a diameter) of the conductive via 311 of the interposer 31 is less than a size of the conductive pillar 33.

The conductive pillar 33 is disposed on the upper surface 30u of the substrate 30. The conductive pillar 33 is disposed between the interposers 31. The conductive pillar 33 is surrounded by the interposers 31. The conductive pillar 33 may be used as a grounding path or a power path. A width of the conductive pillar 33 is different from a width of the conductive via 311. The width of the conductive pillar 33 is greater than the width of the conductive via 311. A height of the conductive pillar 33 is greater than a height of the conductive via 311. The width of the conductive pillar 33 is sufficiently large to prevent from a short issue resulting from a large current. An aspect ratio of the conductive pillar 33 is greater than 7. The size of the conductive pillar 33 may be adjusted based on a desired design.

The encapsulant 36 is disposed on the upper surface 30u of the substrate 30. The encapsulant 36 surrounds the interposer 31. The encapsulant 36 surrounds the conductive pillar 33. The encapsulant 36 encapsulates the interposer 31 and the conductive pillar 33. The encapsulant 36 has a resin material. The encapsulant 36 has a filler. There is no void in the encapsulant 36.

The interconnection 381 is disposed in the encapsulant 36. The interconnection 382 is disposed in the encapsulant 36. The interconnection 381 electrically connects the interposer 31 to the semiconductor device 34. The interconnection 382 electrically connects the interposer 31 to the semiconductor device 35. A width of the interconnection 381 may be different from the width of the interconnection 382. The width of the interconnection 381 may be greater than the width of the interconnection 382. The width of the interconnection 381 may be less than the width of the interconnection 382. The width of the interconnection 381 may be the same as the width of the interconnection 382. The interconnections 382 surround the interconnections 381.

The semiconductor device 34 is disposed on the interposer 31. The semiconductor device 34 is disposed on the conductive pillar 33. The semiconductor device 34 includes a conductive pad 341 and a conductive pad 342. The conductive pad 341 is electrically connected to the conductive via 311 of the interposer 31 via the interconnection 381. A conductive structure 332 is disposed between the conductive pad 341 and the interconnection 381. The conductive structure 332 electrically connects the conductive pad 341 and the interconnection 381. The conductive pad 342 is electrically connected to the conductive pillar 33. A conductive structure 331 is disposed between the conductive pad 342 and the conductive pillar 33. The conductive structure 331 electrically connects the conductive pad 342 and the conductive pillar 33. The semiconductor device 34 is electrically connected to the substrate 30 via the interposer 31. The semiconductor device 34 is electrically connected to the substrate 30 via the conductive pillar 33. The conductive pad 342 may be a grounding pad. In some embodiments, the semiconductor device 34 may include an application-specific integrated circuit (ASIC), a controller, a processor or other electronic component or semiconductor device. In some embodiments, the conductive structure 331 and the conductive structure 332 may be a solder bump or copper pillar bump.

The semiconductor device 35 is disposed on the interposer 31. The semiconductor device 35 is disposed on the conductive pillar 33. The semiconductor device 35 includes a conductive pad 351. The conductive pad 351 is electrically connected to the conductive via 311 of the interposer 31 via the interconnection 382. The semiconductor device 35 is electrically connected to the substrate 30 via the interposer 31. A conductive structure 333 is disposed between the conductive pad 351 and the interconnection 382. The conductive structure 333 electrically connects the conductive pad 351 and the interconnection 382. The semiconductor device 34 and the semiconductor device 35 may be communicated with each other via the interposer 31. In some embodiments, the semiconductor device 35 may be a high bandwidth memory (HBM). In some embodiments, the conductive structure 333 and the conductive may be a solder bump or copper pillar bump.

The underfill 32 is disposed on the encapsulant 36. The underfill 32 may be disposed between the semiconductor device 34 and the encapsulant 36. The underfill 32 may be disposed between the semiconductor device 35 and the encapsulant 36. The underfill 32 may surround the conductive pad 341 and the conductive pad 342. The underfill 32 may surround the conductive pad 351.

Figure 5B:
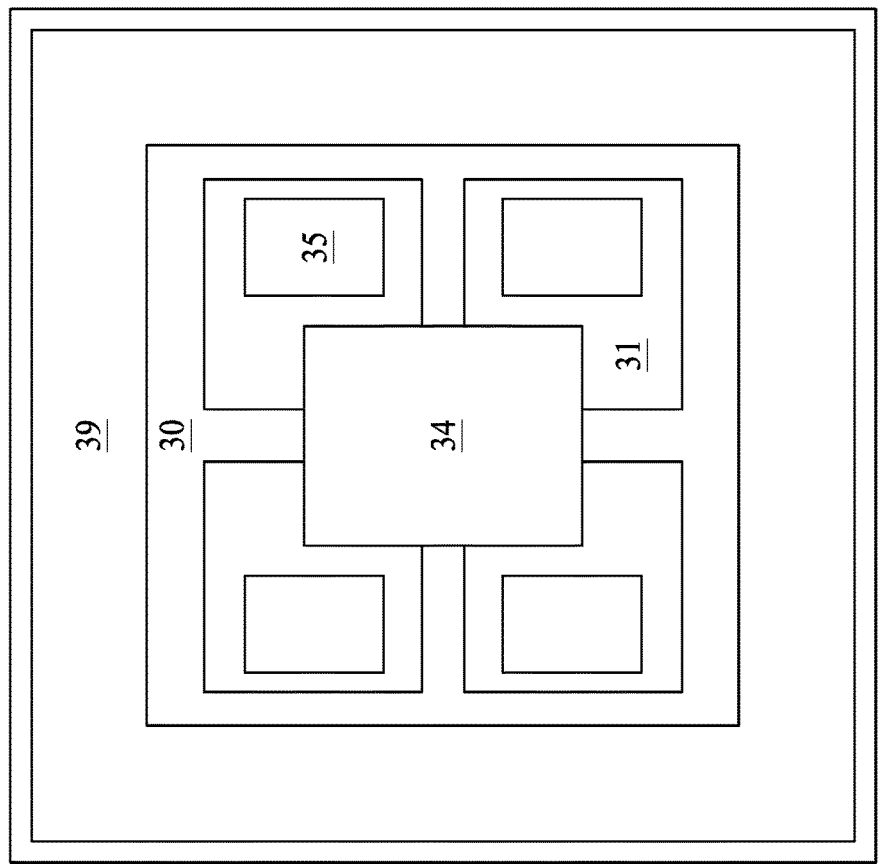
FIG. 5B illustrates a top view of a semiconductor device package according to some embodiments of the present disclosure.

FIG. 5B is a top view of the semiconductor device package 3 in accordance with some embodiments of the present disclosure. The interposer 31, the semiconductor device 34, the semiconductor device 35, and the ring structure 39 are disposed on the substrate 30. The four interposers 31 surround the conductive pillar 33 (not shown in FIG. 5B). The ring structure 39 surrounds the interposers 31. The semiconductor device 34 is disposed on the interposer 31. The semiconductor device 35 is disposed on the interposer 31. Since the size (e.g. a width or a diameter) of the conductive via 311 of the interposer 31 could be sufficiently small, an area of the interposer 31 could be decreased. Accordingly, the cost of the semiconductor device package 3 could be decreased.

The semiconductor device 34 may be disposed on four interposers 31. In some embodiments, the semiconductor device 34 may be disposed on two interposers 31. The semiconductor device 34 may be disposed on six interposers 31. The semiconductor device 34 may be disposed on eight interposers 31.

Figure 6A:
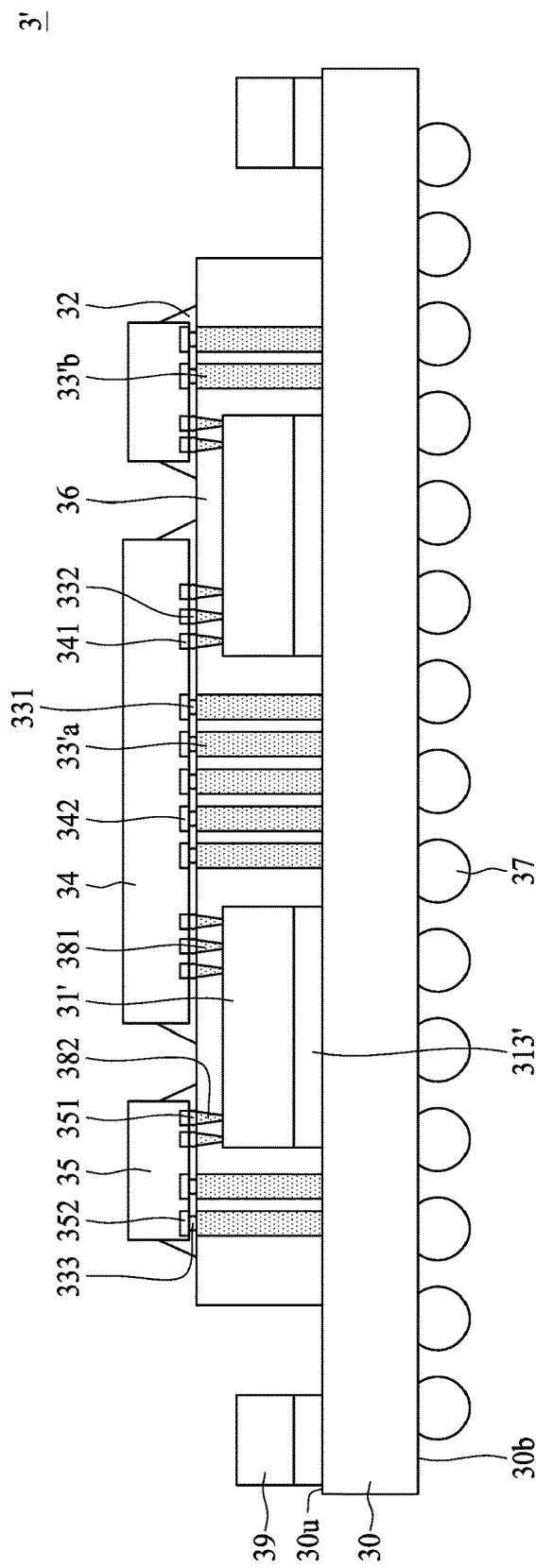
FIG. 6A illustrates a cross-sectional view of a semiconductor device package according to some embodiments of the present disclosure.

FIG. 6A is a cross-sectional view of a semiconductor device package 3' in accordance with some embodiments of the present disclosure. The semiconductor device package 3' includes a substrate 30, an interposer 31', an underfill 32, a conductive pillar 33'a, a conductive pillar 33'b, a semiconductor device 34, a semiconductor device 35, an encapsulant 36, a solder ball 37, an interconnection 381, an interconnection 382, and a ring structure 39.

The substrate 30 has an upper surface 30u and a lower surface 30b opposite to the upper surface 30u. The interposer 31' may have no conductive via. The interposer 31' is disposed on the upper surface 30u of the substrate 30 via an adhesive 313'. The ring structure 39 is disposed on the upper surface 30u of the substrate 30. The ring structure 39 is disposed adjacent to a periphery the substrate 30. The ring structure 39 surrounds the encapsulant 36 and the interposer 31'. The solder ball 37 is disposed on the lower surface 30b of the substrate 30. The ring structure 39 provides a function to prevent from a warpage issue. In some embodiments, the ring structure 39 may be omitted.

The conductive pillar 33'a is disposed on the upper surface 30u of the substrate 30.

The conductive pillar 33'b is disposed on the upper surface 30u of the substrate 30. The conductive pillar 33'a is disposed between the interposers 31'. The conductive pillar 33'a is surrounded by the interposers 31'. The conductive pillar 33'b is disposed adjacent to a periphery of the encapsulant 36. The conductive pillar 33'a or 33'b may be used as a grounding path or a power path. A size (e.g. a width, a diameter, or a height) of the conductive pillar 33'a may be different from a size of the conductive pillar 33'b. The size of the conductive pillar 33'a may be the same as the size of the conductive pillar 33'b. The width of the conductive pillar 33'a or 33'b is sufficiently large to prevent from a short issue resulting from a large current. An aspect ratio of the conductive pillar 33'a or 33'b is greater than 7. The size of the conductive pillar 33'a or 33'b may be adjusted based on a desired design. In some embodiments, the conductive pillar 33'b may be replaced with the conductive pillar 33'a.

The encapsulant 36 is disposed on the upper surface 30u of the substrate 30. The encapsulant 36 surrounds the interposer 31'. The encapsulant 36 surrounds the conductive pillar 33'a. The encapsulant 36 surrounds the conductive pillar 33'b. The encapsulant 36 encapsulates the interposer 31', the conductive pillar 33'a, and the conductive pillar 33'b. The encapsulant 36 has a resin material. The encapsulant 36 has a filler. There is no void in the encapsulant 36.

The interconnection 381 is disposed in the encapsulant 36. The interconnection 382 is disposed in the encapsulant 36. The interconnection 381 electrically connects the interposer 31' to the semiconductor device 34. The interconnection 382 electrically connects the interposer 31' to the semiconductor device 35. A width of the interconnection 381 may be different from the width of the interconnection 382. The width of the interconnection 381 may be greater than the width of the interconnection 382. The width of the interconnection 381 may be less than the width of the interconnection 382. The width of the interconnection 381 may be the same as the width of the interconnection 382. The interconnections 382 surround the interconnections 381.

The semiconductor device 34 is disposed on the encapsulant 36. The semiconductor device 34 is disposed on the interposer 31'. The semiconductor device 34 is disposed on the conductive pillar 33'a. The semiconductor device 34 includes a conductive pad 341 and a conductive pad 342. The conductive pad 341 is electrically connected to the conductive via 311 of the interposer 31 via the interconnection 381. A conductive structure 332 is disposed between the conductive pad 341 and the interconnection 381. The conductive structure 332 electrically connects the conductive pad 341 and the interconnection 381. The conductive pad 342 is electrically connected to the conductive pillar 33'a. A conductive structure 331 is disposed between the conductive pad 342 and the conductive pillar 33'a. The conductive structure 331 electrically connects the conductive pad 342 and the conductive pillar 33'a. The semiconductor device 34 is electrically connected to the substrate 30 via the conductive pillar 33'a. The conductive pad 342 may be a grounding pad. In some embodiments, the semiconductor device 34 may include an application-specific integrated circuit (ASIC), a controller, a processor or other electronic component or semiconductor device. In some embodiments, the conductive structure 331 and the conductive structure 332 may be a solder bump or copper pillar bump.

The semiconductor device 35 is disposed on the encapsulant 36. The semiconductor device 35 is disposed on the interposer 31'. The semiconductor device 35 is disposed on the conductive pillar 33'b. The semiconductor device 35 includes a conductive pad 351 and a conductive pad 352. The conductive pad 351 is electrically connected to the conductive via 311 of the interposer 31 via the interconnection 382. A conductive structure 333 is disposed between the conductive pad 351 and the interconnection 382. The conductive structure 333 electrically connects the conductive pad 351 and the interconnection 382. The semiconductor device 35 is electrically connected to the conductive pillar 33'*b* via the conductive pad 352. A conductive structure 333 is disposed between the conductive pad 352 and the conductive pillar 33'*b*. The conductive structure 333 electrically connects the conductive pad 351 and the conductive pillar 33'*b*. The semiconductor device 35 is electrically connected to the substrate 30 via the conductive pillar 33'*b*. The conductive pad 352 may be a grounding pad. The semiconductor device 34 and the semiconductor device 35 may be communicated with each other via the interposer 31'. In some embodiments, the semiconductor device 35 may be a high bandwidth memory (HBM).

The underfill 32 is disposed on the encapsulant 36. The underfill 32 may be disposed between the semiconductor device 34 and the encapsulant 36. The underfill 32 may be disposed between the semiconductor device 35 and the encapsulant 36. The underfill 32 may surround the conductive pad 341 and the conductive pad 342. The underfill 32 may surround the conductive pad 351.

Figure 6B:
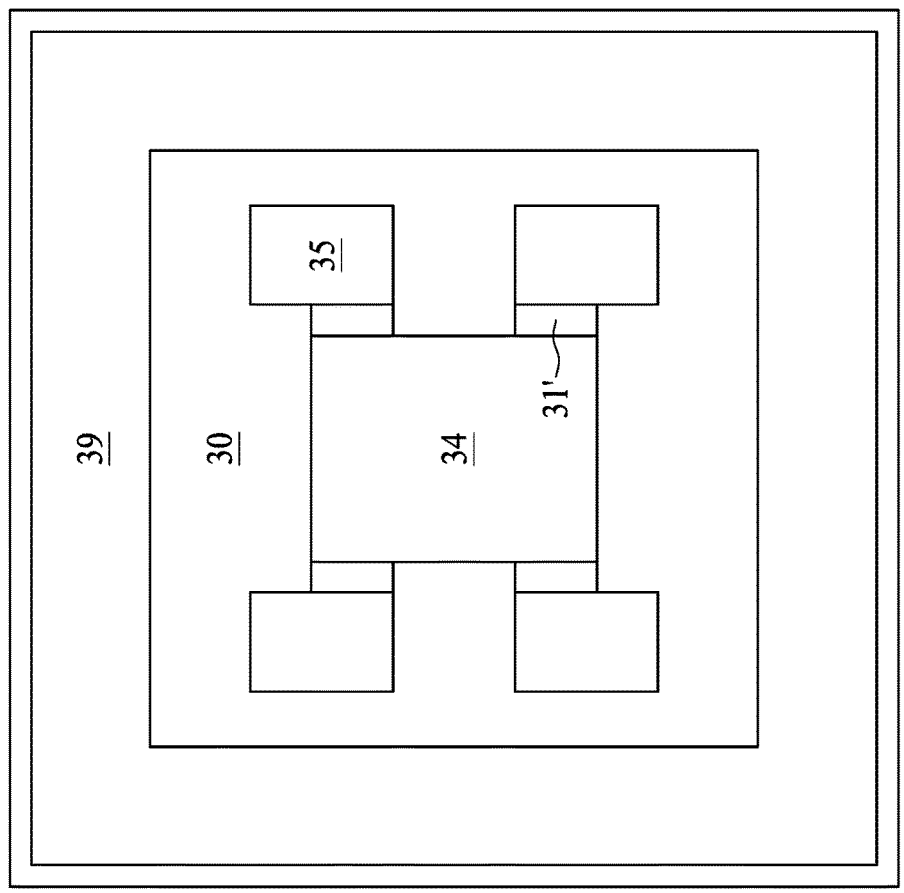
FIG. 6B illustrates a top view of a semiconductor device package according to some embodiments of the present disclosure.

FIG. 6B is a top view of the semiconductor device package 3' in accordance with some embodiments of the present disclosure. The interposer 31', the semiconductor device 34, the semiconductor device 35, and the ring structure 39 are disposed on the substrate 30. The four interposers 31' surround the conductive pillar 33'*a* (not shown in FIG. 6B). The ring structure 39 surrounds the interposers 31'. The semiconductor device 34 is disposed on the interposer 31'. The semiconductor device 35 is disposed on the interposer 31'. Since the interposer 31' may have no conductive via, an area of the interposer 31' could be decreased as small as it can. Accordingly, the cost of the semiconductor device package 3' could be decreased.

The semiconductor device 34 may be disposed on four interposers 31'. In some embodiments, the semiconductor device 34 may be disposed on two interposers 31'. The semiconductor device 34 may be disposed on six interposers 31'. The semiconductor device 34 may be disposed on eight interposers 31'.

FIG. 7A through FIG. 7F illustrate some embodiments of a method of manufacturing the semiconductor device package 1 according to some embodiments of the present disclosure.

Referring to FIG. 7A, a method for manufacturing the semiconductor device package 1 includes providing a substrate 10 with an upper surface 10*u* and a lower surface 10*b*. A conductive pillar 13 is disposed on the upper surface 10*u* of the substrate 10. The conductive pillar 13 is electrically connected to the substrate 10. The conductive pillar 13 may be a pre-formed solid pillar/post. A size (e.g. a width, a diameter, or a height) of the conductive pillar 13 may be adjusted. An aspect ratio of the conductive pillar 13 is greater than 7. The conductive pillar 13 may be used as a grounding path or a power path. The width of the conductive pillar 13 is sufficiently large to prevent from a short issue resulting from a large current.

Figure 7B:
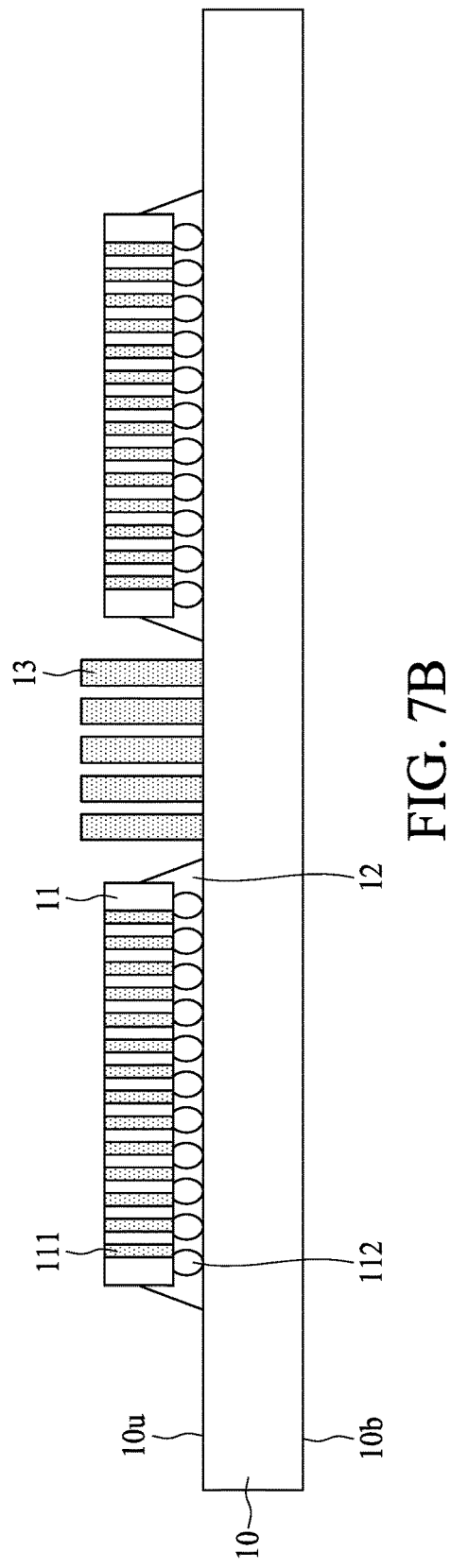
FIG. 7B illustrates a method of manufacturing a semiconductor device package according to some embodiments of the present disclosure.

Referring to FIG. 7B, an interposer 11 (e.g., a through silicon via (TSV) interposer) with a conductive via 111 and an electrical terminal 112 is disposed on the upper surface 10*u* of the substrate 10. An underfill 12 is disposed between the substrate 10 and the interposer 11. The conductive pillars 13 are surrounded by the interposers 11.

The size of the conductive pillar 13 is greater than a size of the conductive via 111. The width of the conductive pillar 13 is greater than a width of the conductive via 111. A height of the conductive pillar 13 is greater than a height of the conductive via 111. There is no grounding conductive vias (which has a relatively large width) in the interposer 11. Since the size (e.g. a width or a diameter) of the conductive via 111 of the interposer 11 could be sufficiently small, an area of the interposer 11 could be decreased. The conductive pillar 13 may include a solder joint 131.

Figure 7C:
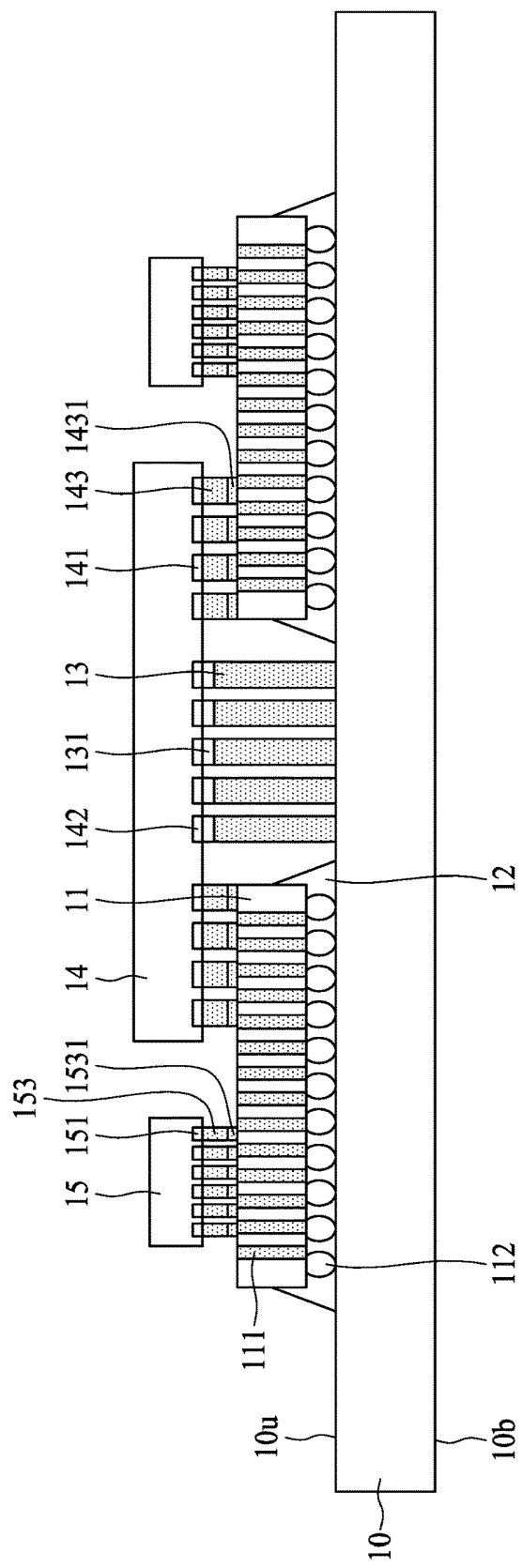
FIG. 7C illustrates a method of manufacturing a semiconductor device package according to some embodiments of the present disclosure.

Referring to FIG. 7C, a semiconductor device 14 is disposed on the interposer 11. The semiconductor device 14 is disposed on the conductive pillar 13. The semiconductor device 14 includes a conductive pad 141 and a conductive pad 142. The conductive pad 141 is electrically connected to the conductive via 111 of the interposer 11 via a conductive structure 143. The conductive structure 143 may include a solder joint 1431 which contacts the conductive via 111 of the interposer 11. The conductive pad 142 is electrically connected to the solder joint 131 of the conductive pillar 13. The semiconductor device 14 is electrically connected to the substrate 10 via the interposer 11. In some embodiments, the semiconductor device 14 may include an application-specific integrated circuit (ASIC), a controller, a processor or other electronic component or semiconductor device. In some embodiments, the conductive structure 143 may be a solder bump or copper pillar bump.

A semiconductor device 15 is disposed on the interposer 11. The semiconductor device 15 includes a conductive pad 151. The semiconductor device 15 is electrically connected to the interposer 11 via the conductive pad 151. The conductive pad 151 is electrically connected to a conductive structure 153. The conductive structure 153 may include a solder joint 1531 which contacts the conductive via 111 of the interposer 11. The semiconductor device 15 is electrically connected to the substrate 10 via the interposer 11. The semiconductor device 14 and the semiconductor device 15 may be communicated with each other via the interposer 11. In some embodiments, the semiconductor device 15 may be a high bandwidth memory (HBM). In some embodiments, the conductive structure 153 may be a solder bump or copper pillar bump.

Figure 7D:
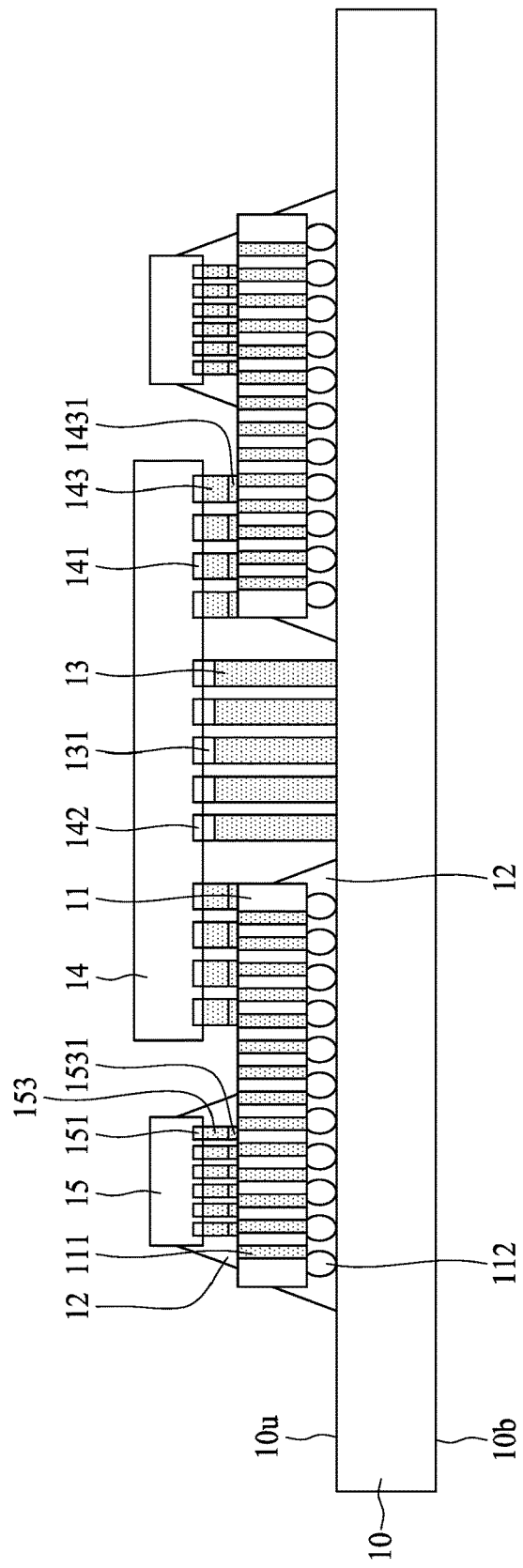
FIG. 7D illustrates a method of manufacturing a semiconductor device package according to some embodiments of the present disclosure.

Referring to FIG. 7D, an underfill 12 is disposed between the interposer 11 and the semiconductor device 15 to protect the conductive pad 151 of the semiconductor device 15.

Figure 7E:
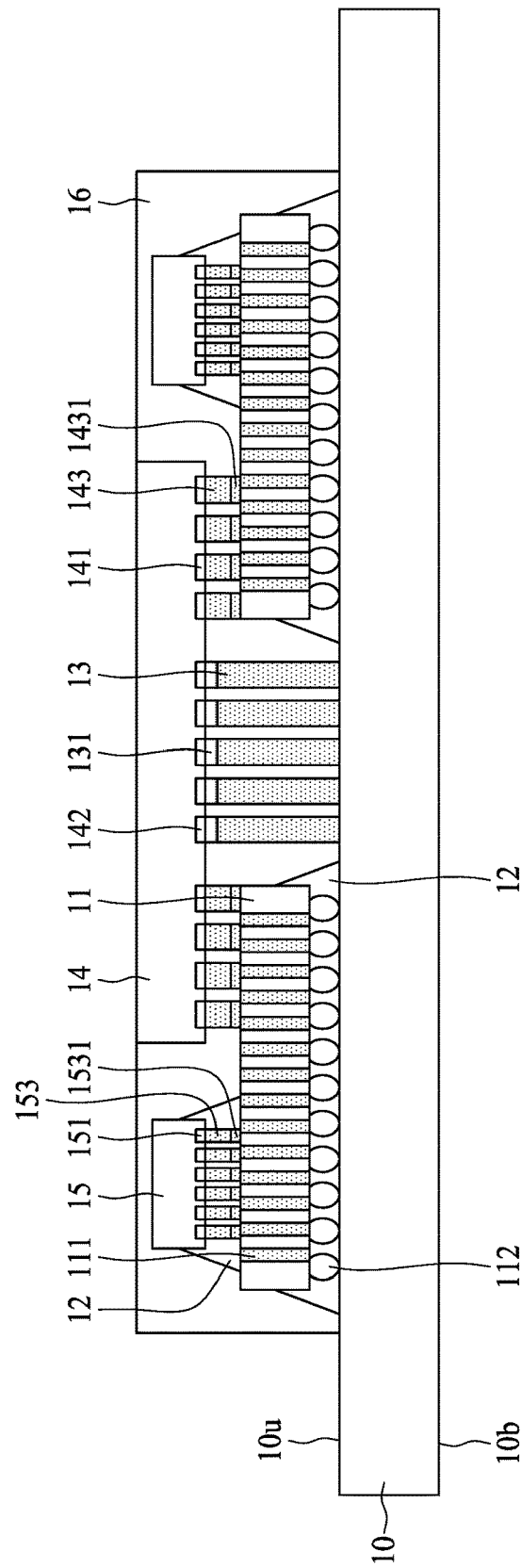
FIG. 7E illustrates a method of manufacturing a semiconductor device package according to some embodiments of the present disclosure.

Referring to FIG. 7E, a encapsulant 16 is disposed on the upper surface 10*u* of the substrate 10 to encapsulate the interposer 11, the conductive pillar 13, the semiconductor device 14, and the semiconductor device 15. The encapsulant 16 surrounds the conductive pillar 13 and the interposer 11. An upper surface of the semiconductor device 14 is exposed by the encapsulant 16. The encapsulant 16 has a resin material. The encapsulant 16 has a filler.

In some embodiments, since the distance between the interposer 11 and the semiconductor device 14 is small and the conductive pads 141 are dense, the encapsulant 16 may not be able to completely enter a space among the substrate 10, the interposers 11, and the semiconductor device 14, which results in some voids in the encapsulant 16. The voids are positioned between the interposer 11 and the semiconductor device 14. The voids are positioned between the interposer 11, the conductive pillar 13, and the semiconductor device 14.

Figure 7F:
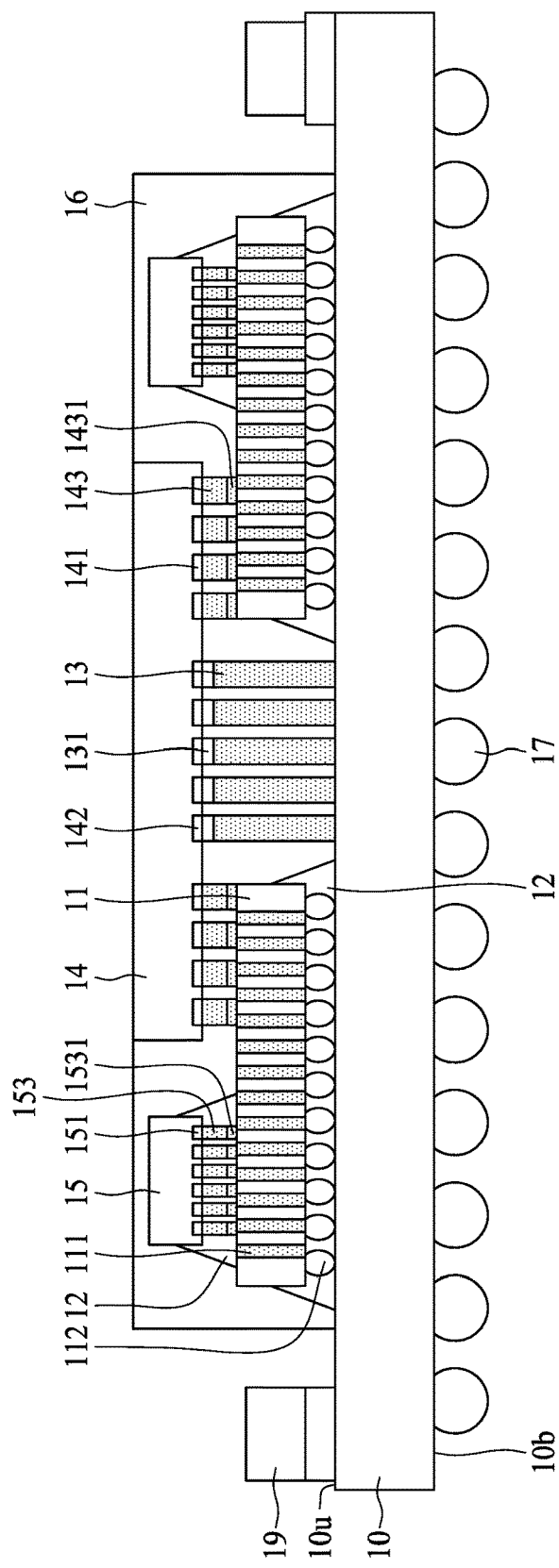
FIG. 7F illustrates a method of manufacturing a semiconductor device package according to some embodiments of the present disclosure.

Referring to FIG. 7F, a ring structure 19 is disposed on the upper surface 10*u* of the substrate 10. Subsequently, a solder ball 17 is disposed on the lower surface 10*b* of the substrate 10. The ring structure 19 provides a function to prevent from a warpage issue. In some embodiments, the ring structure 19 may be omitted. Subsequently, a singulation operation may be performed.

FIG. 8A through FIG. 8E illustrate some embodiments of a method of manufacturing the semiconductor device package 1' according to some embodiments of the present disclosure.

Figure 8A:
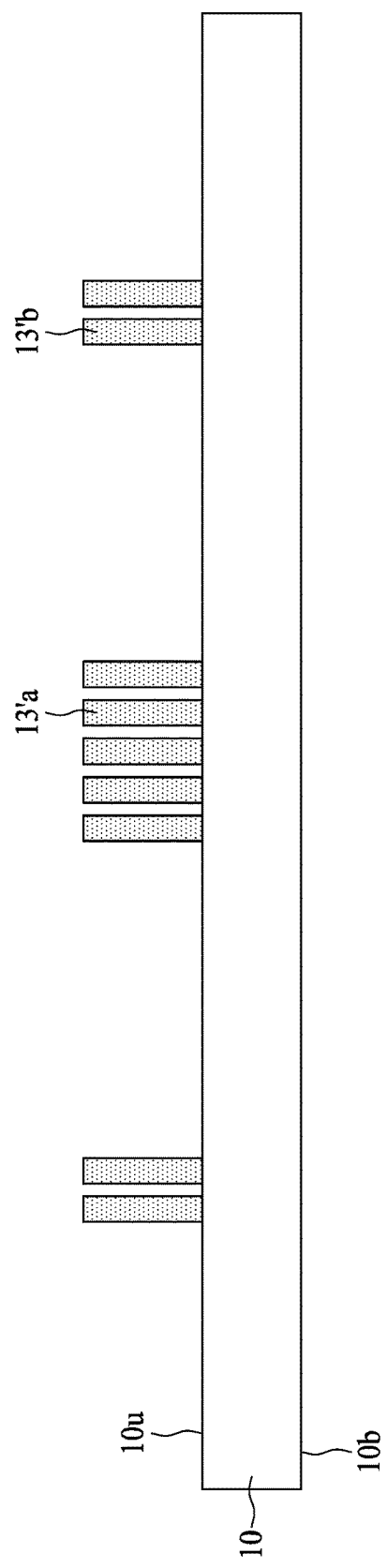
FIG. 8A illustrates a method of manufacturing a semiconductor device package according to some embodiments of the present disclosure.

Referring to FIG. 8A, a method for manufacturing the semiconductor device package 1' includes providing a substrate 10 with an upper surface 10u and a lower surface 10b. A conductive pillar 13'a is disposed on the upper surface 10u of the substrate 10. The conductive pillar 13'a is electrically connected to the substrate 10. A conductive pillar 13'b is disposed on the upper surface 10u of the substrate 10. The conductive pillar 13'b is electrically connected to the substrate 10. The conductive pillar 13'a is disposed adjacent to a central portion of the substrate 10. The conductive pillar 13'b is disposed adjacent to a peripheral portion of the substrate 10. The conductive pillar 13'a or 13'b may be a pre-formed solid pillar/post.

A size (e.g. a height, a width, or a diameter) of the conductive pillar 13'a or 13'b may be adjusted. The size of the conductive pillar 13'a may be the same as the size of conductive pillar 13'b. The size of the conductive pillar 13'a may be different from the size of conductive pillar 13'b. An aspect ratio of the conductive pillar 13'a or 13'b is greater than 7. The conductive pillar 13'a or 13'b may be used as a grounding path or a power path. The width of the conductive pillar 13'a or 13'b is sufficiently large to prevent from a short issue resulting from a large current. The conductive pillar 13'a may include a solder joint 13'a1. The conductive pillar 13'b may include a solder joint 13'b1.

Figure 8B:
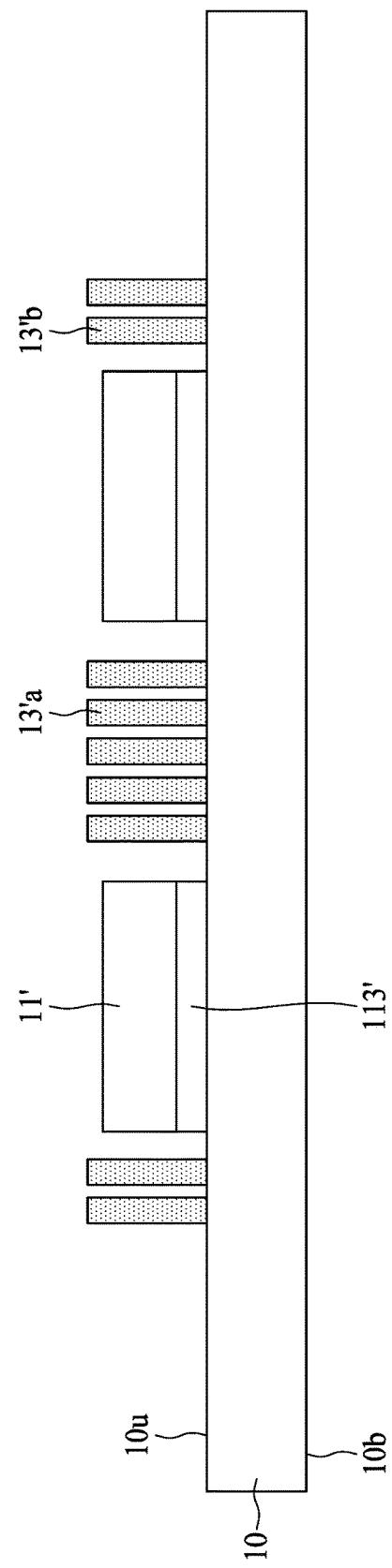
FIG. 8B illustrates a method of manufacturing a semiconductor device package according to some embodiments of the present disclosure.

Referring to FIG. 8B, an interposer 11' is disposed on the upper surface 10u of the substrate 10. The interposer 11' is attached to the substrate 10 via an adhesive 113'. The interposer 11' is disposed between the conductive pillar 13'a and the conductive pillar 13'b. The interposer 11' may have no conductive via. Since the interposer 11' may have no conductive via, an area of the interposer 11' could be decreased as small as it can. Accordingly, the cost of the semiconductor device package 1' could be decreased.

Figure 8C:
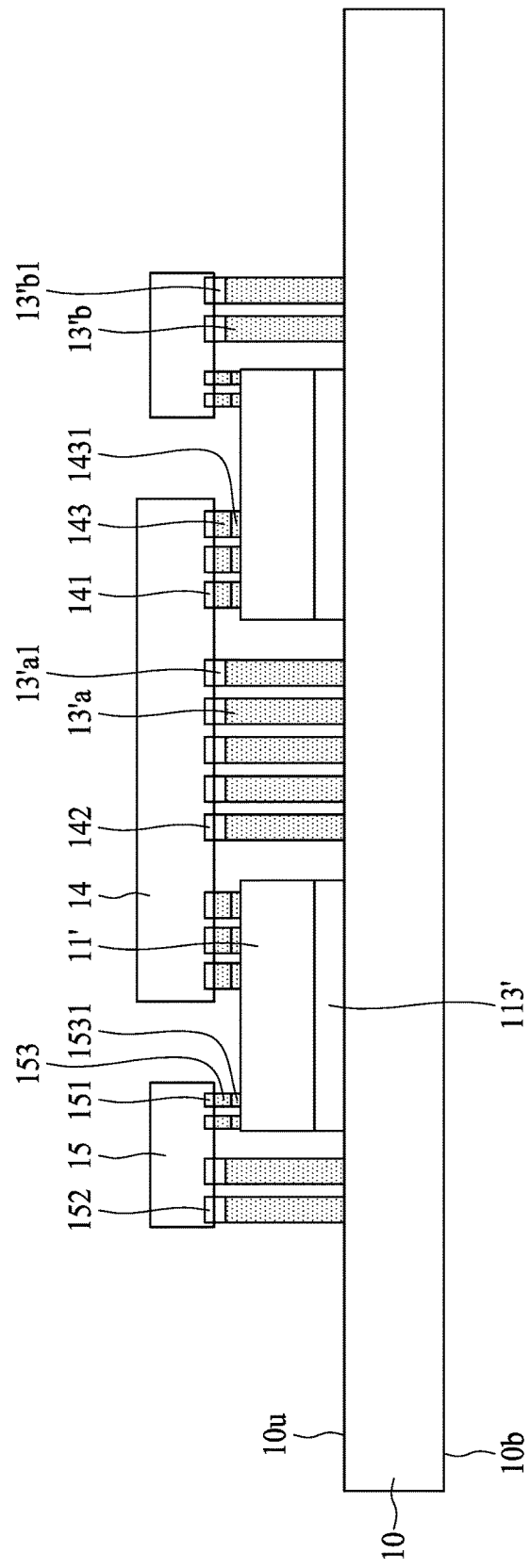
FIG. 8C illustrates a method of manufacturing a semiconductor device package according to some embodiments of the present disclosure.

Referring to FIG. 8C, a semiconductor device 14 is disposed on the interposer 11'. The semiconductor device 14 is disposed on the conductive pillar 13'a. The semiconductor device 14 includes a conductive pad 141 and a conductive pad 142. The conductive pad 141 is electrically connected to the interposer 11' via a conductive structure 143. The conductive structure 143 may include a solder joint 1431 which contacts the interposer 11'. The conductive pad 142 is electrically connected to the conductive pillar 13'a. The conductive pad 142 may contact the solder joint 13'a1 of the conductive pillar 13'a. The semiconductor device 14 is electrically connected to the substrate 10 via the conductive pillar 13'a. The conductive pad 142 may be a grounding pad. In some embodiments, the semiconductor device 14 may include an application-specific integrated circuit (ASIC), a controller, a processor or other electronic component or semiconductor device.

A semiconductor device 15 is disposed on the interposer 11'. The semiconductor device 15 is disposed on the conductive pillar 13'b. The semiconductor device 15 includes a conductive pad 151 and a conductive pad 152. The semiconductor device 15 is electrically connected to the interposer 11' via the conductive pad 151. The conductive pad 151 is electrically connected to a conductive structure 153. The conductive structure 153 may include a solder joint 1531 which contacts the interposer 11'. The semiconductor device 15 is electrically connected to the conductive pillar 13'b via the conductive pad 152. The conductive pad 152 may contact the solder joint 13'b1 of the conductive pillar 13'b. The semiconductor device 15 is electrically connected to the substrate 10 via the conductive pillar 13'b. The conductive pad 152 may be a grounding pad. The semiconductor device 14 and the semiconductor device 15 may be communicated with each other via the interposer 11'. In some embodiments, the semiconductor device 15 may be a high bandwidth memory (HBM). In some embodiments, the conductive structure 153 may be a solder bump or copper pillar bump.

Figure 8D:
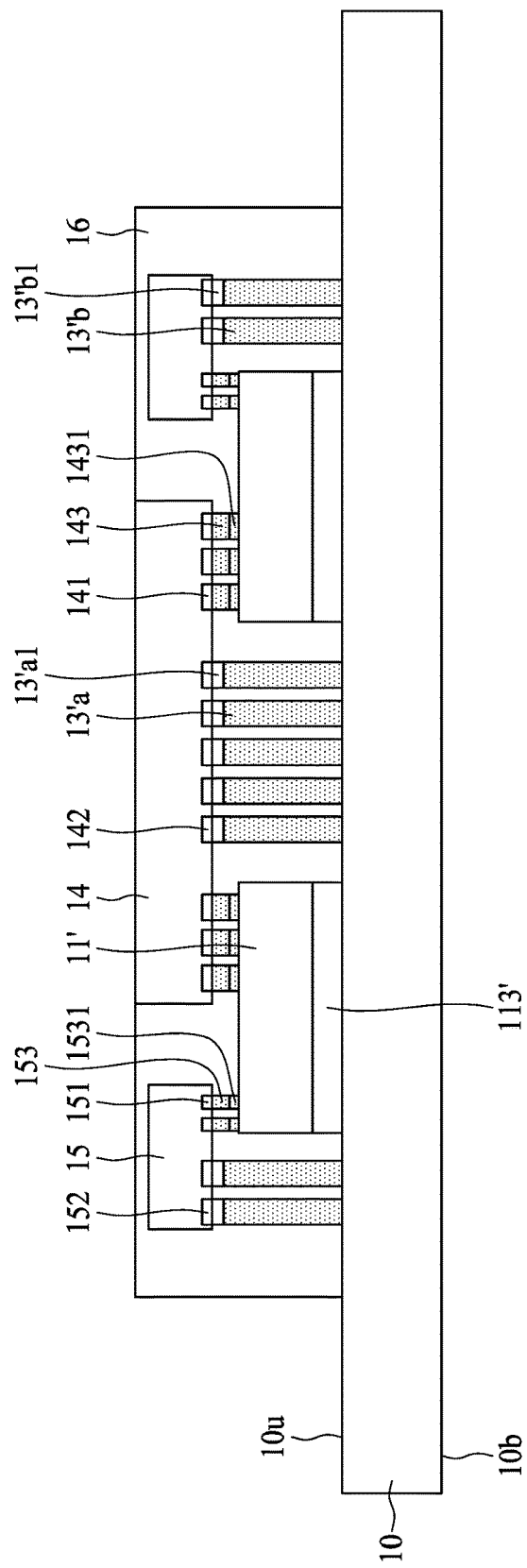
FIG. 8D illustrates a method of manufacturing a semiconductor device package according to some embodiments of the present disclosure.

Referring to FIG. 8D, an encapsulant 16 is disposed on the upper surface 10u of the substrate 10 to encapsulate the interposer 11', the conductive pillar 13'a, the conductive pillar 13'b, the semiconductor device 14, and the semiconductor device 15. The encapsulant 16 surrounds the conductive pillar 13'a, the conductive pillar 13'b, and the interposer 11'. An upper surface of the semiconductor device 14 is exposed by the encapsulant 16. The encapsulant 16 has a resin material. The encapsulant 16 has a filler.

In some embodiments, since the distance between the interposer 11' and the semiconductor device 14 is small and the conductive pads 141 are dense, the encapsulant 16 may not be able to completely enter a space among the substrate 10, the interposers 11', and the semiconductor device 14, which results in some voids in the encapsulant 16. The voids are positioned between the interposer 11' and the semiconductor device 14. The voids are positioned between the interposer 11', the conductive pillar 13'a, and the semiconductor device 14.

Figure 8E:
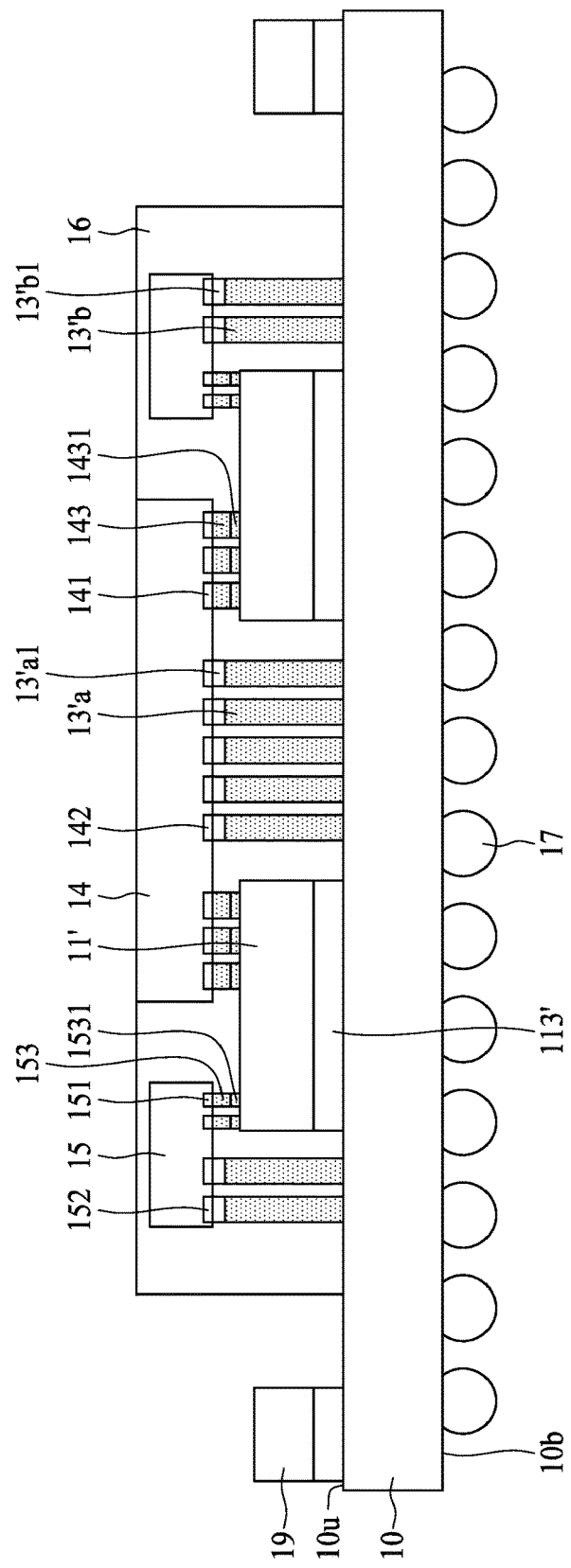
FIG. 8E illustrates a method of manufacturing a semiconductor device package according to some embodiments of the present disclosure.

Referring to FIG. 8E, a ring structure 19 is disposed on the upper surface 10u of the substrate 10. Subsequently, a solder ball 17 is disposed on the lower surface 10b of the substrate 10. The ring structure 19 provides a function to prevent from a warpage issue. In some embodiments, the ring structure 19 may be omitted. Subsequently, a singulation operation may be performed.

FIG. 9A through FIG. 9I illustrate some embodiments of a method of manufacturing the semiconductor device package 2 according to some embodiments of the present disclosure.

Figure 9A:
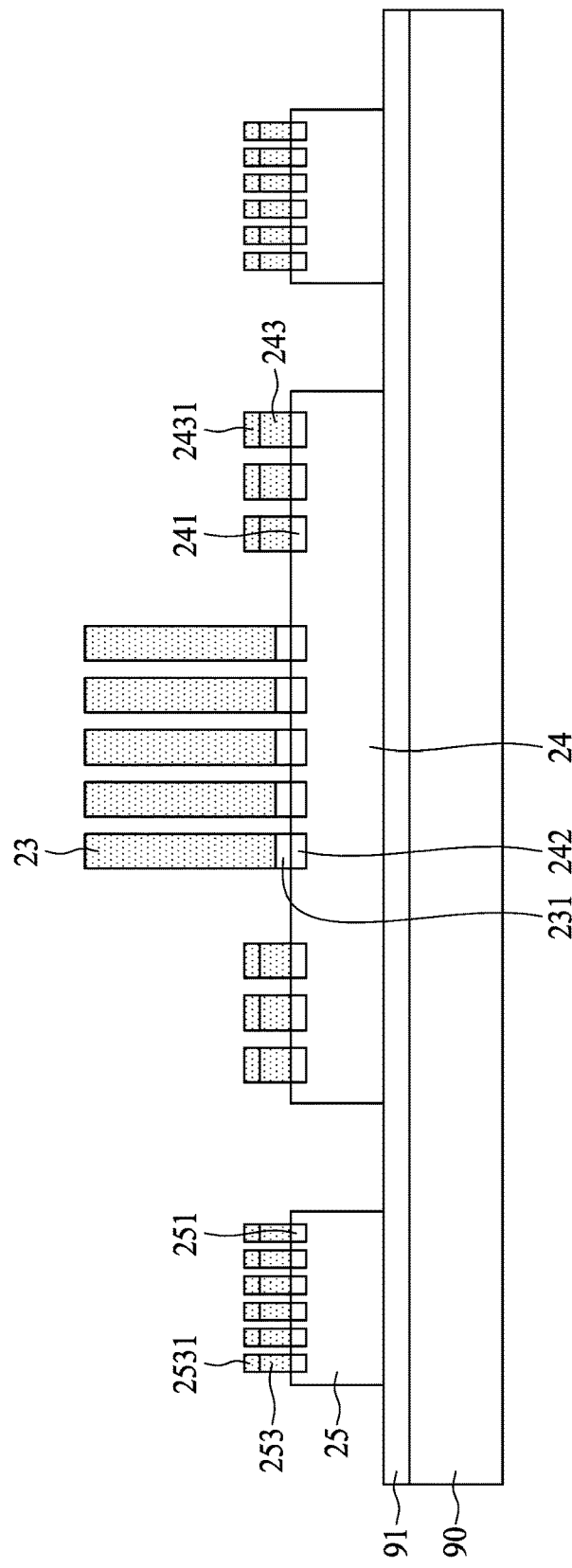
FIG. 9A illustrates a method of manufacturing a semiconductor device package according to some embodiments of the present disclosure.

Referring to FIG. 9A, a method for manufacturing the semiconductor device package 2 includes providing a carrier 90 with an adhesive 91. A semiconductor device 24 is disposed on the carrier 90 via the adhesive 91. The semiconductor device 24 includes a conductive pad 241 and a conductive pad 242. The conductive pad 242 may be a grounding pad. A conductive structure 243 is disposed on the conductive pad 241. The conductive structure 243 may include a solder joint 2431. In some embodiments, the semiconductor device 24 may include an application-specific integrated circuit (ASIC), a controller, a processor or other electronic component or semiconductor device.

A conductive pillar 23 is disposed on an active region of the semiconductor device 24. The conductive pillar 23 may be used as a grounding path or a power path. An aspect ratio of the conductive pillar 23 is greater than 7. A size (e.g. a height, a width, or a diameter) of the conductive pillar 23 may be adjusted based on a desired design. The conductive pillar 23 may be a pre-formed solid pillar/post. The conductive pillar 23 may include a solder joint 231.

A semiconductor device 25 is disposed on the carrier 90 via the adhesive 91. The semiconductor device 25 includes a conductive pad 251. A conductive structure 253 is disposed on the conductive pad 251. The conductive structure 253 may include a solder joint 2531. In some embodiments, the semiconductor device 25 may be a high bandwidth memory (HBM).

Figure 9B:
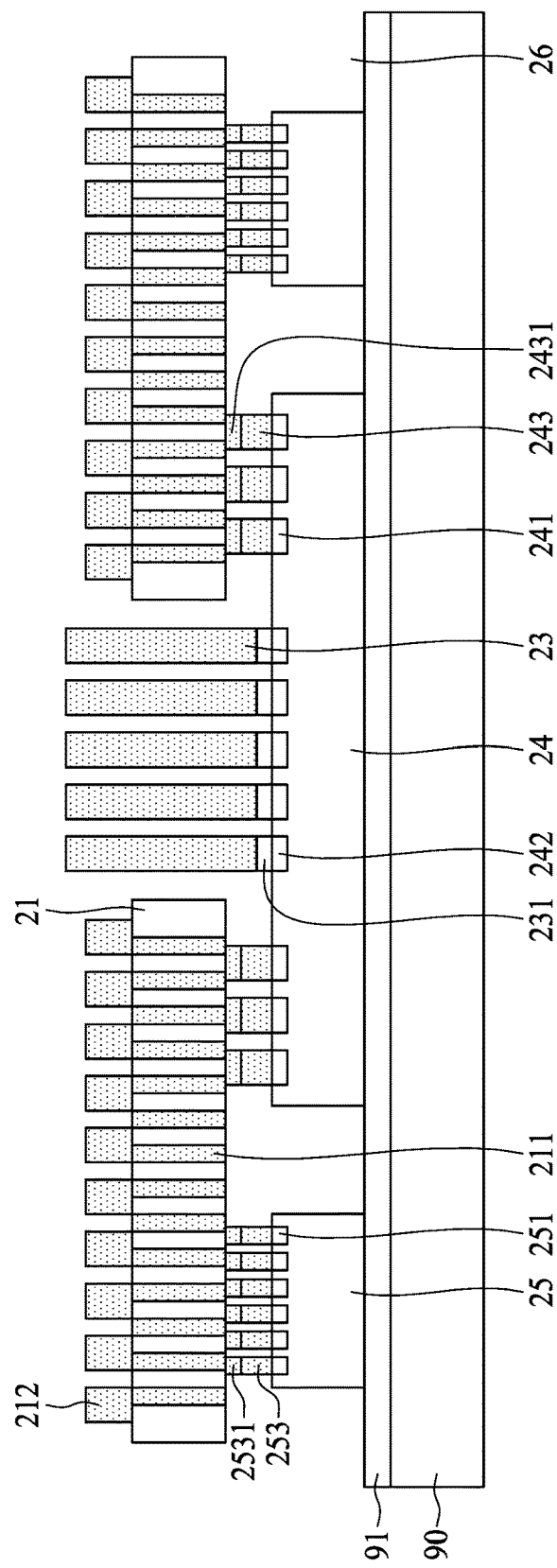
FIG. 9B illustrates a method of manufacturing a semiconductor device package according to some embodiments of the present disclosure.

Referring to FIG. 9B, an interposer 21 (e.g., a through silicon via (TSV) interposer) is disposed on the active region of the semiconductor device 24. The interposer 21 is electrically connected to the semiconductor device 24 via the conductive pad 241. The interposer 21 is disposed on an active region of the semiconductor device 25. The interposer 21 is electrically connected to the semiconductor device 25 via the conductive pad 251. The semiconductor device 24 and the semiconductor device 25 communicate with each other with the interposer 21. The interposers 21 surround the conductive pillar 23. The interposer 21 includes a conductive via 211 and an electrical terminal 212. A size (e.g. a height, a width, or a diameter) of the conductive via 211 is less than the size of the conductive pillar 23.

Figure 9C:
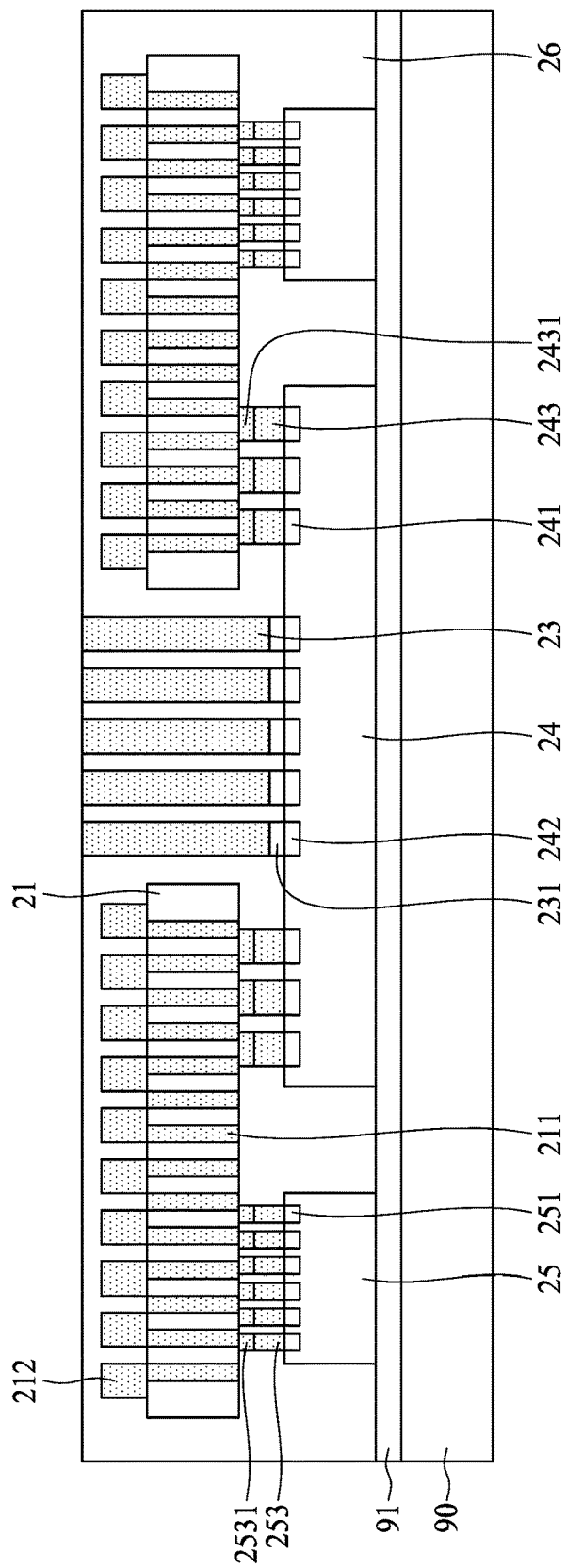
FIG. 9C illustrates a method of manufacturing a semiconductor device package according to some embodiments of the present disclosure.

Referring to FIG. 9C, an encapsulant 26 is provided on the carrier 90 and the adhesive 91 to encapsulate the interposer 21, the conductive pillar 23, the semiconductor device 24, and the semiconductor device 25. The encapsulant 26 surrounds the interposer 21 and the conductive pillar 23.

Since the interposer 21, the conductive pillar 23, the semiconductor device 24, and the semiconductor device 25 are molded in an inverted form, there is no void in the encapsulant 26.

Figure 9D:
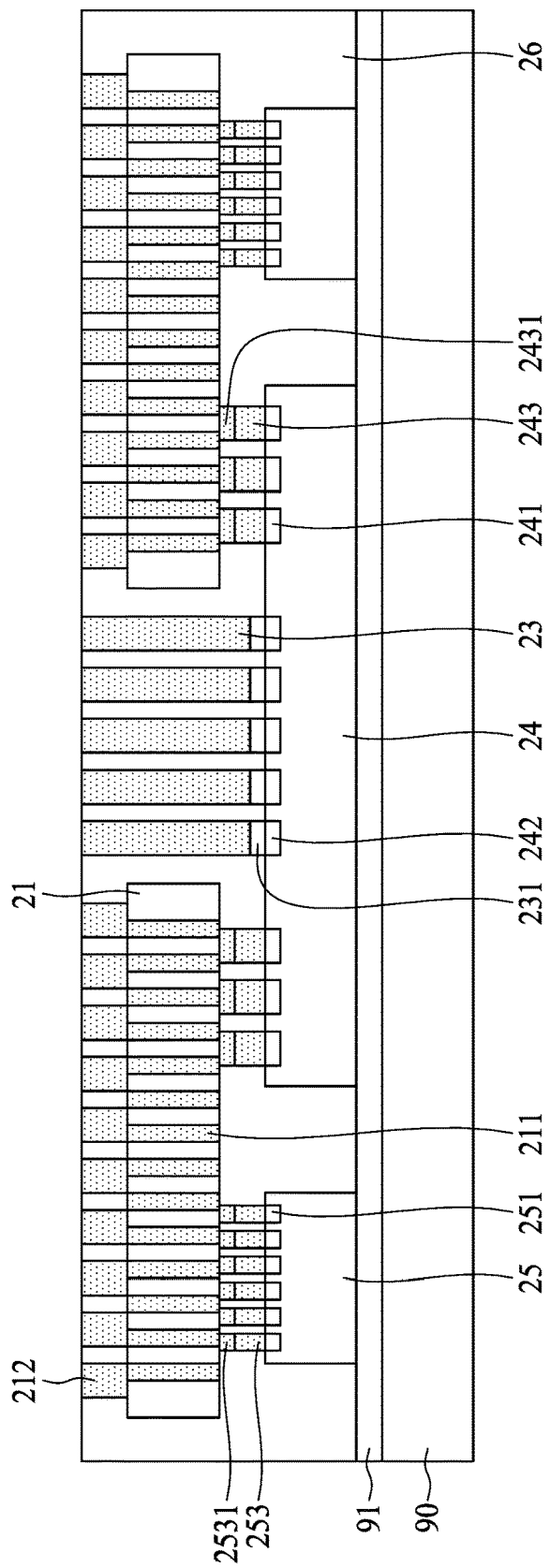
FIG. 9D illustrates a method of manufacturing a semiconductor device package according to some embodiments of the present disclosure.

Referring to FIG. 9D, the encapsulant 26 is grinded by a grinding operation to expose the electrical terminal 212 of the interposer 21 and the conductive pillar 23. The electrical terminal 212 of the interposer 21 and the conductive pillar 23 may be grinded during the grinding operation. The electrical terminal 212 of the interposer 21 and the conductive pillar 23 are exposed by the encapsulant 26.

Figure 9E:
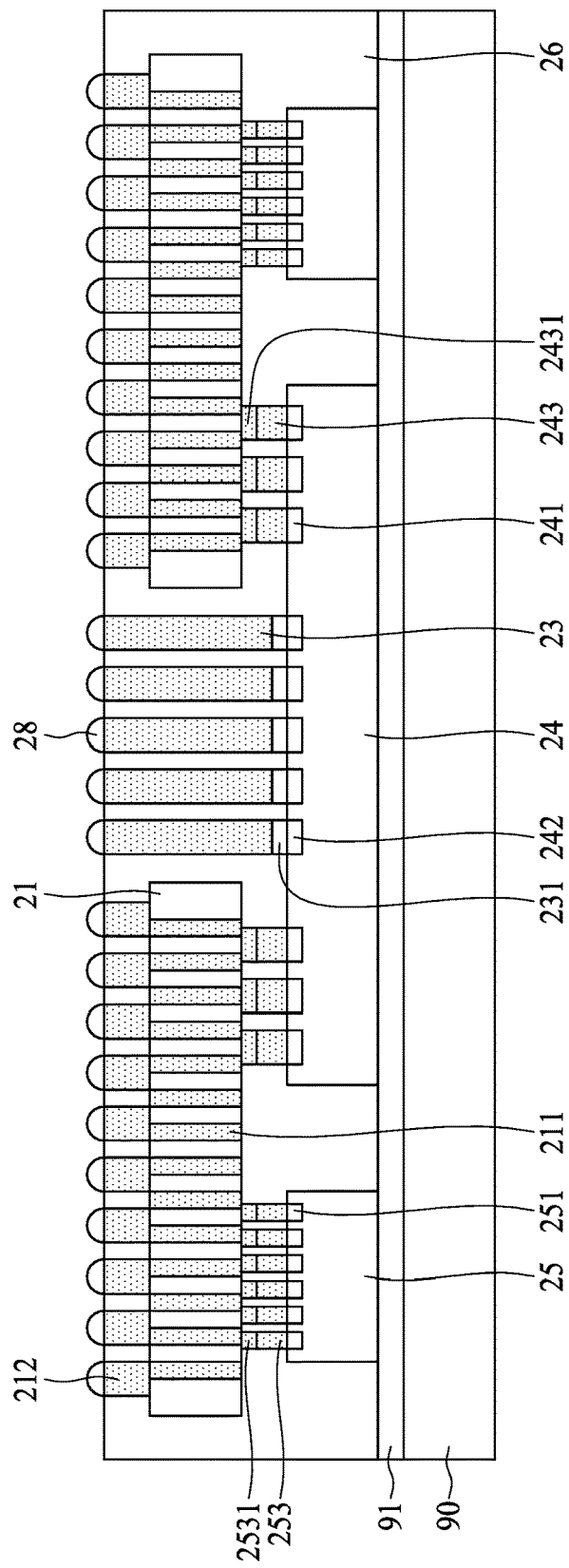
FIG. 9E illustrates a method of manufacturing a semiconductor device package according to some embodiments of the present disclosure.

Referring to FIG. 9E, an electrical connection 28 is disposed on the encapsulant 26. The electrical connection 28 is electrically connected to the electrical terminal 212 of the interposer 21. The electrical connection 28 is electrically connected to the conductive pillar 23. The electrical connection 28 may be a bump.

Figure 9F:
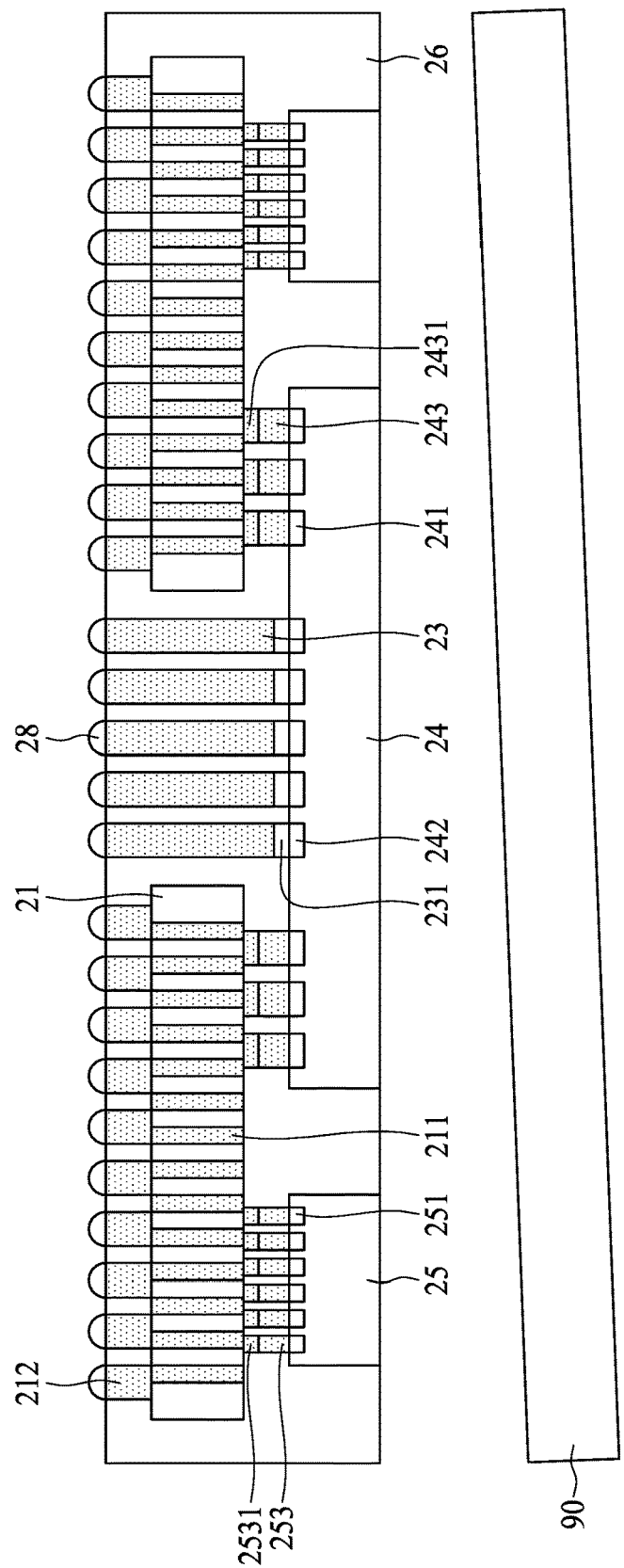
FIG. 9F illustrates a method of manufacturing a semiconductor device package according to some embodiments of the present disclosure.

Referring to FIG. 9F, the carrier 90 and the adhesive 91 are removed. An upper surface of the semiconductor device 24 is exposed by the encapsulant 26.

Figure 9G:
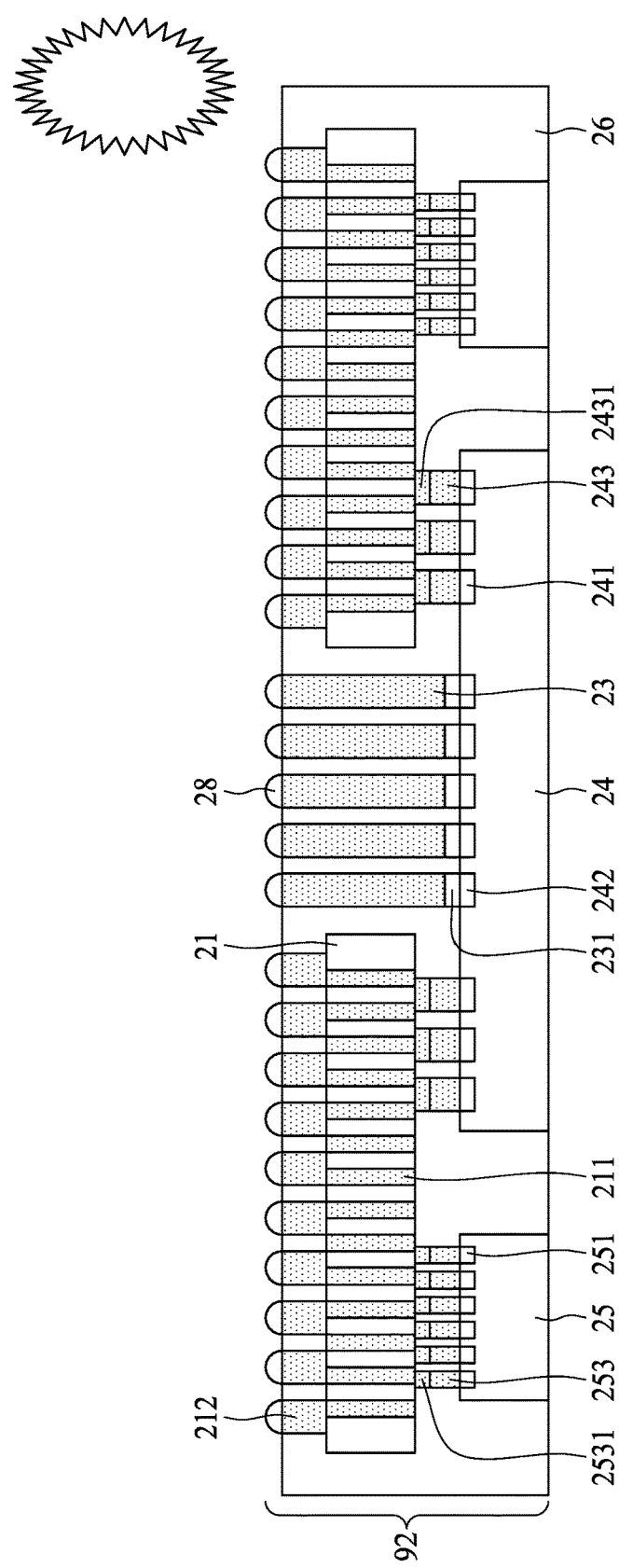
FIG. 9G illustrates a method of manufacturing a semiconductor device package according to some embodiments of the present disclosure.

Referring to FIG. 9G, a singulation operation is performed to form a sub module 92. The sub module 92 includes the interposer 21, the conductive pillar 23, the semiconductor device 24, the semiconductor device 25, the encapsulant 26 and, the electrical connection 28.

Figure 9H:
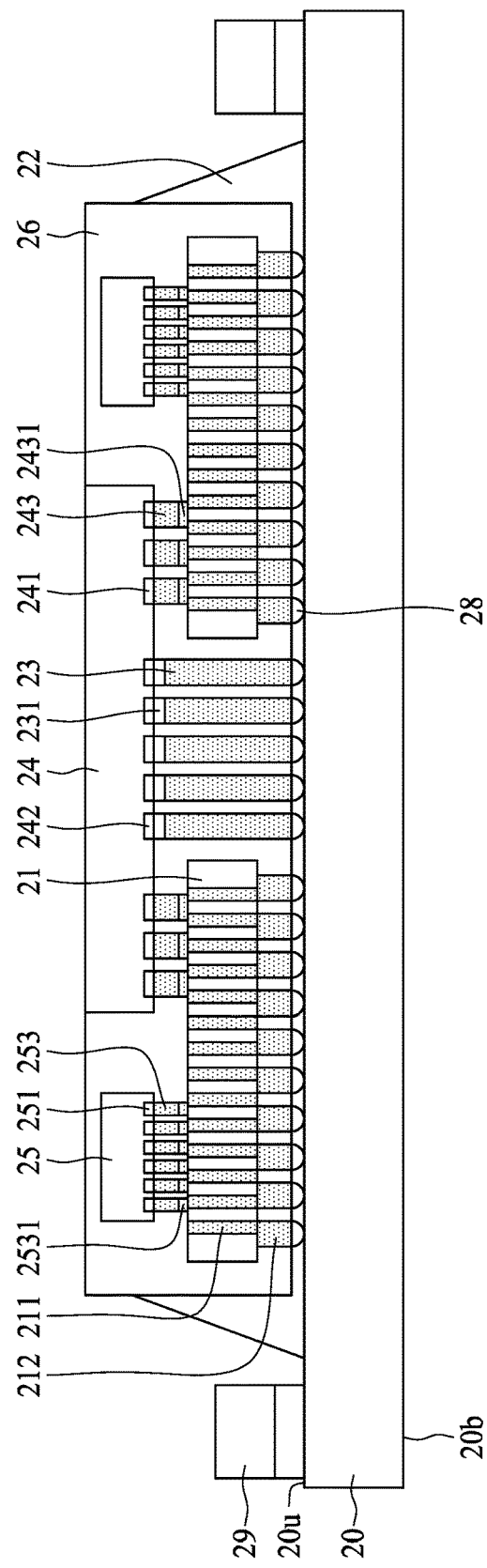
FIG. 9H illustrates a method of manufacturing a semiconductor device package according to some embodiments of the present disclosure.

Referring to FIG. 9H, the sub module 92 is disposed on an upper surface 20u of a substrate 20. The sub module 92 is electrically connected to the substrate 20. The semiconductor device 24 is electrically connected to the substrate 20 via the interposer 21. The semiconductor device 24 is electrically connected to the substrate 20 via the conductive pillar 23. The semiconductor device 25 is electrically connected to the substrate 20 via the interposer 21.

Figure 9I:
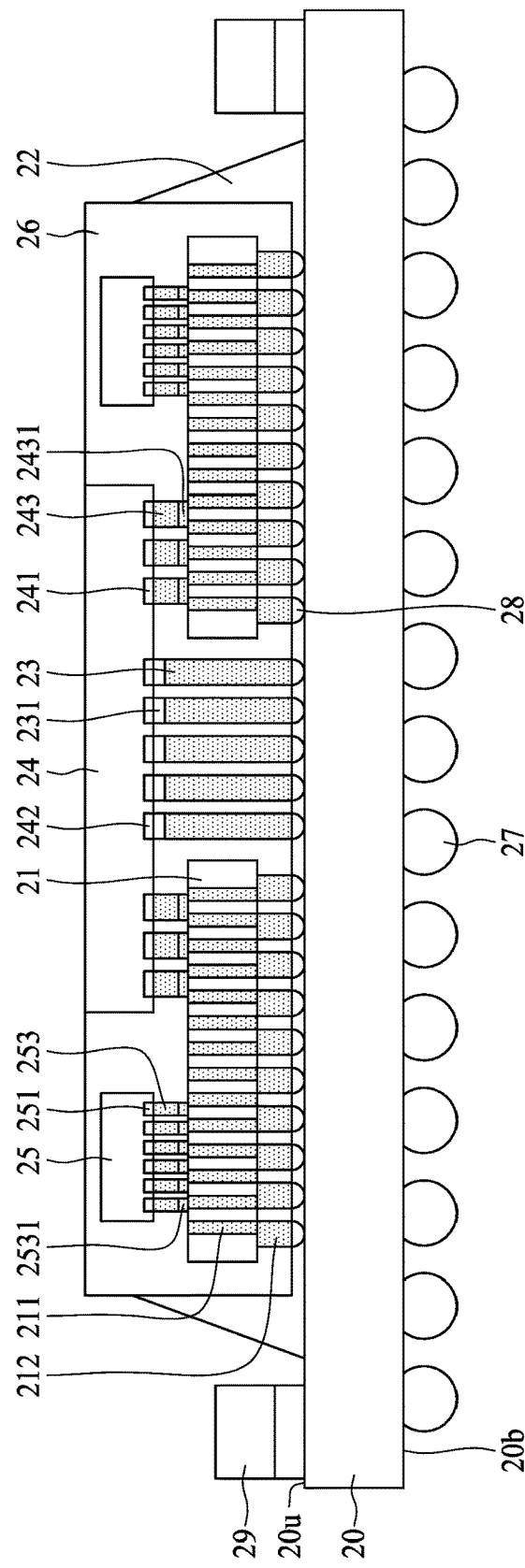
FIG. 9I illustrates a method of manufacturing a semiconductor device package according to some embodiments of the present disclosure.

Referring to FIG. 9I, an underfill 22 is disposed between the substrate 20 and the encapsulant 26. The electrical connection 28 is surrounded by the underfill 22. The underfill 22 surrounds the encapsulant 26. Then, a ring structure 29 is disposed on the upper surface 20u of the substrate 20. The ring structure 29 surrounds the encapsulant 26 and the interposer 21.

Subsequently, a solder ball 27 is disposed on a lower surface 20b of the substrate 20. The ring structure 29 provides a function to prevent from a warpage issue. In some embodiments, the ring structure 29 may be omitted.

In some embodiments, there is a risk of die losing for the fabrication of the semiconductor device package 2. Since the interposer 21, the semiconductor device 24, and the semiconductor device 25 are molded prior to providing the substrate 20, the molded semiconductor devices 24 and 25 would be scrapped if an electrical connection between the interposer 21 and the molded semiconductor devices 24 and 25 is poor.

FIG. 10A through FIG. 10H illustrate some embodiments of a method of manufacturing the semiconductor device package 2' according to some embodiments of the present disclosure.

Figure 10A:
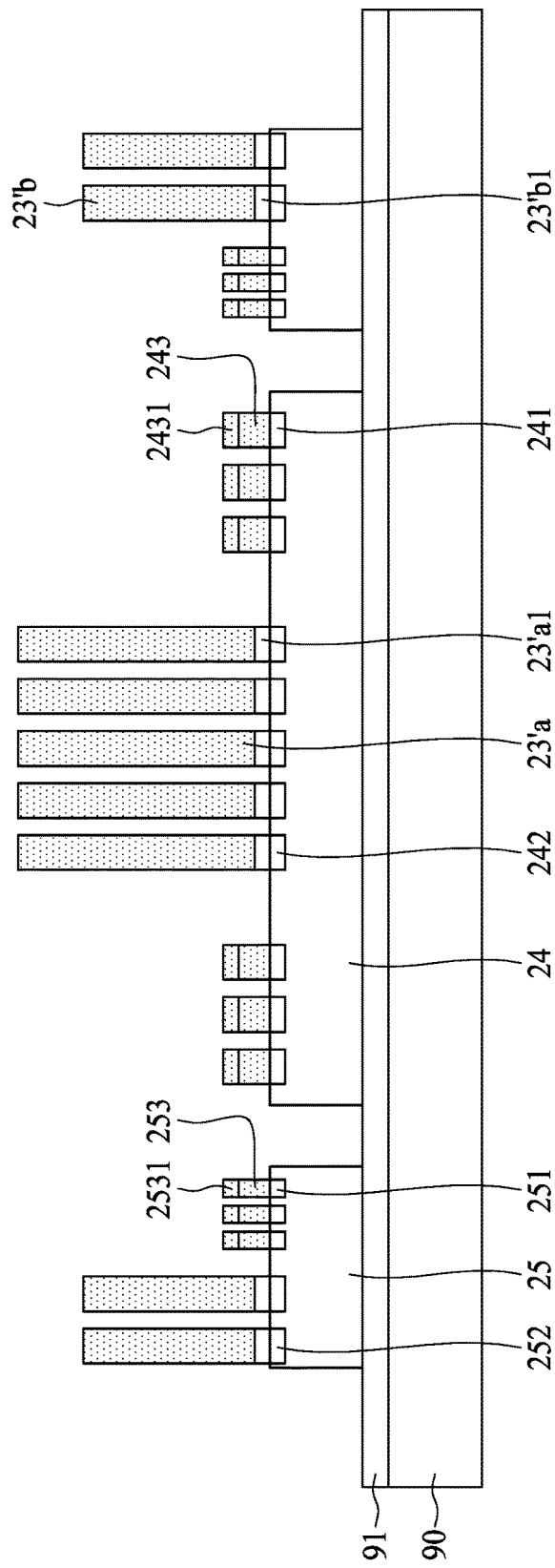
FIG. 10A illustrates a method of manufacturing a semiconductor device package according to some embodiments of the present disclosure.

Referring to FIG. 10A, a method for manufacturing the semiconductor device package 2' includes providing a carrier 90 with an adhesive 91. A semiconductor device 24 is disposed on the carrier 90 via the adhesive 91. The semiconductor device 24 includes a conductive pad 241 and a conductive pad 242. A conductive structure 243 is disposed on the conductive pad 241. The conductive structure 243 may include a solder joint 2431. The conductive pad 242 may be a grounding pad. In some embodiments, the semiconductor device 24 may include an application-specific integrated circuit (ASIC), a controller, a processor or other electronic component or semiconductor device.

A conductive pillar 23'a is disposed on an active region of the semiconductor device 24. The conductive pillar 23'a is adjacent to a central region of the carrier 90. The conductive pillar 23'a may be used as a grounding path or a power path. An aspect ratio of the conductive pillar 23'a is greater than 7. A size (e.g. a height, a width, or a diameter) of the conductive pillar 23'a may be adjusted based on a desired design. The conductive pillar 23'a may be a pre-formed solid pillar/post. The conductive pillar 23'a may include a solder joint 23'a1. The conductive pillar 23'b may include a solder joint 23'b1.

A semiconductor device 25 is disposed on the carrier 90 via the adhesive 91. The semiconductor device 25 includes a conductive pad 251 and a conductive pad 252. A conductive structure 253 is disposed on the conductive pad 251. The conductive structure 253 may include a solder joint 2531. The conductive pad 252 may be a grounding pad. In some embodiments, the semiconductor device 25 may be a high bandwidth memory (HBM).

A conductive pillar 23'b is disposed on an active region of the semiconductor device 25. The conductive pillar 23'b is adjacent to a peripheral region of the carrier 90. The conductive pillar 23'b may be used as a grounding path or a power path. An aspect ratio of the conductive pillar 23'b is greater than 7. A size (e.g. a height, a width, or a diameter) of the conductive pillar 23'b may be adjusted based on a desired design. The size of the conductive pillar 23'a may be the same as the size of conductive pillar 23'b. The size of the conductive pillar 23'a may be different from the size of conductive pillar 23'b. The conductive pillar 23'b may be a pre-formed solid pillar/post.

Figure 10B:
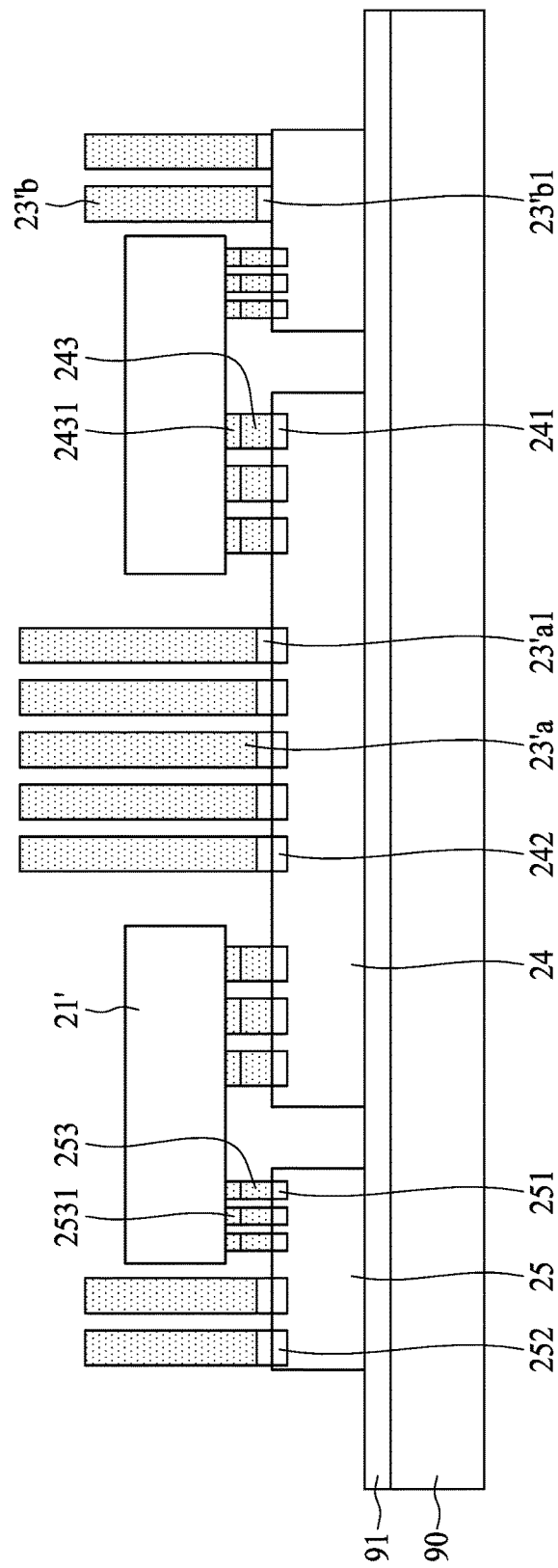
FIG. 10B illustrates a method of manufacturing a semiconductor device package according to some embodiments of the present disclosure.

Referring to FIG. 10B, an interposer 21' is disposed on the active region of the semiconductor device 24. The interposer 21' is electrically connected to the semiconductor device 24 via the conductive pad 241. The interposer 21' is disposed on an active region of the semiconductor device 25. The interposer 21' is electrically connected to the semiconductor device 25 via the conductive pad 251. The semiconductor device 24 and the semiconductor device 25 communicate with each other with the interposer 21'. The interposers 21' surround the conductive pillar 23'a. The interposer 21' may have no conductive via. Since the interposer 21' may have no conductive via, an area of the interposer 21' could be decreased as small as it can. Accordingly, the cost of the semiconductor device package 2' could be decreased.

Figure 10C:
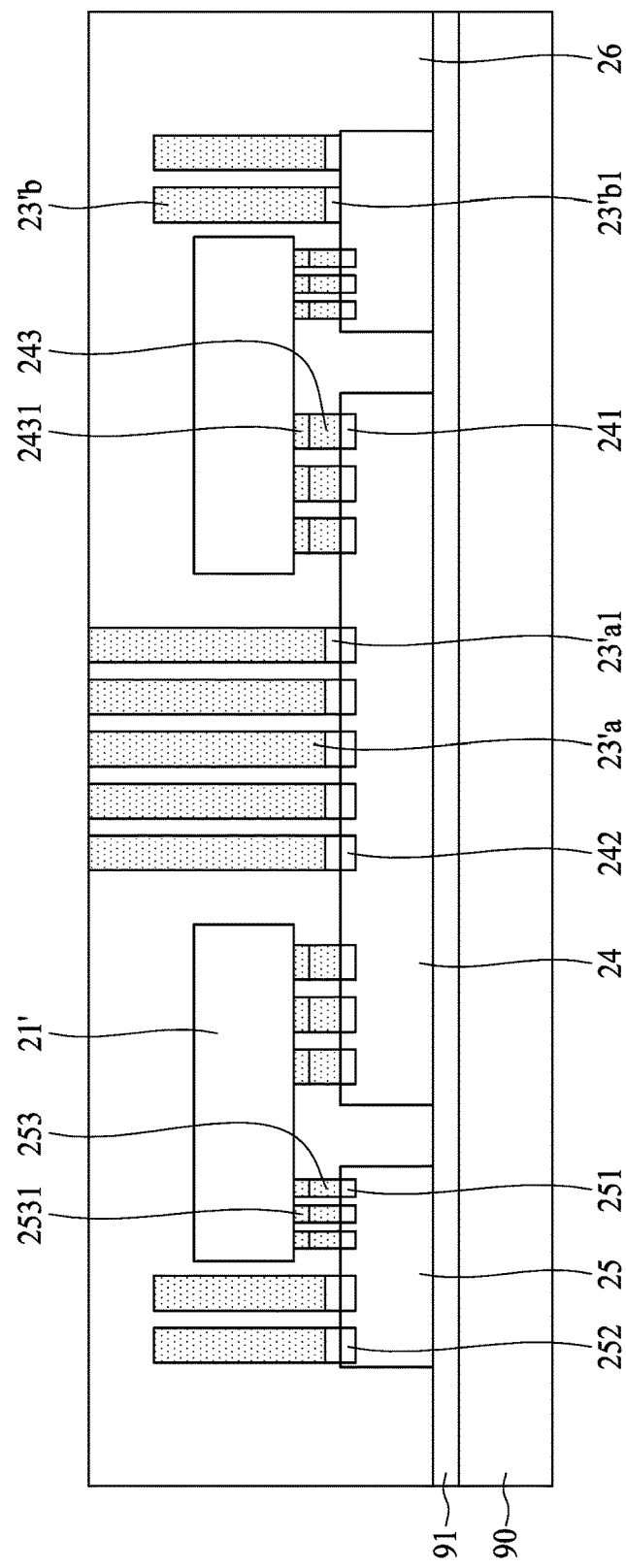
FIG. 10C illustrates a method of manufacturing a semiconductor device package according to some embodiments of the present disclosure.

Referring to FIG. 10C, an encapsulant 26 is provided on the carrier 90 and the adhesive 91 to encapsulate the interposer 21', the conductive pillar 23'a, the conductive pillar 23'b, the semiconductor device 24, and the semiconductor device 25. The encapsulant 26 surrounds the interposer 21', the conductive pillar 23'a, and the conductive pillar 23'b.

Since the interposer 21, the conductive pillar 23'a, the conductive pillar 23'b, the semiconductor device 24, and the semiconductor device 25 are molded in an inverted form, there is no void in the encapsulant 26.

Figure 10D:
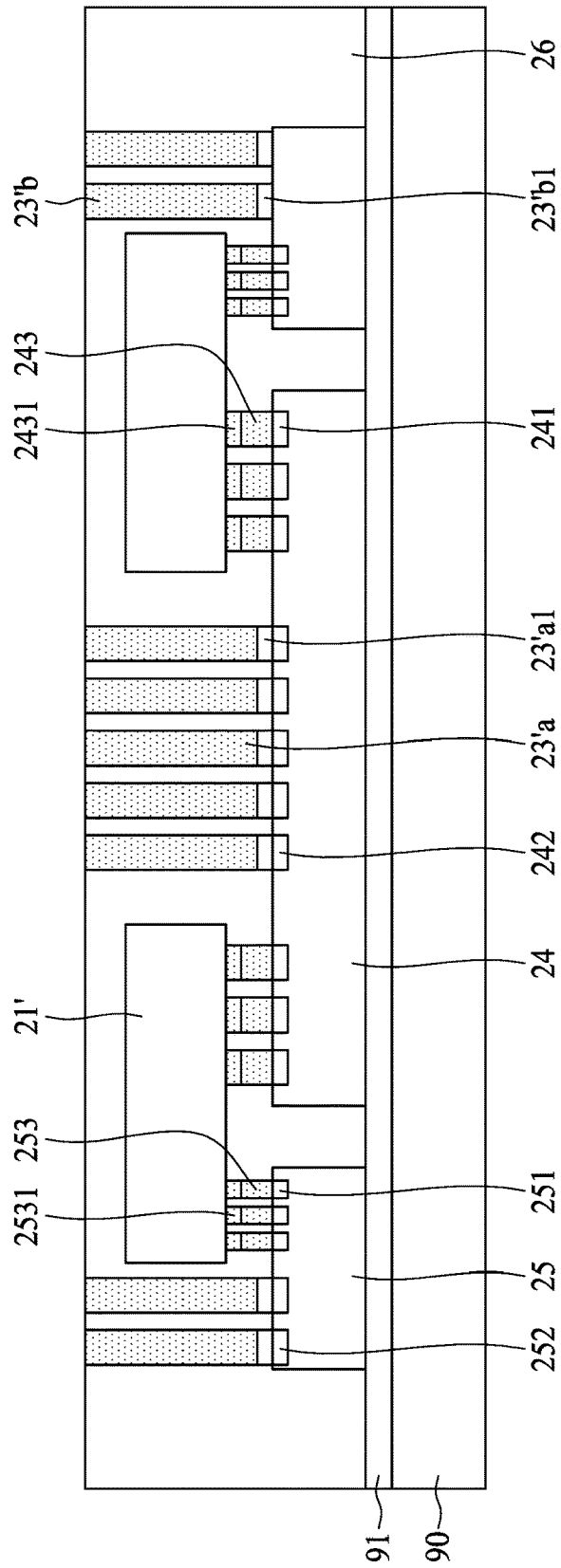
FIG. 10D illustrates a method of manufacturing a semiconductor device package according to some embodiments of the present disclosure.

Referring to FIG. 10D, the encapsulant 26 is grinded by a grinding operation to expose the conductive pillar 23'a and the conductive pillar 23'b. The conductive pillar 23'a and the conductive pillar 23'b may be grinded during the grinding operation. The conductive pillar 23'a and the conductive pillar 23'b are exposed by the encapsulant 26.

After the grinding operation, the size (e.g. a height, a width, or a diameter) of the conductive pillar 23'b may be the same as the size of the conductive pillar 23'a. The size (e.g. a height, a width, or a diameter) of the conductive pillar 23'b may be different from the size of the conductive pillar 23'a.

Figure 10E:
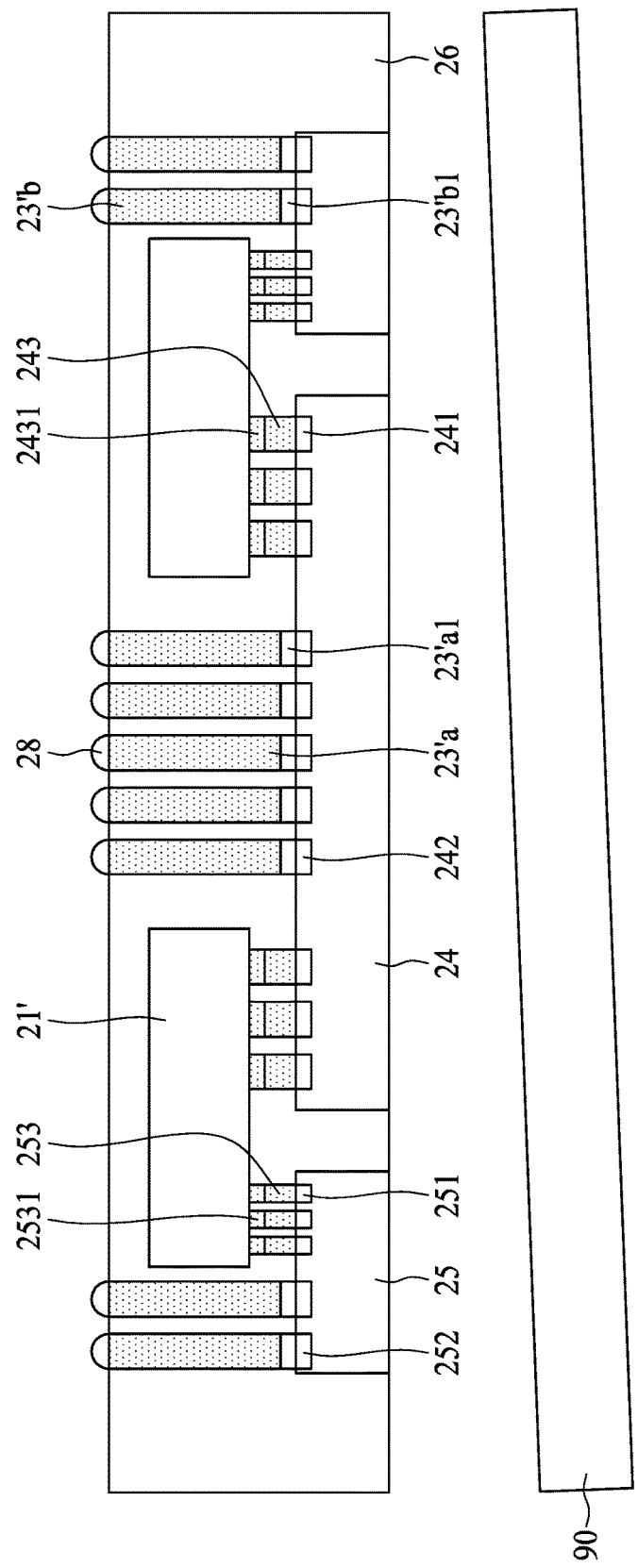
FIG. 10E illustrates a method of manufacturing a semiconductor device package according to some embodiments of the present disclosure.

Referring to FIG. 10E, an electrical connection 28 is disposed on the encapsulant 26. The electrical connection 28 is electrically connected to the conductive pillar 23'a. The electrical connection 28 is electrically connected to the conductive pillar 23'b. The electrical connection 28 may be a bump.

Subsequently, the carrier 90 and the adhesive 91 are removed. An upper surface of the semiconductor device 24 is exposed by the encapsulant 26.

Figure 10F:
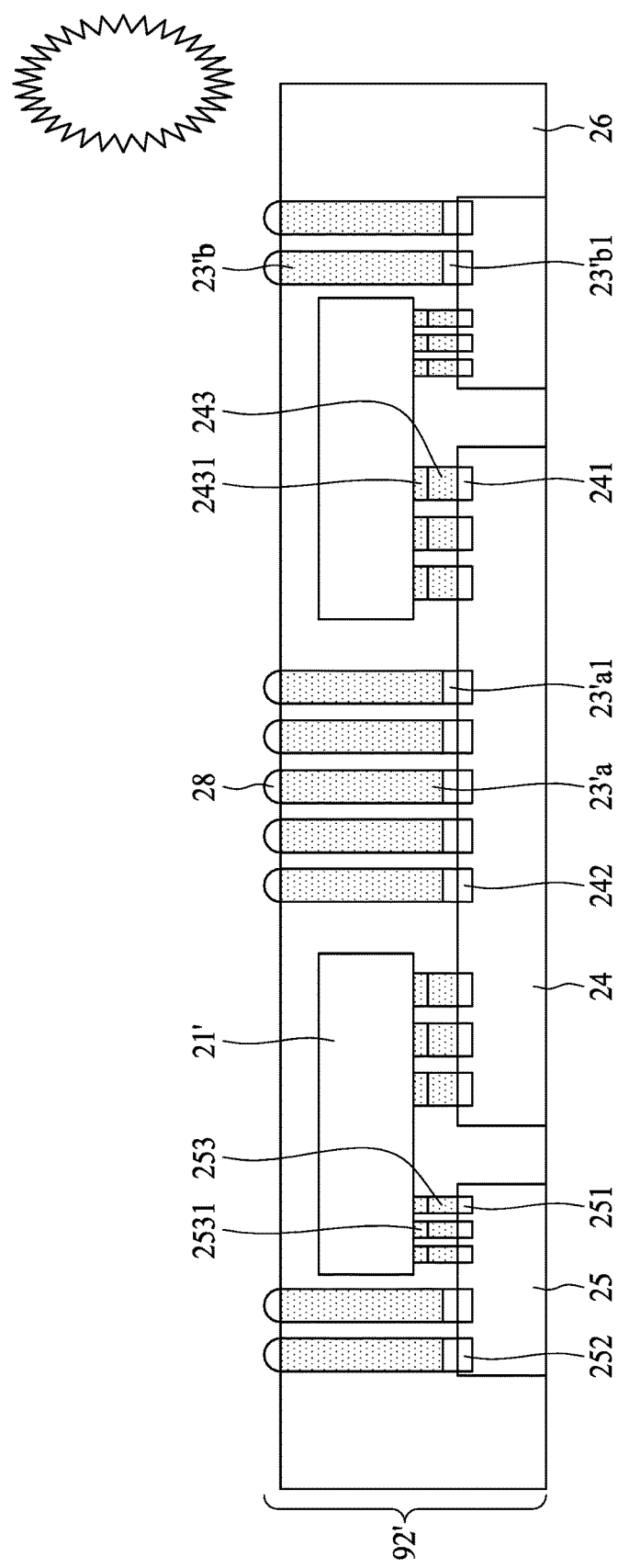
FIG. 10F illustrates a method of manufacturing a semiconductor device package according to some embodiments of the present disclosure.

Referring to FIG. 10F, a singulation operation is performed to form a sub module 92'. The sub module 92' includes the interposer 21', the conductive pillar 23'a, the conductive pillar 23'b, the semiconductor device 24, the semiconductor device 25, the encapsulant 26 and, the electrical connection 28.

Figure 10G:
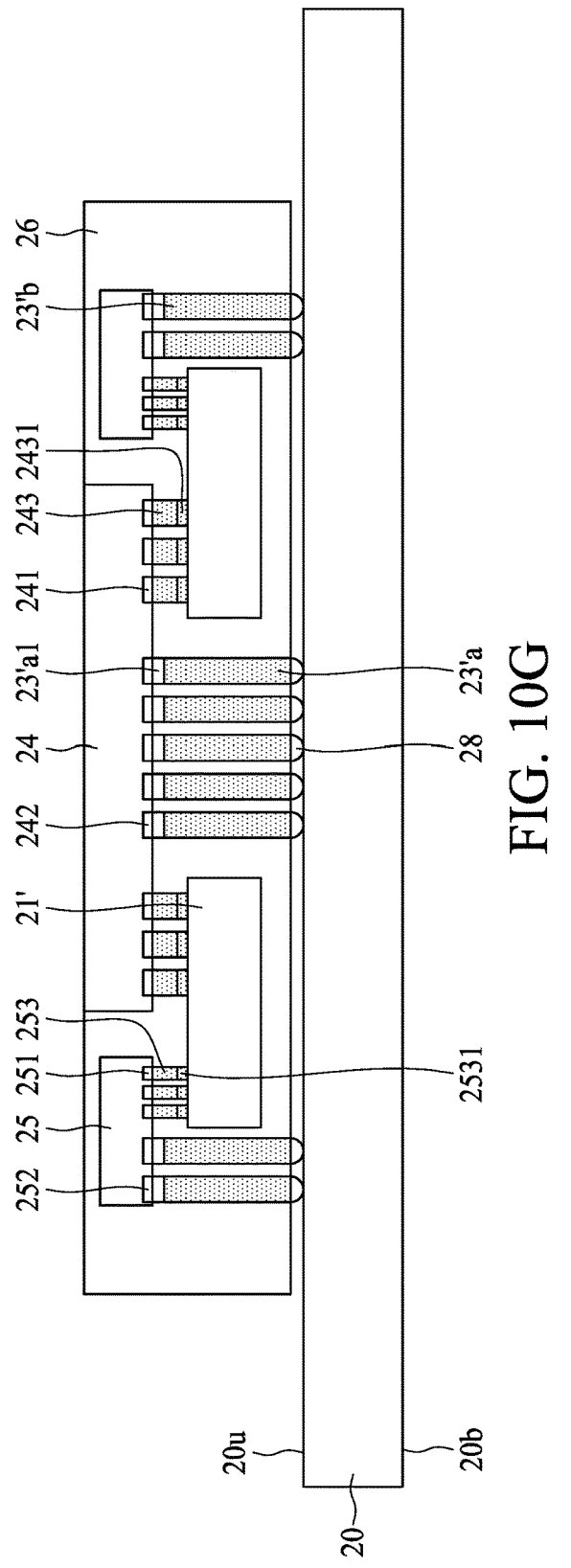
FIG. 10G illustrates a method of manufacturing a semiconductor device package according to some embodiments of the present disclosure.

Referring to FIG. 10G, the sub module 92' is disposed on an upper surface 20u of a substrate 20. The sub module 92' is electrically connected to the substrate 20. The semiconductor device 24 is electrically connected to the substrate 20 via the conductive pillar 23'a. The semiconductor device 25 is electrically connected to the substrate 20 via the conductive pillar 23'b.

Figure 10H:
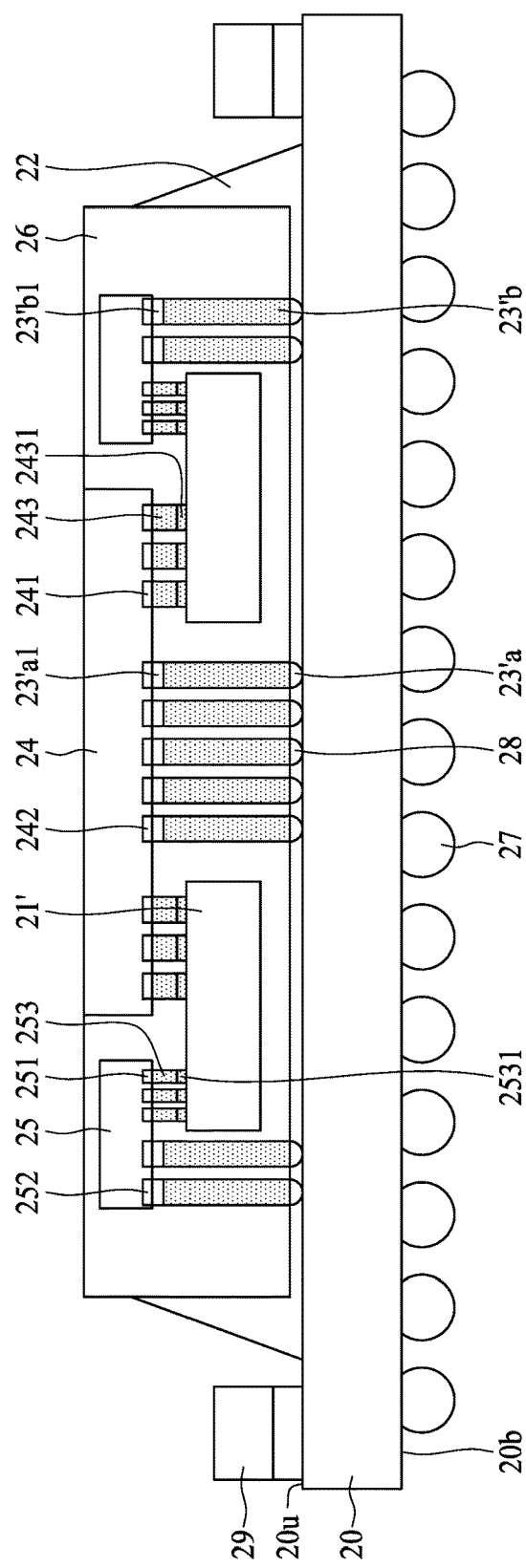
FIG. 10H illustrates a method of manufacturing a semiconductor device package according to some embodiments of the present disclosure.

Referring to FIG. 10H, an underfill 22 is disposed between the substrate 20 and the encapsulant 26. The electrical connection 28 is surrounded by the underfill 22. The underfill 22 surrounds the encapsulant 26. A ring structure 29 is disposed on the upper surface 20u of the substrate 20. Then, the ring structure 29 surrounds the encapsulant 26 and the interposer 21'. Subsequently, a solder ball 27 is disposed on a lower surface 20b of the substrate 20. The ring structure 29 provides a function to prevent from a warpage issue. In some embodiments, the ring structure 29 may be omitted.

In some embodiments, there is a risk of die losing for the fabrication of the semiconductor device package 2'. Since the interposer 21', the semiconductor device 24, and the semiconductor device 25 are molded prior to providing the substrate 20, the molded semiconductor devices 24 and 25 would be scrapped if an electrical connection between the interposer 21' and the molded semiconductor devices 24 and 25 is poor.

FIG. 11A through FIG. 11H illustrate some embodiments of a method of manufacturing the semiconductor device package 3 according to some embodiments of the present disclosure.

Referring to FIG. 11A, a method for manufacturing the semiconductor device package 3 includes providing a substrate 30 with an upper surface 30u and a lower surface 30b. A conductive pillar 33 is disposed on the upper surface 30u of the substrate 30. The conductive pillar 33 is electrically connected to the substrate 30. The conductive pillar 33 may be a pre-formed solid pillar/post. A size (e.g. a height, a width, or a diameter) of the conductive pillar 33 may be adjusted. An aspect ratio of the conductive pillar 33 is greater than 7. The conductive pillar 33 may be used as a grounding path or a power path. The width of the conductive pillar 33 is sufficiently large to prevent from a short issue resulting from a large current.

Figure 11B:
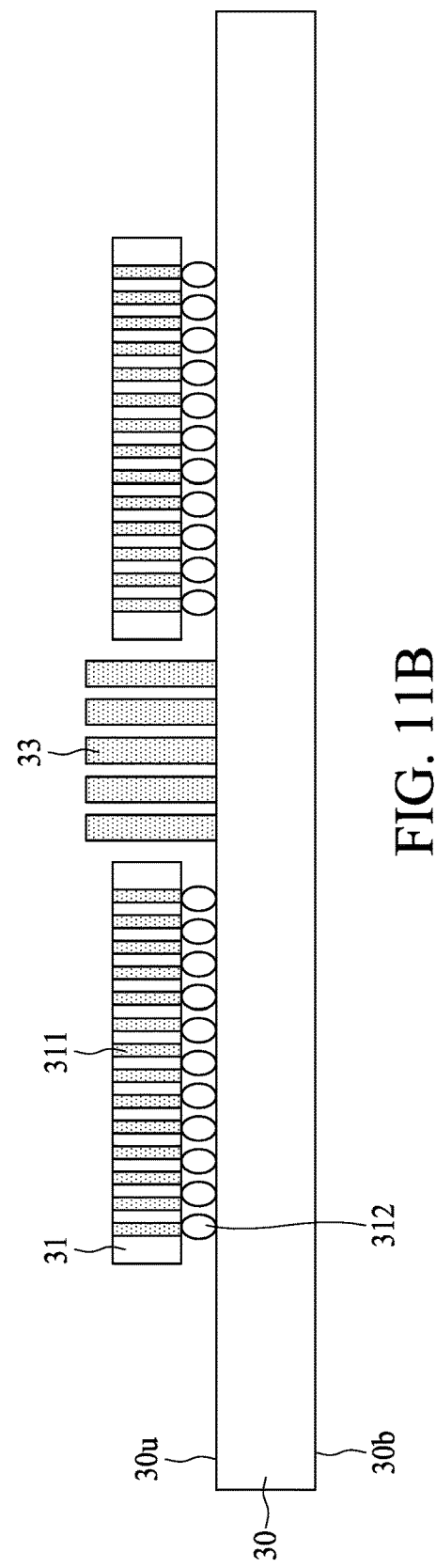
FIG. 11B illustrates a method of manufacturing a semiconductor device package according to some embodiments of the present disclosure.

Referring to FIG. 11B, an interposer 31 (e.g., a through silicon via (TSV) interposer) with a conductive via 311 and an electrical terminal 312 is disposed on the upper surface 30u of the substrate 30. The conductive pillars 33 are surrounded by the interposers 31.

The size of the conductive pillar 33 is greater than a size of the conductive via 311. The width of the conductive pillar 33 is greater than a width of the conductive via 311. A height of the conductive pillar 33 is greater than a height of the conductive via 311. There is no grounding conductive vias (which has a relatively large width) in the interposer 31. Since the size (e.g. a width or a diameter) of the conductive via 311 of the interposer 31 could be sufficiently small, an area of the interposer 31 could be decreased.

Figure 11C:
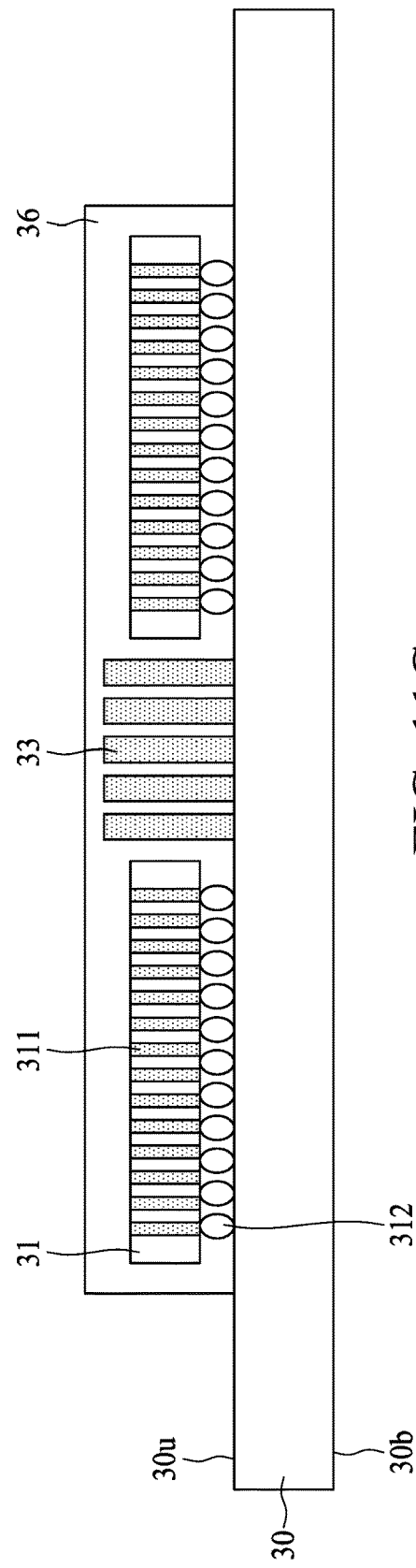
FIG. 11C illustrates a method of manufacturing a semiconductor device package according to some embodiments of the present disclosure.

Referring to FIG. 11C, an encapsulant 36 is disposed on the upper surface 30u of the substrate 30. The encapsulant 36 surrounds the interposer 31 and the conductive pillar 33.

The encapsulant 36 encapsulates the interposer 31 and the conductive pillar 33. The encapsulant 36 has a resin material. The encapsulant 36 has a filler. There is no void in the encapsulant 36.

Figure 11D:
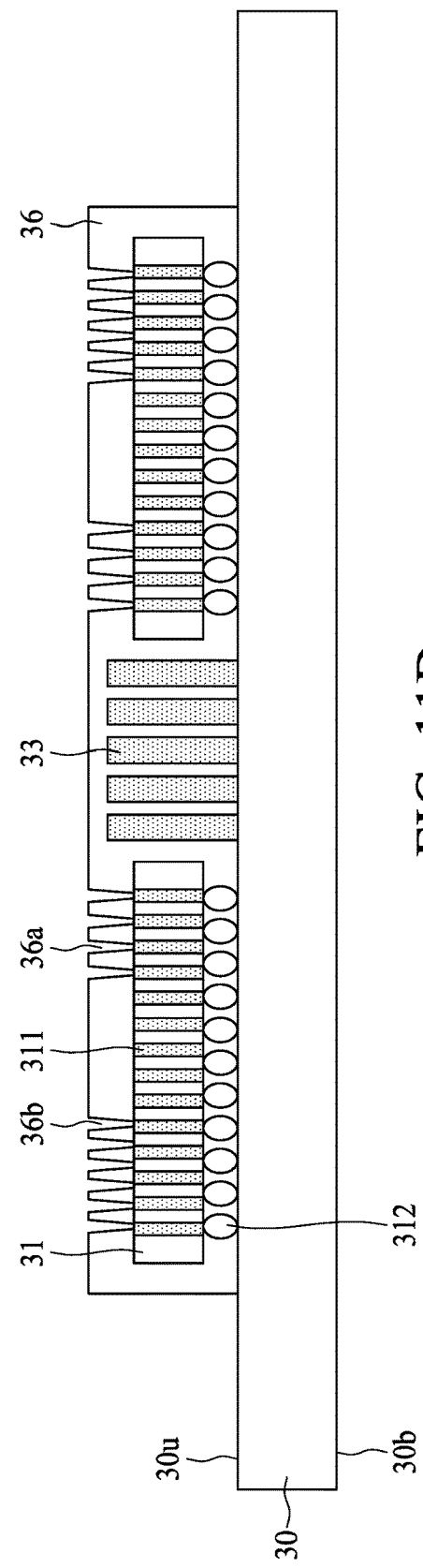
FIG. 11D illustrates a method of manufacturing a semiconductor device package according to some embodiments of the present disclosure.

Referring to FIG. 11D, a via 36a and a via 36b are formed in the encapsulant 36 by a laser drilling operation. A size (e.g. a depth, a width, or a diameter) of the via 36a may be the same as a size of the via 36b. The size of the via 36a may be different from the size of the via 36b.

Figure 11E:
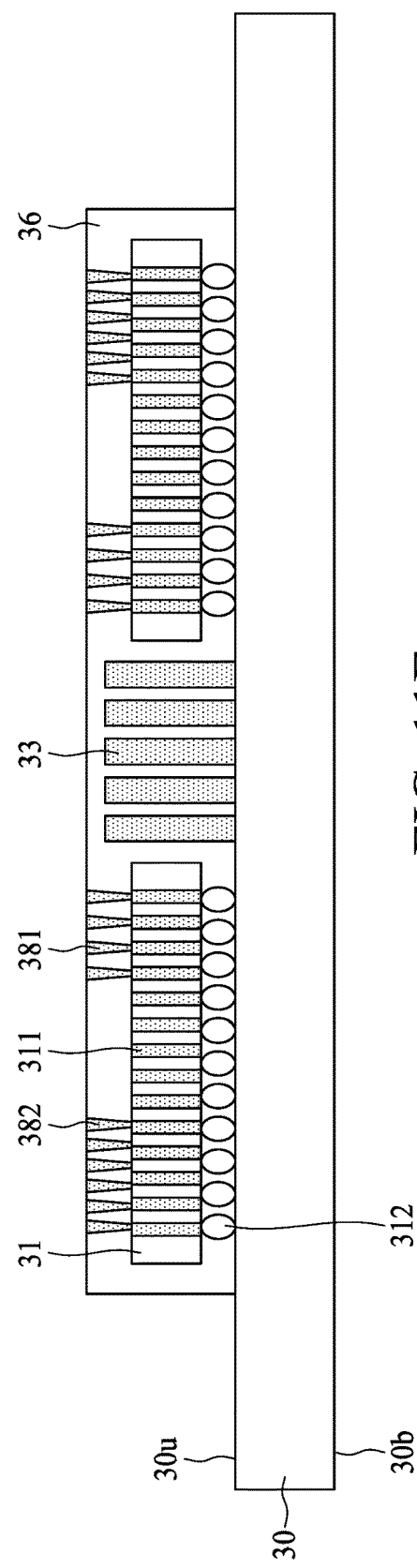
FIG. 11E illustrates a method of manufacturing a semiconductor device package according to some embodiments of the present disclosure.

Referring to FIG. 11E, an interconnection 381 is formed in the via 36a by a metal plating operation. An interconnection 382 is formed in the via 36b by a metal plating operation.

Figure 11F:
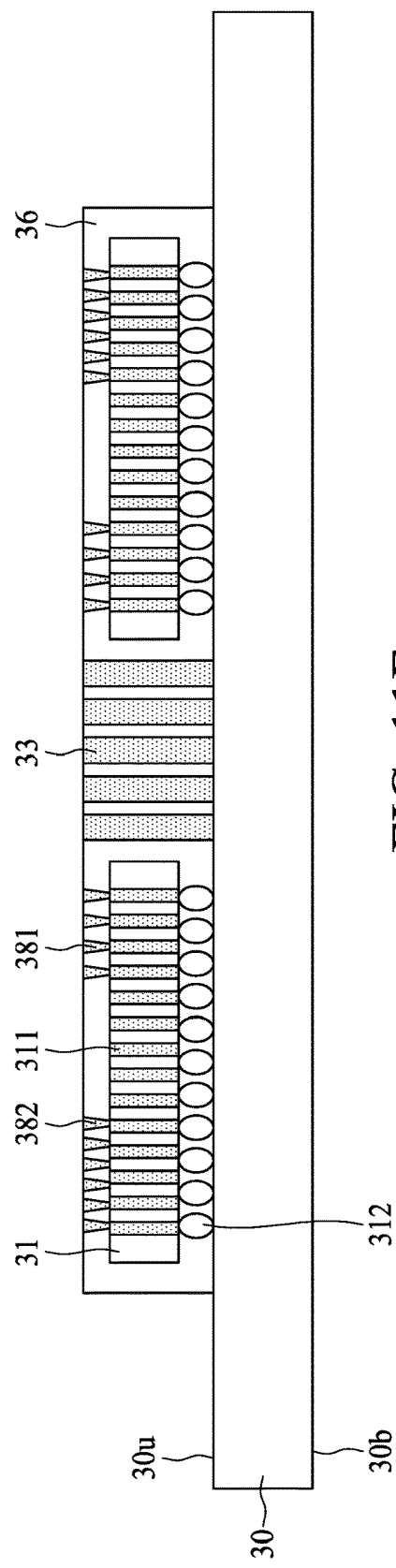
FIG. 11F illustrates a method of manufacturing a semiconductor device package according to some embodiments of the present disclosure.

Referring to FIG. 11F, the encapsulant 36 is grinded by a grinding operation. The interconnection 381 and the interconnection 382 are grinded by the grinding operation.

Figure 11G:
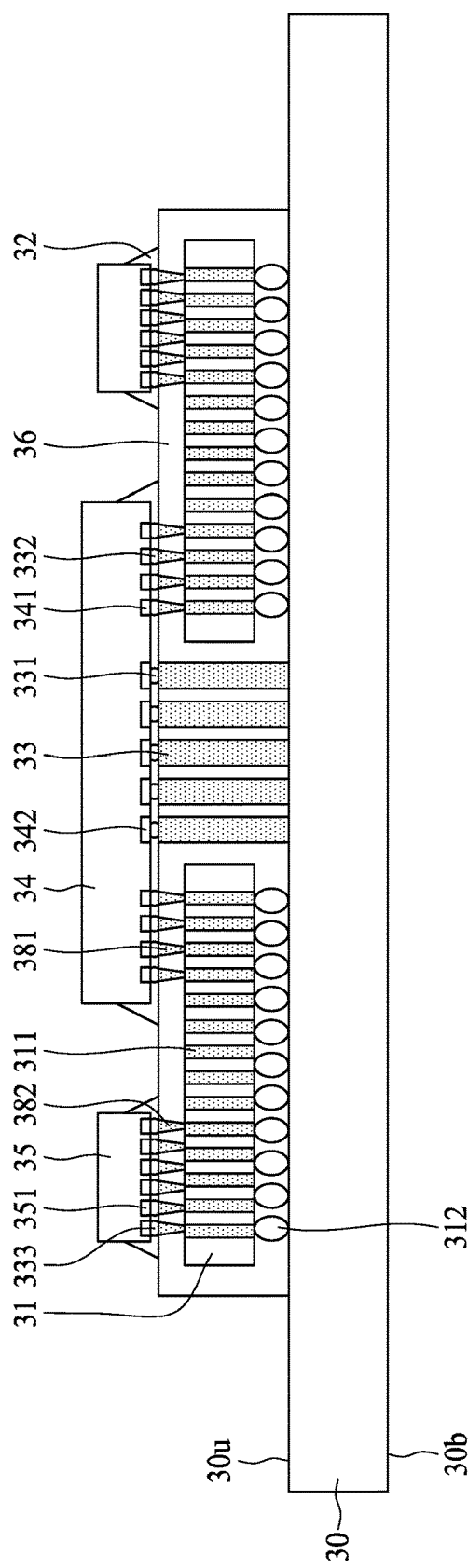
FIG. 11G illustrates a method of manufacturing a semiconductor device package according to some embodiments of the present disclosure.

Referring to FIG. 11G, a semiconductor device 34 is disposed on the interposer 31. The semiconductor device 34 is disposed on the conductive pillar 33. The semiconductor device 34 is disposed on the encapsulant 36. An underfill 32 is disposed between the semiconductor device 34 and the encapsulant 36. The semiconductor device 34 includes a conductive pad 341 and a conductive pad 342. The conductive pad 341 is electrically connected to the conductive via 311 of the interposer 31 via the conductive pad 341 and the interconnection 381. A conductive structure 332 is disposed between the conductive pad 341 and the interconnection 381. The conductive structure 332 electrically connects the conductive pad 341 and the interconnection 381. The conductive pad 342 is electrically connected to the conductive pillar 33. A conductive structure 331 is disposed between the conductive pad 342 and the conductive pillar 33. The conductive structure 331 electrically connects the conductive pad 342 and the conductive pillar 33. The conductive pad 342 may be a grounding pad. The semiconductor device 34 is electrically connected to the substrate 30 via the conductive pillar 33. The semiconductor device 34 is electrically connected to the substrate 30 via the interposer 31. In some embodiments, the semiconductor device 34 may include an application-specific integrated circuit (ASIC), a controller, a processor or other electronic component or semiconductor device. In some embodiments, the conductive structure 331 and the conductive structure 332 may be a solder bump or copper pillar bump.

A semiconductor device 35 is disposed on the interposer 31. The semiconductor device 35 is disposed on the encapsulant 36. The underfill 32 is disposed between the semiconductor device 35 and the encapsulant 36. The semiconductor device 35 includes a conductive pad 351. The conductive pad 351 is electrically connected to the interposer 31 via the interconnection 382. A conductive structure 333 is disposed between the conductive pad 351 and the interconnection 382. The conductive structure 333 electrically connects the conductive pad 351 and the interconnection 382. The semiconductor device 35 is electrically connected to the substrate 30 via the interposer 31. The semiconductor device 34 and the semiconductor device 35 may be communicated with each other via the interposer 31. In some embodiments, the semiconductor device 35 may be a high bandwidth memory (HBM). In some embodiments, the conductive structure 333 and the conductive may be a solder bump or copper pillar bump.

Figure 11H:
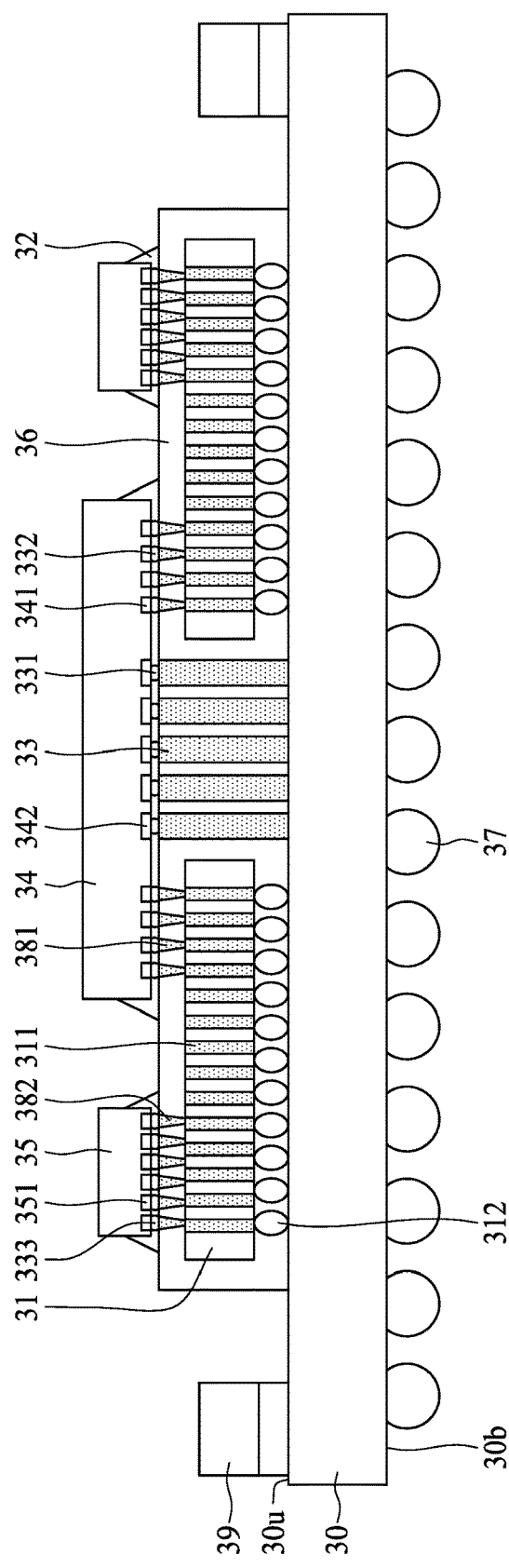
FIG. 11H illustrates a method of manufacturing a semiconductor device package according to some embodiments of the present disclosure.

Referring to FIG. 11H, a ring structure 39 is disposed on the upper surface 10u of the substrate 30. Subsequently, a solder ball 37 is disposed on the lower surface 30b of the substrate 30. The ring structure 39 provides a function to prevent from a warpage issue. In some embodiments, the ring structure 39 may be omitted. Subsequently, a singulation operation may be performed.

FIG. 12A through FIG. 12H illustrate some embodiments of a method of manufacturing the semiconductor device package 3' according to some embodiments of the present disclosure.

Referring to FIG. 12A, a method for manufacturing the semiconductor device package 3' includes providing a substrate 30 with an upper surface 30u and a lower surface 30b. A conductive pillar 33'a is disposed on the upper surface 30u of the substrate 30. The conductive pillar 33'a is electrically connected to the substrate 30. A conductive pillar 33'b is disposed on the upper surface 30u of the substrate 30. The conductive pillar 33'b is electrically connected to the substrate 30. The conductive pillar 33'a is disposed adjacent to a central portion of the substrate 30. The conductive pillar 33'b is disposed adjacent to a peripheral portion of the substrate 30. The conductive pillar 33'a or 33'b may be a pre-formed solid pillar/post.

A size (e.g. a height, a width, or a diameter) of the conductive pillar 33'a or 33'b may be adjusted. The size of the conductive pillar 33'a may be the same as the size of conductive pillar 33'b. The size of the conductive pillar 33'a may be different from the size of conductive pillar 33'b. An aspect ratio of the conductive pillar 33'a or 33'b is greater than 7. The conductive pillar 33'a or 33'b may be used as a grounding path or a power path. The width of the conductive pillar 33'a or 33'b is sufficiently large to prevent from a short issue resulting from a large current.

Figure 12B:
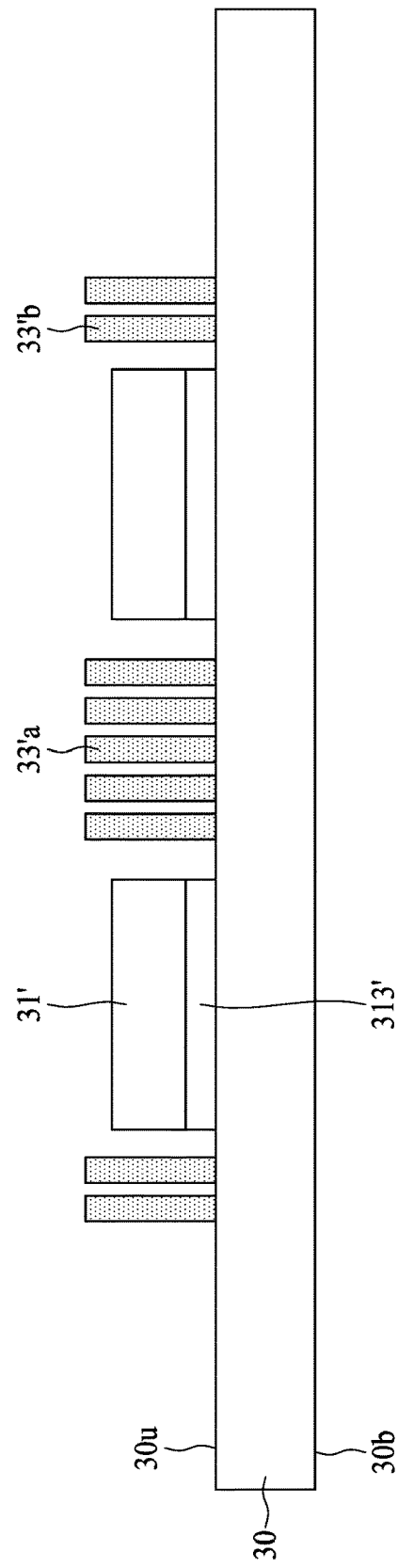
FIG. 12B illustrates a method of manufacturing a semiconductor device package according to some embodiments of the present disclosure.

Referring to FIG. 12B, an interposer 31' is disposed on the upper surface 30u of the substrate 30. The interposer 31' is attached to the substrate 30 via an adhesive 313'. The interposer 31' is disposed between the conductive pillar 33'a and the conductive pillar 33'b. The interposer 31' may have no conductive via. Since the interposer 31' may have no conductive via, an area of the interposer 31' could be decreased as small as it can. Accordingly, the cost of the semiconductor device package 3' could be decreased.

Figure 12C:
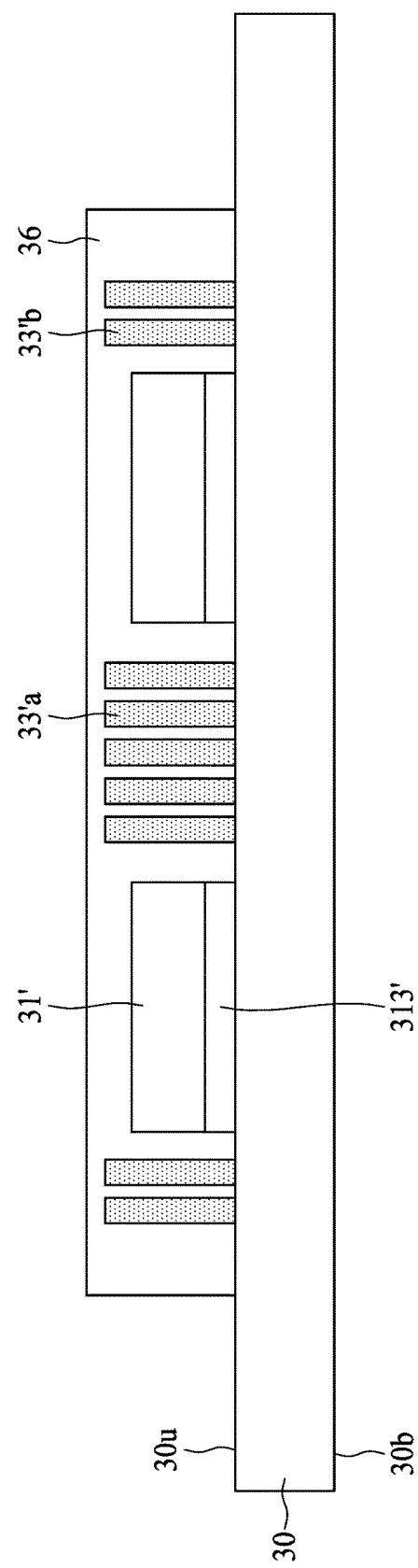
FIG. 12C illustrates a method of manufacturing a semiconductor device package according to some embodiments of the present disclosure.

Referring to FIG. 12C, an encapsulant 36 is disposed on the upper surface 30u of the substrate 30. The encapsulant 36 surrounds the interposer 31', the conductive pillar 33'a, and the conductive pillar 33'b. The encapsulant 36 encapsulates the interposer 31', the conductive pillar 33'a, and the conductive pillar 33'b. The encapsulant 36 has a resin material. The encapsulant 36 has a filler. There is no void in the encapsulant 36.

Figure 12D:
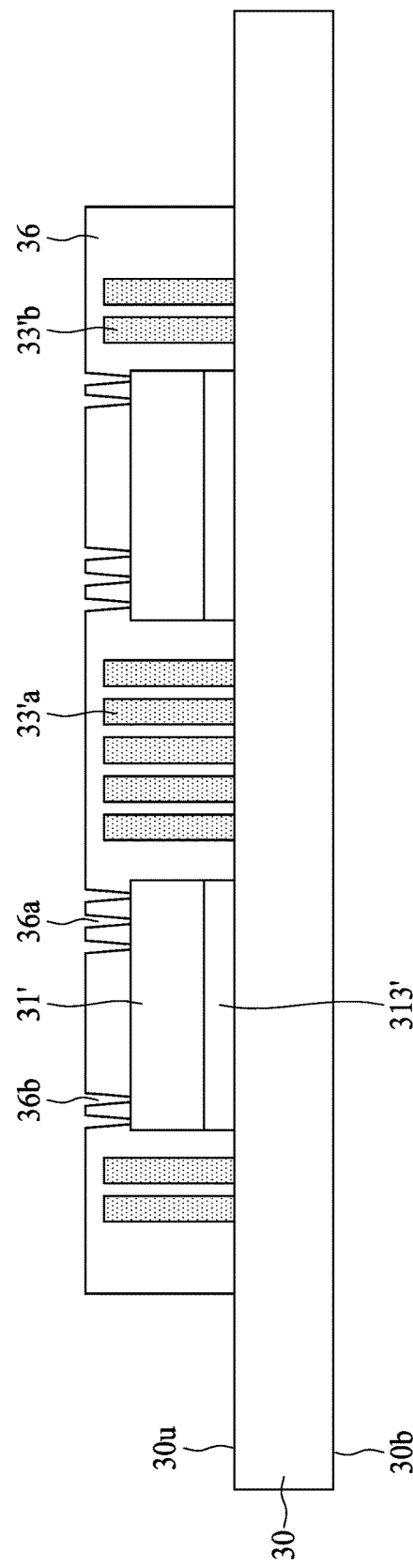
FIG. 12D illustrates a method of manufacturing a semiconductor device package according to some embodiments of the present disclosure.

Referring to FIG. 12D, a via 36a and a via 36b are formed in the encapsulant 36 by a laser drilling operation. A size (e.g. a depth, a width, or a diameter) of the via 36a may be the same as a size of the via 36b. The size of the via 36a may be different from the size of the via 36b.

Figure 12E:
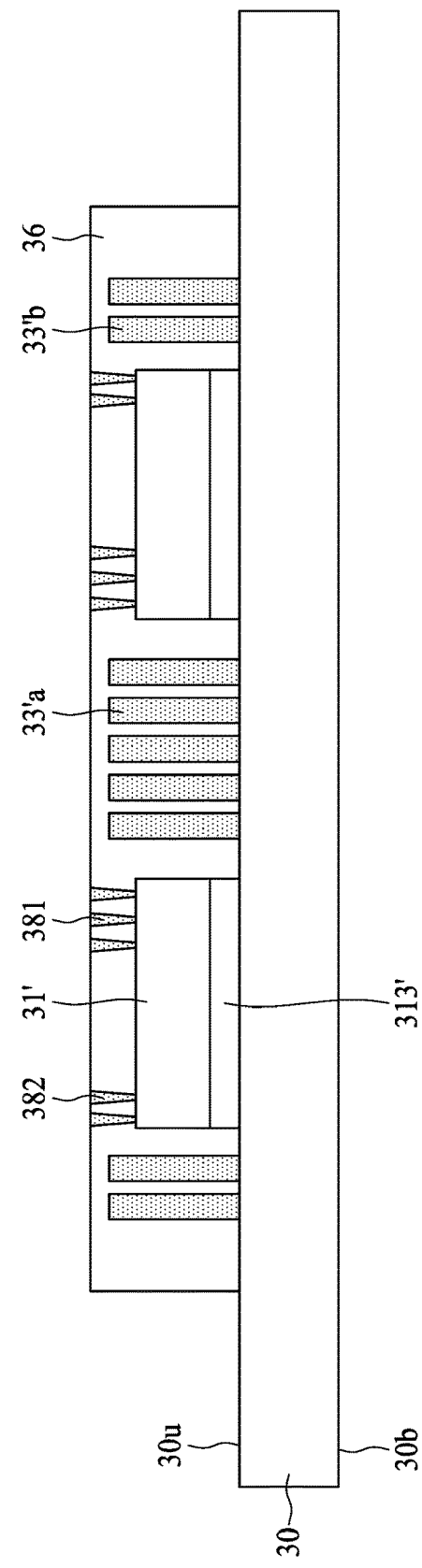
FIG. 12E illustrates a method of manufacturing a semiconductor device package according to some embodiments of the present disclosure.

Referring to FIG. 12E, an interconnection 381 is formed in the via 36a by a metal plating operation. An interconnection 382 is formed in the via 36b by a metal plating operation.

Figure 12F:
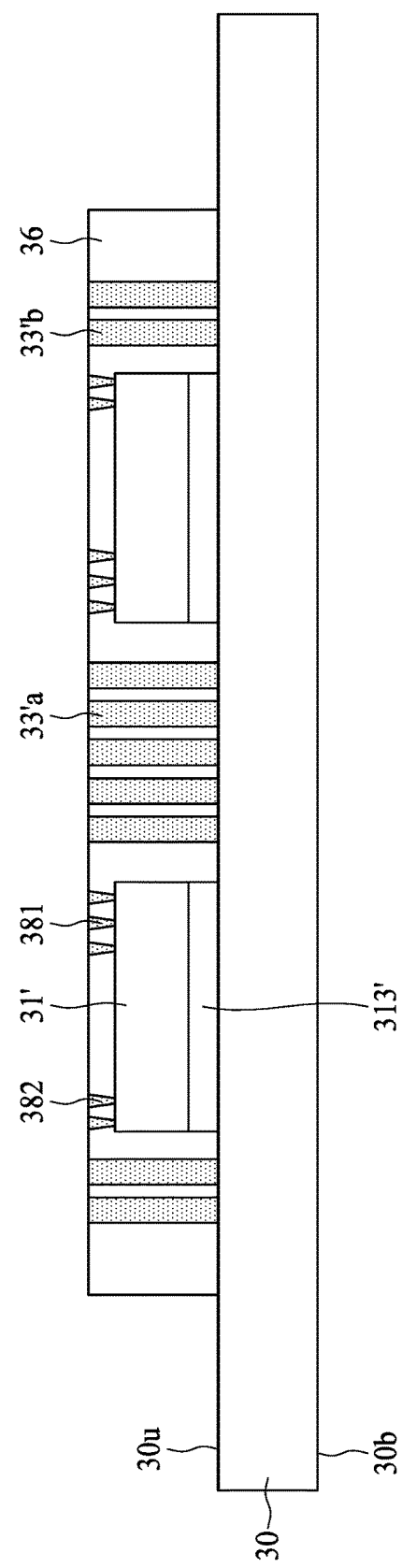
FIG. 12F illustrates a method of manufacturing a semiconductor device package according to some embodiments of the present disclosure.

Referring to FIG. 12F, the encapsulant 36 is grinded by a grinding operation. The interconnection 381 and the interconnection 382 are grinded by the grinding operation.

Figure 12G:
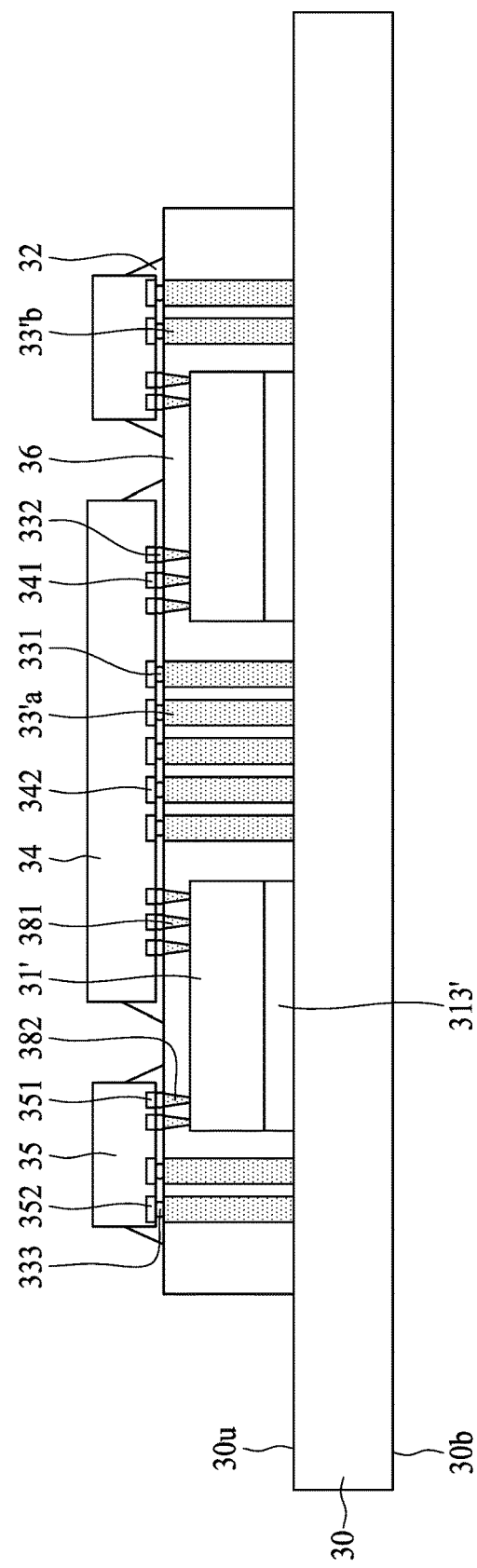
FIG. 12G illustrates a method of manufacturing a semiconductor device package according to some embodiments of the present disclosure.

Referring to FIG. 12G, a semiconductor device 34 is disposed on the interposer 31. The semiconductor device 34 is disposed on the conductive pillar 33'a. The semiconductor device 34 is disposed on the encapsulant 36. An underfill 32 is disposed between the semiconductor device 34 and the encapsulant 36. The semiconductor device 34 includes a conductive pad 341 and a conductive pad 342. The conductive pad 341 is electrically connected to the interposer 31' via the interconnection 381. A conductive structure 332 is disposed between the conductive pad 341 and the interconnection 381. The conductive structure 332 electrically connects the conductive pad 341 and the interconnection 381. The conductive pad 342 is electrically connected to the conductive pillar 33'a. A conductive structure 331 is disposed between the conductive pad 342 and the conductive pillar 33'a. The conductive structure 331 electrically connects the conductive pad 342 and the conductive pillar 33'a. The conductive pad 342 may be a grounding pad. The semiconductor device 34 is electrically connected to the substrate 30 via the conductive pillar 33'a. In some embodiments, the semiconductor device 34 may include an application-specific integrated circuit (ASIC), a controller, a processor or other electronic component or semiconductor device. In some embodiments, the conductive structure 331 and the conductive structure 332 may be a solder bump or copper pillar bump.

A semiconductor device 35 is disposed on the interposer 31'. The semiconductor device 35 is disposed on the encapsulant 36. The underfill 32 is disposed between the semiconductor device 35 and the encapsulant 36. The semiconductor device 35 includes a conductive pad 351 and a conductive pad 352. The conductive pad 351 is electrically connected to the interposer 31' via the interconnection 382. A conductive structure 333 is disposed between the conductive pad 351 and the interconnection 382. The conductive structure 333 electrically connects the conductive pad 351 and the interconnection 382. The semiconductor device 35 is electrically connected to the substrate 30 via the conductive pillar 33'b. A conductive structure 333 is disposed between the conductive pad 352 and the conductive pillar 33'b. The conductive structure 333 electrically connects the conductive pad 351 and the conductive pillar 33'b. The semiconductor device 34 and the semiconductor device 35 may be communicated with each other via the interposer 31'. In some embodiments, the semiconductor device 35 may be a high bandwidth memory (HBM).

Figure 12H:
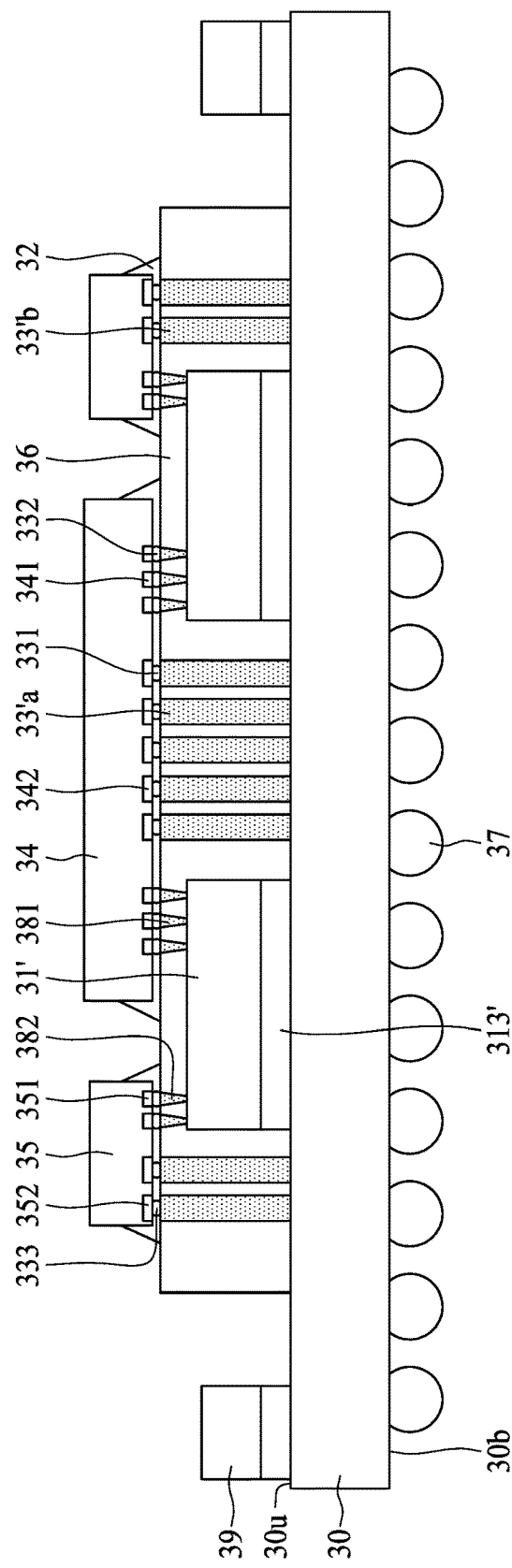
FIG. 12H illustrates a method of manufacturing a semiconductor device package according to some embodiments of the present disclosure.

Referring to FIG. 12H, a ring structure 39 is disposed on the upper surface 10u of the substrate 30. Subsequently, a solder ball 37 is disposed on the lower surface 30b of the substrate 30. The ring structure 39 provides a function to prevent from a warpage issue. In some embodiments, the ring structure 39 may be omitted. Subsequently, a singulation operation may be performed.

Figure 13A:
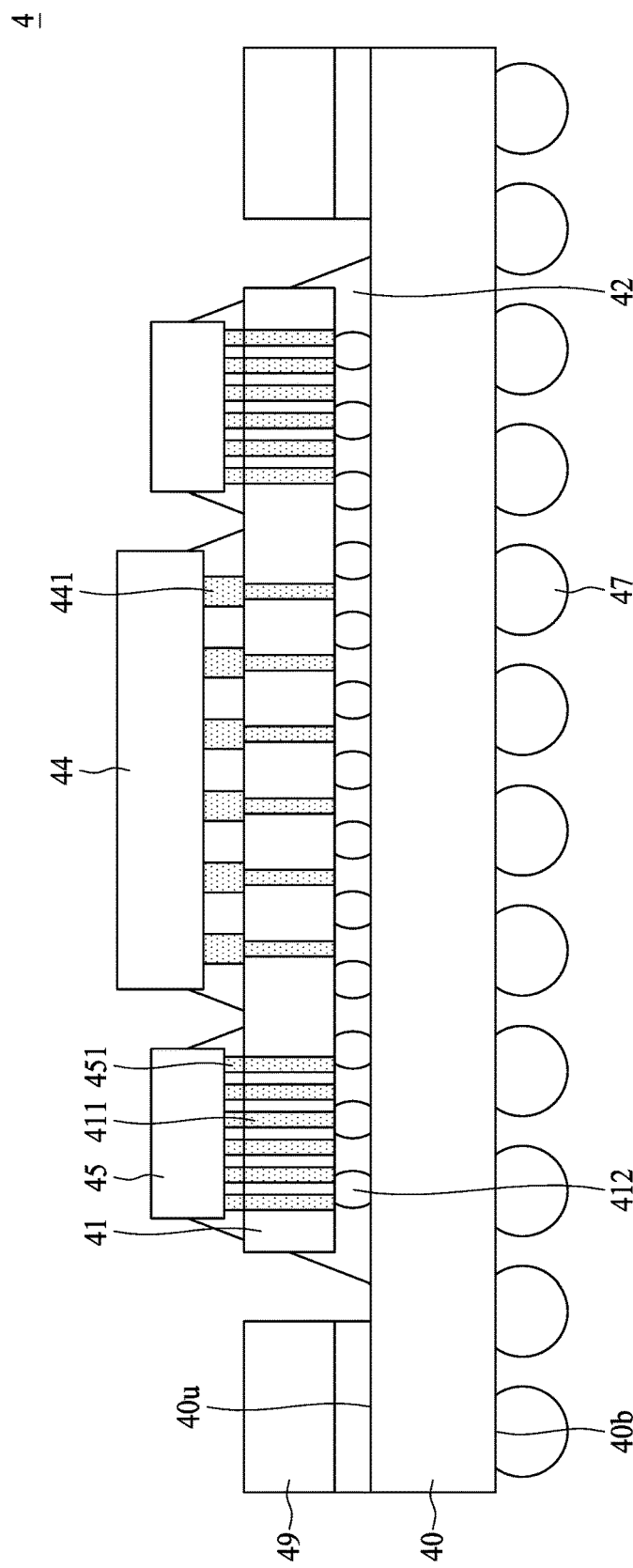
FIG. 13A illustrates a cross-sectional view of a comparative semiconductor device package.

FIG. 13A is a cross-sectional view of a comparative semiconductor device package 4. The semiconductor device package 4 includes a substrate 40, an interposer 41, an underfill 42, a semiconductor device 44, a semiconductor device 45, a solder ball 47, and a ring structure 49.

The substrate 40 has an upper surface 40u and a lower surface 40b opposite to the upper surface 40u. The interposer 41 is disposed on the upper surface 40u of the substrate 40. The ring structure 49 is disposed on the upper surface 40u of the substrate 40. The ring structure 49 surrounds the interposer 41. The solder ball 47 is disposed on the lower surface 40b of the substrate 40. The ring structure 49 provides a function to prevent from a warpage issue. In some embodiments, the ring structure 49 may be omitted.

The interposer 41 (e.g., a through silicon via (TSV) interposer) includes a conductive via 411, an electrical terminal 412, and a conductive via 413. The interposer 41 is electrically connected to the substrate 40 via the electrical terminal 412. The underfill 42 is disposed between the substrate 40 and the interposer 41. The electrical terminal 412 is surrounded by the underfill 42.

The conductive via 413 is a grounding via. A width of the conductive via 413 is greater than a width of the conductive via 411. Since the widths of the conductive via 411 and the conductive via 413 are different from each other, it is difficult to form the conductive via 411 and the conductive via 413 uniformly which causes a poor yield. Additionally, an area of the interposer 41 is difficulty to be decreased due to the conductive via 413 with a large size.

The semiconductor device 44 is disposed on the interposer 41. The underfill 42 is disposed between the interposer 41 and the semiconductor device 44. The semiconductor device 14 includes a conductive pad 441. The conductive pad 441 may be electrically connected to the conductive via 411. The conductive pad 441 may be electrically connected to the conductive via 413. The semiconductor device 44 is electrically connected to the substrate 40 via the interposer 41. The semiconductor device 44 may include an application-specific integrated circuit (ASIC), a controller, a processor or other electronic component or semiconductor device.

The semiconductor device 45 is disposed on the interposer 41. The underfill 42 is disposed between the interposer 41 and the semiconductor device 45. The semiconductor device 45 includes a conductive pad 451. The conductive pad 451 may be electrically connected to the conductive via 411. The conductive pad 451 may be electrically connected to the conductive via 413. The semiconductor device 45 is electrically connected to the substrate 40 via the interposer 41. The semiconductor device 44 and the semiconductor device 45 may be communicated with each other via the interposer 41. The semiconductor device 15 may be a high bandwidth memory (HBM).

Figure 13B:
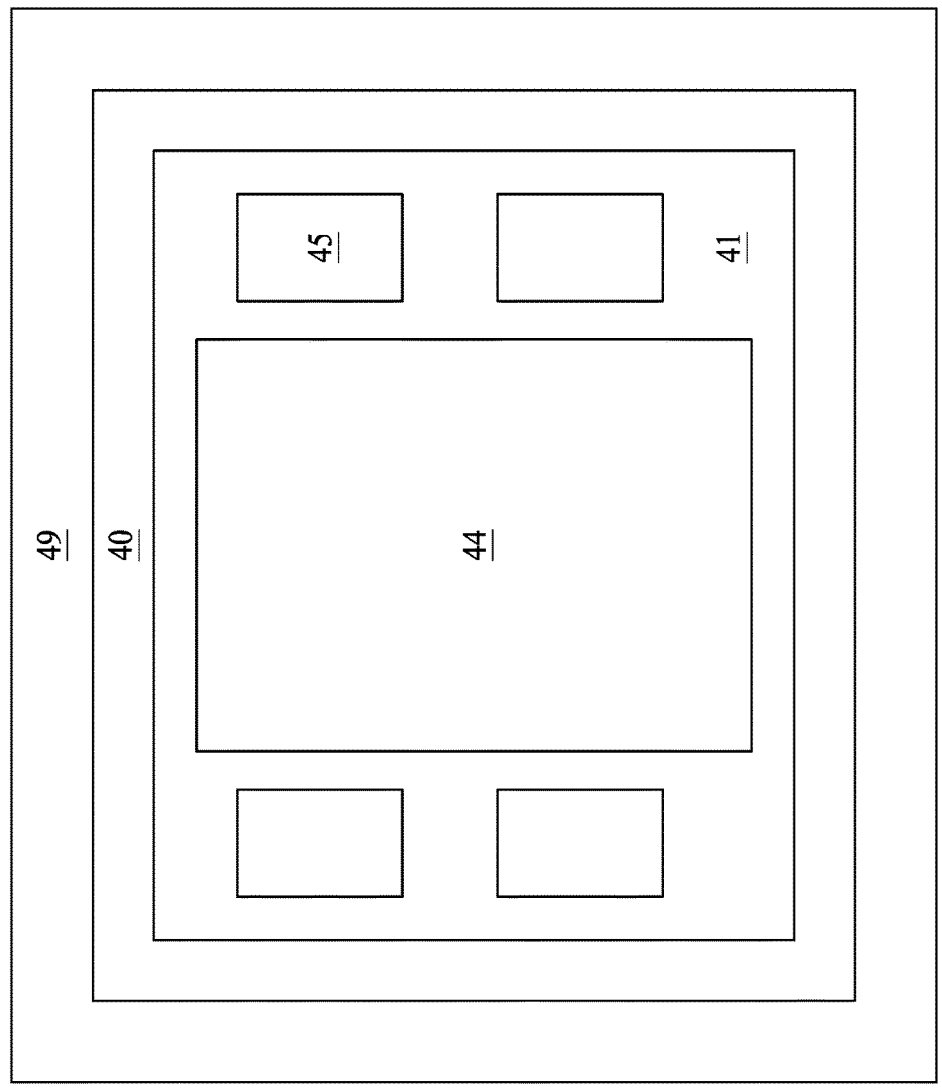
FIG. 13B illustrates a top view of a comparative semiconductor device package.

FIG. 13B is a top view of the semiconductor device package 4 in accordance with some embodiments of the present disclosure. The interposer 41, the semiconductor device 44, the semiconductor device 45, and the ring structure 49 are disposed on the substrate 40. The ring structure 49 surrounds the interposers 41. The semiconductor device 44 and the semiconductor device 15 are both disposed on the interposer 41. Since both the semiconductor device 44 and the semiconductor device 15 are both disposed on one interposer, an area of the interposer 41 has to be large enough to hold the semiconductor devices 44 and 45. Accordingly, the cost of the semiconductor device package 4 is difficult to be decreased.

Figure 14:
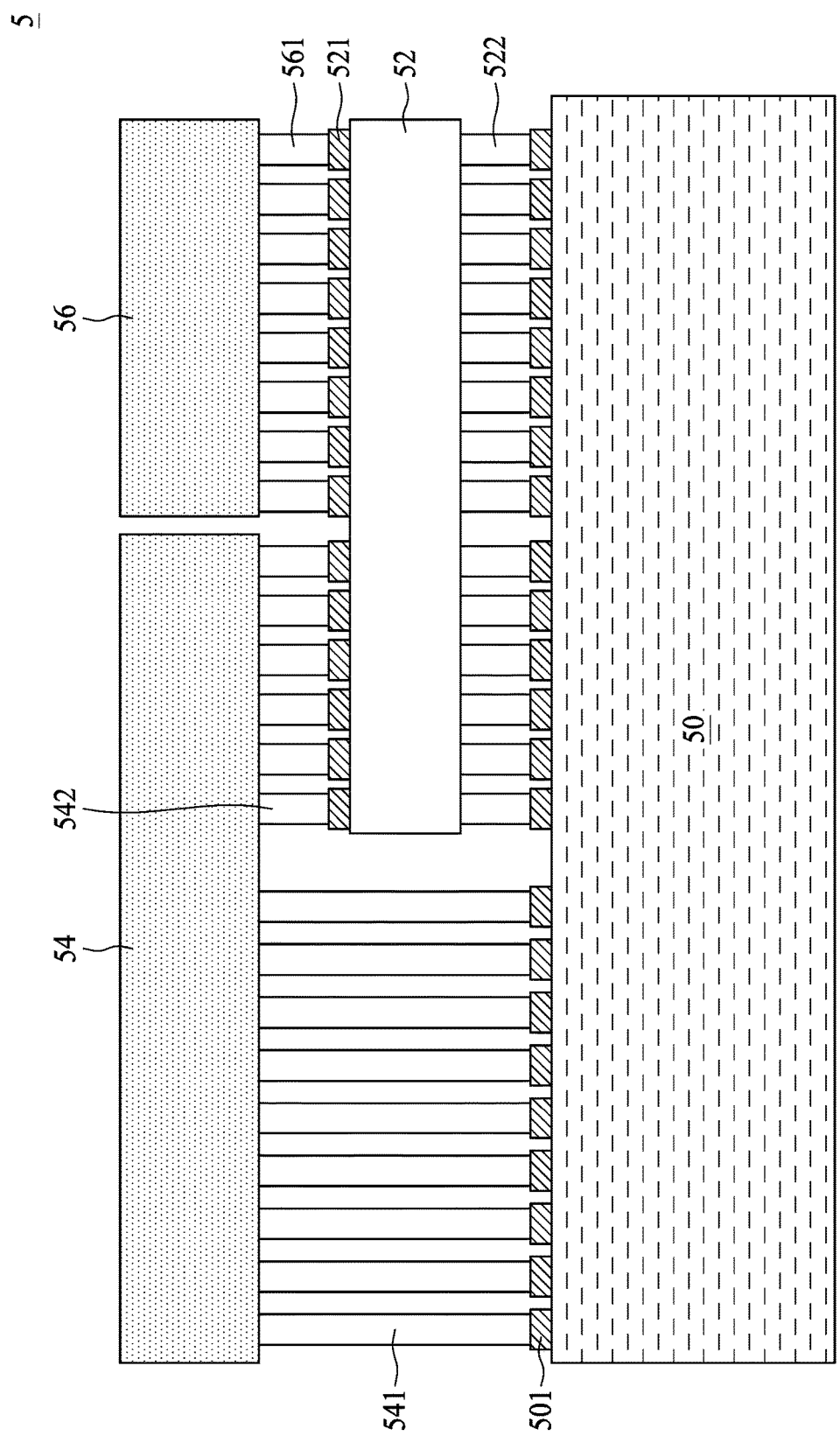
FIG. 14 illustrates a cross-sectional view of a comparative semiconductor device package.

FIG. 14 is a cross-sectional view of a comparative semiconductor device package 5. The semiconductor device package 5 includes a substrate 50, an interposer 52, a semiconductor device 54, and a semiconductor device 56.

The interposer 52 is disposed on the substrate 50. The interposer 52 includes a conductive pad 521 and a conductive post 522. The conductive post 522 is electrically connected to a conductive pad 501 of the substrate 50.

The semiconductor device 54 is disposed on the substrate 50 and the interposer 52. The semiconductor device 54 includes a conductive post 541 and a conductive post 542. The conductive post 541 is electrically connected to the conductive pad 501. The conductive post 542 is electrically connected to the conductive pad 521. A height of the conductive post 541 is greater than a height of the conductive post 542.

The semiconductor device 56 is disposed on the interposer 52. The semiconductor device 56 includes a conductive post 561. The conductive post 561 is electrically connected to the conductive pad 521. A height of the conductive post 561 is the same as the height of the conductive post 542.

Since the conductive post 522, the conductive post 541, the conductive post 542, and the conductive post 561 are not encapsulated by an encapsulant, these the conductive post may collapse or crack during the fabrication of the semiconductor device package 5. Such kind of collapse or crack would cause misalignment and electrical disconnection for the subsequent operations.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device package, comprising:
    a substrate;
    an interposer disposed on the substrate;
    a conductive pillar disposed on the substrate;
    a first semiconductor device disposed on the interposer and electrically connected to the conductive pillar, the first semiconductor device including a conductive pad electrically connected to the interposer;
    a second semiconductor device disposed on the interposer, the second semiconductor device including a conductive pad electrically connected to the interposer; and
    an encapsulant surrounding the conductive pillar,
    wherein the conductive pillar is in direct contact with the substrate and the first semiconductor device.

2. The semiconductor device package of claim 1, wherein the encapsulant surrounds the interposer, the first semiconductor device, and the second semiconductor device.

3. The semiconductor device package of claim 1, wherein the encapsulant encapsulates the interposer and exposes the first semiconductor device and the second semiconductor device.

4. The semiconductor device package of claim 1, wherein an aspect ratio of the conductive pillar is greater than 7.

5. The semiconductor device package of claim 1, wherein the interposer includes a conductive via and is electrically connected to the substrate, and wherein a width of the conductive via is less than a width of the conductive pillar.

6. The semiconductor device package of claim 1, wherein the first semiconductor device includes a grounding conductive pad, and wherein the grounding conductive pad of the first semiconductor device is electrically connected to the conductive pillar.

7. The semiconductor device package of claim 6, further comprising a second conductive pillar, wherein the second conductive pillar is electrically connected to a grounding pad of the second semiconductor device.

8. The semiconductor device package of claim 6, further comprising an adhesive disposed between the interposer and the substrate.

9. The semiconductor device package of claim 8, wherein the encapsulant surrounds the adhesive.

10. The semiconductor device package of claim 6, further comprising a connection element disposed between the conductive pillar and the substrate.

11. The semiconductor device package of claim 1, further comprising a ring structure disposed on the substrate, wherein the ring structure surrounds the encapsulant and the interposer.

12. A method for manufacturing a semiconductor device package, comprising:
    providing a substrate, a first semiconductor device, and a second semiconductor device;
    providing an interposer for electrically connecting the first semiconductor device and the second semiconductor device to the substrate;
    providing a first conductive pillar electrically connected to the substrate and the first semiconductor device, the first conductive pillar being in direct contact with the substrate and the first semiconductor device; and
    providing an encapsulant to surround the first conductive pillar and the interposer.

13. The method of claim 12, wherein providing the first conductive pillar electrically connected to the substrate and the first semiconductor device further comprises: disposing the first conductive pillar on the substrate; and disposing the first semiconductor device on the first conductive pillar, wherein the first semiconductor device is electrically connected to the first conductive pillar.

14. The method of claim 13, further comprising: subsequent to the disposing the first semiconductor device on the first conductive pillar, providing the encapsulant to surround the first conductive pillar and the interposer.

15. The method of claim 14, further comprising: disposing a second conductive pillar electrically connected to the substrate and the second semiconductor device.

16. The method of claim 13, wherein providing the encapsulant to surround the first conductive pillar and the interposer is prior to disposing the first semiconductor device on the first conductive pillar.

17. The method of claim 16, further comprising: disposing a second conductive pillar electrically connected to the substrate and the second semiconductor device.

18. The method of claim 16, further comprising:
    forming a first interconnection and a second interconnection in the encapsulant, the first interconnection and the second interconnection electrically connected to the interposer;
    grinding the encapsulant to expose the first conductive pillar;
    electrically connecting the first semiconductor device to the first interconnection; and
    electrically connecting the second semiconductor device to the second interconnection.

19. The method of claim 12, wherein providing the first conductive pillar electrically connected to the substrate and the first semiconductor device further comprises:
    disposing the first semiconductor device and the second semiconductor device on a carrier, the first conductive pillar being disposed on the first semiconductor device;
    disposing the interposer on the first semiconductor device and the second semiconductor device;
    providing the encapsulant to surround the first semiconductor device and the second semiconductor device;
    grinding the encapsulant to expose the first conductive pillar to form a sub module;
    removing the carrier from the sub module; and
    disposing the submodule on the substrate, the first conductive pillar being electrically connected to the substrate.

20. The method of claim 19, further comprising: disposing a second conductive pillar electrically connected to the substrate and the second semiconductor device.

\* \* \* \* \*